US012812964B2

(12) United States Patent
Yoshida

(10) Patent No.: US 12,812,964 B2
(45) Date of Patent: Nov. 24, 2026

(54) SEMICONDUCTOR DEVICE COMPRISING A TRANSISTOR AND A DIODE FORMED AT A COMMON SEMICONDUCTOR SUBSTRATE

(71) Applicant: Mitsubishi Electric Corporation, Tokyo (JP)

(72) Inventor: Takuya Yoshida, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 350 days.

(21) Appl. No.: 18/398,979

(22) Filed: Dec. 28, 2023

(65) Prior Publication Data

US 2024/0332288 A1 Oct. 3, 2024

(30) Foreign Application Priority Data

Mar. 31, 2023 (JP) ................................ 2023-057773

(51) Int. Cl.
*H10D 84/60* (2025.01)
*H10D 8/00* (2025.01)
(Continued)

(52) U.S. Cl.
CPC ........... *H10D 84/617* (2025.01); *H10D 8/422* (2025.01); *H10D 12/038* (2025.01);
(Continued)

(58) Field of Classification Search
CPC .. H10D 12/038; H10D 12/481; H10D 62/107; H10D 62/127; H10D 64/117;
(Continued)

(56) References Cited

U.S. PATENT DOCUMENTS

2012/0146129 A1 6/2012 Kenichi
2019/0287964 A1 9/2019 Yamano et al.
(Continued)

FOREIGN PATENT DOCUMENTS

DE 102021104942 A1 9/2021
DE 102021114181 A1 1/2022
(Continued)

OTHER PUBLICATIONS

Office Action issued in DE 10 2024 105 118.3; mailed by the German Patent and Trade Mark Office on Nov. 24, 2025.
(Continued)

*Primary Examiner* — Mamadou L Diallo
(74) *Attorney, Agent, or Firm* — Studebaker Brackett PLLC

(57) ABSTRACT

In a semiconductor device according to the present disclosure, a semiconductor substrate includes: a transistor region in which a transistor is formed; a plurality of diode regions in which a diode is formed; and a terminal region around a cell region covering the transistor region and the plurality of diode regions. The transistor region includes: a second transistor region contacting the terminal region at least partially; and a first transistor region arranged in a region other than the second transistor region and between the plurality of diode regions. In a plan view, the first transistor region has a first width and each of the plurality of diode regions has a second width that is uniform in the first direction. The second transistor region has a third width in the first direction that is smaller than the first width of the first transistor region.

14 Claims, 37 Drawing Sheets

101A

(51) Int. Cl.
*H10D 12/00* (2025.01)
*H10D 12/01* (2025.01)
*H10D 62/10* (2025.01)

(52) U.S. Cl.
CPC ......... *H10D 12/481* (2025.01); *H10D 62/107* (2025.01); *H10D 62/127* (2025.01)

(58) Field of Classification Search
CPC .......... H10D 8/422; H10D 8/00; H10D 8/045; H10D 62/129; H10D 62/106; H10D 62/126; H10D 84/617; H10D 84/811
See application file for complete search history.

(56) References Cited

U.S. PATENT DOCUMENTS

| | | | | |
|---|---|---|---|---|
| 2020/0035817 | A1* | 1/2020 | Tamura | H10D 12/481 |
| 2020/0058803 | A1* | 2/2020 | Naito | H10D 8/00 |
| 2020/0098747 | A1* | 3/2020 | Tamura | H10D 64/117 |
| 2020/0161460 | A1* | 5/2020 | Harada | H10D 8/422 |
| 2021/0043758 | A1* | 2/2021 | Yokoyama | H10D 8/422 |
| 2021/0305240 | A1* | 9/2021 | Nakatani | H10D 12/481 |
| 2021/0305241 | A1* | 9/2021 | Ikeda | H10D 8/422 |
| 2021/0384335 | A1 | 12/2021 | Sako et al. | |
| 2022/0013645 | A1* | 1/2022 | Shimosawa | H10D 8/422 |
| 2022/0102341 | A1* | 3/2022 | Kudo | H10D 84/144 |
| 2022/0173231 | A1 | 6/2022 | Nakatani et al. | |
| 2022/0262638 | A1* | 8/2022 | Nakamura | H10D 8/00 |
| 2022/0302252 | A1* | 9/2022 | Matsudai | H10D 8/422 |
| 2022/0415884 | A1 | 12/2022 | Toriyama et al. | |
| 2022/0416064 | A1* | 12/2022 | Soneda | H10D 62/127 |
| 2023/0019632 | A1 | 1/2023 | Obata | |
| 2023/0223441 | A1 | 7/2023 | Nakano | |
| 2023/0307444 | A1* | 9/2023 | Matsudai | H10D 62/129 |
| 2023/0402533 | A1* | 12/2023 | Mizushima | H10D 62/126 |
| 2024/0088109 | A1* | 3/2024 | Kuraguchi | H10W 20/484 |
| 2024/0145464 | A1* | 5/2024 | Nishi | H10D 84/617 |
| 2024/0178305 | A1* | 5/2024 | Nishi | H10D 12/481 |
| 2025/0380491 | A1* | 12/2025 | Murasaki | H10D 62/10 |

FOREIGN PATENT DOCUMENTS

| | | | |
|---|---|---|---|
| DE | 10 2021128798 | A1 | 6/2022 |
| DE | 112021000878 | T5 | 11/2022 |
| JP | 2012-124430 | A | 6/2012 |
| JP | 2021-028930 | A | 2/2021 |
| JP | 2021-144998 | A | 9/2021 |
| JP | 2021-190657 | A | 12/2021 |
| WO | 2018/225571 | A1 | 12/2018 |
| WO | 2019/098270 | A1 | 5/2019 |
| WO | 2022/219930 | A1 | 10/2022 |

OTHER PUBLICATIONS

"Notice of Reasons for Refusal" Office Action issued in JP 2023-057773; mailed by the Japanese Patent Office on Jan. 13, 2026.

"Notice of Reasons for Refusal" Office Action issued in JP 2023-057773; mailed by the Japanese Patent Office on Jun. 2, 2026.

* cited by examiner

SEMICONDUCTOR DEVICE COMPRISING A TRANSISTOR AND A DIODE FORMED AT A COMMON SEMICONDUCTOR SUBSTRATE

BACKGROUND OF THE INVENTION

Field of the Invention

The present disclosure relates to a semiconductor device, particularly to a reverse conducting semiconductor device.

Description of the Background Art

A reverse conducting insulated gate bipolar transistor (RC-IGBT) is known as a semiconductor device including an IGBT and a free wheeling diode (FWD) provided at a common semiconductor substrate.

As disclosed in FIG. 1 of Japanese Patent Application Laid-Open No. 2021-28930, for example, such a semiconductor device has a configuration were an IGBT region and a diode region are arranged alternately in a plan view. The configuration where the IGBT region and the diode region are arranged alternately in a plan view has a function of dispersing heat generated during IGBT operation and heat generated during diode operation mutually to each other. Effect achieved therefrom is increased by dividing each of the regions into more regions. During electrically conducting operation, however, at a boundary between the IGBT region and the diode region next to each other, unipolar operation as a metal oxide semiconductor field effect transistor (MOSFET) is generated as a result of an electron current flowing between a channel part in the IGBT region and a cathode part in the diode region. If the width of the IGBT region sandwiched between the diode regions or that of the diode region sandwiched between the IGBT regions is reduced in a direction of the arrangement, a ratio of the unipolar operation is increased. Even if a voltage exceeds a built-in voltage, conductivity modulation hardly occurs, resulting in a snapback phenomenon and an increase in an ON resistance. This causes a problem of an increase in steady loss.

According to Japanese Patent Application Laid-Open No. 2021-28930, as compared with an IGBT region in a central area in the arrangement direction, an IGBT region in the other area has a narrow width. This imposes difficulty in maximizing the number of divisions in the arrangement for the purpose of achieving much effect of dispersing generated heat while maintaining the width of the IGBT region in the arrangement direction for the purpose of preventing a snapback phenomenon and increase in an ON resistance.

SUMMARY

The present disclosure is intended to provide a semiconductor device that improves temperature uniformity within a plane of a chip while preventing a snapback phenomenon and increase in an ON resistance.

A semiconductor device according to the present disclosure is a semiconductor device including a transistor and a diode formed at a common semiconductor substrate. The semiconductor substrate includes: a transistor region in which the transistor is formed; a plurality of diode regions in which the diode is formed; and a terminal region around a cell region covering the transistor region and the plurality of diode regions. The transistor region includes: a second transistor region contacting the terminal region at least partially; and a first transistor region arranged in a region other than the second transistor region and between the plurality of diode regions. In a plan view, the first transistor region has a first width that is uniform in a first direction corresponding to a direction of arrangement of the plurality of diode regions and each of the plurality of diode regions has a second width that is uniform in the first direction. The second transistor region has a third width in the first direction that is smaller than the first width of the first transistor region.

In the semiconductor device according to the present disclosure, it is possible to make a ratio of a unipolar current generated at a boundary area between the transistor region and the diode region uniform in the transistor region. This achieves improvement of temperature uniformity within a plane of the semiconductor device while preventing a snapback phenomenon and increase in an ON resistance.

These and other objects, features, aspects and advantages of the present invention will become more apparent from the following detailed description of the present invention when taken in conjunction with the accompanying drawings.

DESCRIPTION OF THE PREFERRED EMBODIMENTS

Introduction

Figure 1:
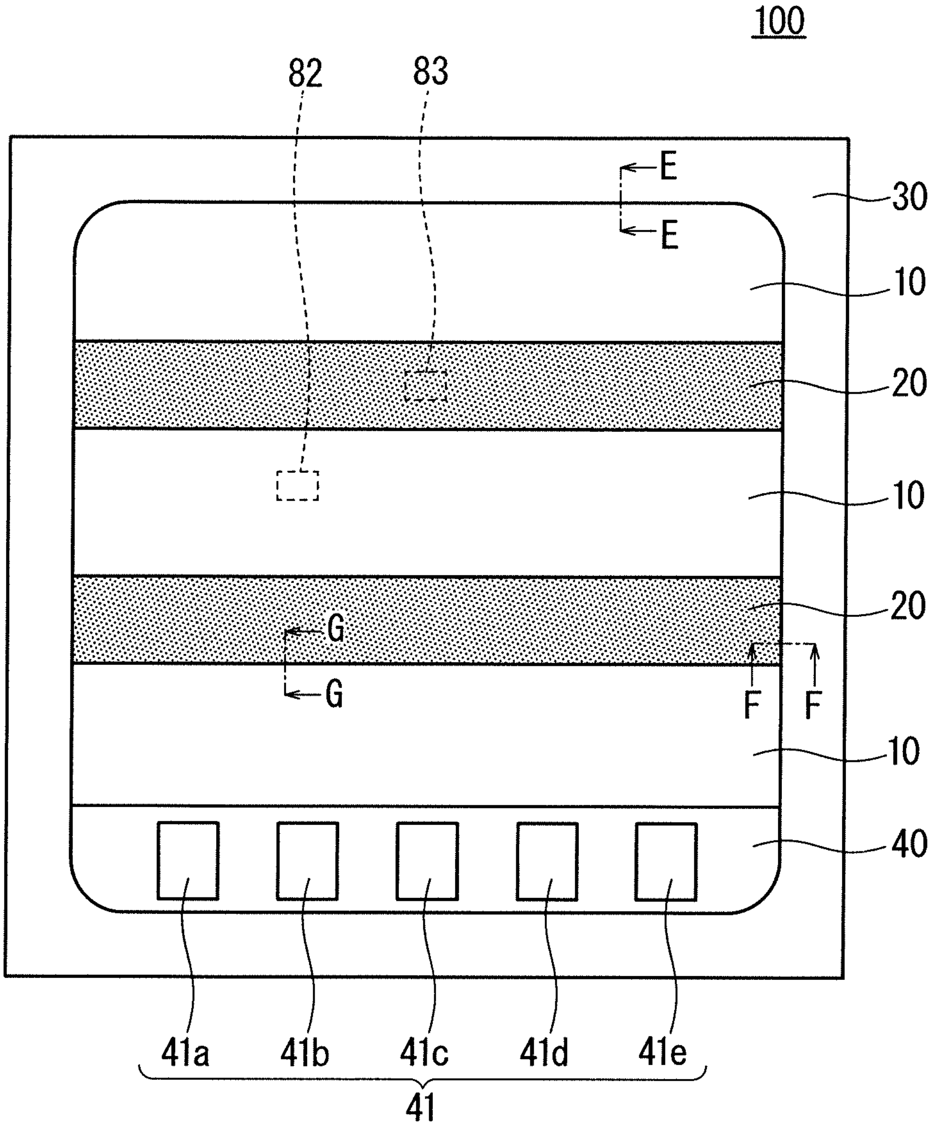
FIG. 1 is a plan view showing a semiconductor device as an RC-IGBT.

In the following description, an n-type and a p-type show conductivity types of semiconductor, and a first conductivity type is indicated as the n-type and a second conductivity type is indicated as the p-type in the present disclosure. Meanwhile, the first conductivity type may be indicated as the p-type and the second conductivity type may be indicated as the n-type. Furthermore, an $n^-$-type means that an impurity concentration is lower than that of the n-type, and an $n^+$-type means that an impurity concentration is higher than that of the n-type. Likewise, a $p^-$-type means that an impurity concentration is lower than that of the p-type, and a $p^+$-type means that an impurity concentration is higher than that of the p-type.

The drawings are presented schematically. Correlations in terms of size and position between images shown in different drawings are not always illustrated correctly but are changeable, as appropriate. In the description given below, similar components will be given the same sign and illustrated with the same sign in the drawings. These components will be given the same name and are to fulfill the same function. Thus, in some cases, detailed description of these components will be omitted.

In the description given below, terms meaning particular positions and directions such as “upper,” “lower,” “side,” “front,” and “back” are used in some cases. These terms are used for the purpose of convenience to facilitate understanding of the substances of the preferred embodiments, and do not relate to directions in actual use.

Figure 2:
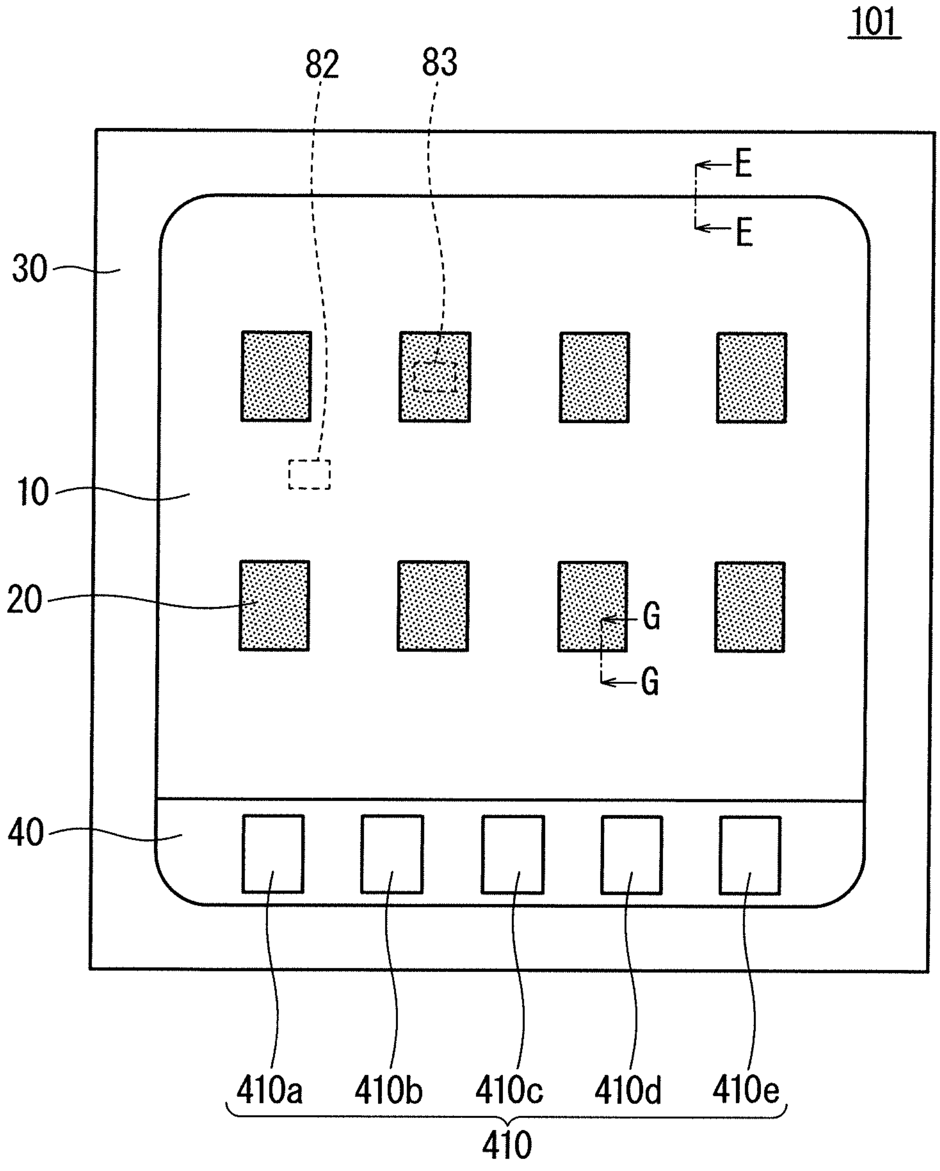
FIG. 2 is a plan view showing a semiconductor device as an RC-IGBT.

FIG. 1 is a plan view showing a semiconductor device as an RC-IGBT. FIG. 2 is a plan view showing a semiconductor device as an RC-IGBT having a different configuration. A semiconductor device 100 shown in FIG. 1 includes an IGBT region 10 and a diode region 20 having stripe shapes and juxtaposed to each other, and may simply be called a “stripe type.” A semiconductor device 101 shown in FIG. 2 includes a plurality of diode regions 20 provided in each of a vertical direction and a horizontal direction, and an IGBT region 10 provided around the diode regions 20. The semiconductor device 101 may simply be called an “island type.”

(1) Overall Planar Configuration of Stripe Type

In FIG. 1, the semiconductor device 100 includes the IGBT region 10 and the diode region 20 in one semiconductor device. The IGBT region 10 and the diode region 20 extend from one end toward the other end of the semiconductor device 100, and are provided in stripe shapes alternately in a direction perpendicular to the extending direction of the IGBT region 10 and the diode region 20. In the configuration shown in FIG. 1, three IGBT regions 10 and two diode regions 20 are provided and all the diode regions 20 are sandwiched between the IGBT regions 10. However, the number of the IGBT regions 10 and that of the diode regions 20 are not limited to these. The number of the IGBT regions 10 may be three or more or three or less. The number of the diode regions 20 may be two or more or two or less. In one configuration, places for the IGBT regions 10 and those for the diode regions 20 may be switched from each other. In one configuration, all the IGBT regions 10 may be sandwiched between the diode regions 20. In one configuration, one IGBT region 10 and one diode region 20 may be provided next to each other.

As shown in FIG. 1, a pad region 40 is provided next to the IGBT region 10 on a lower side of the plane of paper. The pad region 40 is a region where a control pad 41 for controlling the semiconductor device 100 is provided. The IGBT region 10 and the diode region 20 are collectively called a cell region. A terminal region 30 for retaining the breakdown voltage of the semiconductor device 100 is provided around a region covering the cell region and the pad region 40. A well-known breakdown voltage retaining structure suitably selected is applicable in the terminal region 30. The breakdown voltage retaining structure may be formed by providing a first main surface side corresponding to a front surface side of the semiconductor device 100 with a field limiting ring (FLR) that includes a p-type terminal well layer of p-type semiconductor surrounding the cell region, and variation of lateral doping (VLD) that includes a p-type well layer having a concentration gradient and surrounding the cell region, for example. The number of the ring-like p-type terminal well layers used in the FLR and a concentration distribution used in the VLD may properly be selected in designing the breakdown voltage of the semiconductor device 100. The p-type terminal well layer may be provided over a substantially entire area of the pad region 40. In another case, the pad region 40 may be provided with an IGBT cell and a diode cell.

The control pad 41 may be a current sensing pad 41*a*, a kelvin emitter pad 41*b*, a gate pad 41*c*, and a temperature sensing diode pad 41*d* and a temperature sensing diode pad 41*e*, for example. The current sense pad 41*a* is a control pad for detecting a current flowing through the cell region of the semiconductor device 100. When a current flows through the cell region of the semiconductor device 100, the current sense pad 41*a* is electrically connected to some of IGBT cells or diode cells in the cell region so that a fraction to one several ten-thousandth of the current flowing through the entirety of the cell region flows through the IGBT cells or the diode cells.

The kelvin emitter pad 41*b* and the gate pad 41*c* are control pads to which a gate driving voltage for controlling on-off of the semiconductor device 100 is applied. The kelvin emitter pad 41*b* is electrically connected to a p-type base layer of an IGBT cell. The gate pad 41*c* is electrically connected to a gate trench electrode of the IGBT cell. The kelvin emitter pad 41*b* and the p-type base layer may be electrically connected to each other through a $p^+$-type contact layer. The temperature sensing diode pads 41*d* and 41*e* are control pads electrically connected to an anode and a cathode of a temperature sensing diode respectively provided in the semiconductor device 100. The temperature sensing diode pads 41*d* and 41*e* measure the temperature of the semiconductor device 100 by measuring a voltage between the anode and the cathode of the temperature sensing diode not shown in the drawings provided in the cell region.

(2) Overall Planar Configuration of Island Type

In FIG. 2, the semiconductor device 101 includes an IGBT region 10 and a diode region 20 in one semiconductor device. The diode region 20 includes a plurality of diode regions 20 juxtaposed in each of a vertical direction and a horizontal direction in the semiconductor device. The diode regions 20 are surrounded by the IGBT region 10. Namely, the diode regions 20 are provided in island shapes in the IGBT region 10. In the configuration shown in FIG. 2, the diode regions 20 are arranged in a matrix with four columns arranged in a right-left direction of the plane of paper and two rows arranged in a top-bottom direction of the plane of paper. However, the number of the diode regions 20 and the arrangement thereof are not limited to these. The diode regions 20 are simply required to have a configuration where one or a plurality of diode regions 20 are provided in dot shapes in the IGBT region 10 and each of the diode regions 20 is surrounded by the IGBT region 10.

As shown in FIG. 2, a pad region 40 is provided next to the IGBT region 10 on a lower side of the plane of paper. The pad region 40 is a region where a control pad 41 for controlling the semiconductor device 101 is provided. The IGBT region 10 and the diode region 20 are collectively called a cell region. A terminal region 30 for retaining the breakdown voltage of the semiconductor device 101 is provided around a region covering the cell region and the pad region 40. A well-known breakdown voltage retaining structure suitably selected is applicable in the terminal region 30. The breakdown voltage retaining structure may be formed by providing a first main surface side corresponding to a front surface side of the semiconductor device 101 with a field limiting ring (FLR) that includes a p-type terminal well layer of p-type semiconductor surrounding a region covering the cell region and the pad region 40, and variation of lateral doping (VLD) that includes a p-type well layer having a concentration gradient and surrounding the cell region, for example. The number of the ring-like p-type terminal well layers used in the FLR and a concentration distribution used in the VLD may properly be selected in designing the breakdown voltage of the semiconductor device 101. The p-type terminal well layer may be provided over a substantially entire area of the pad region 40. In another case, the pad region 40 may be provided with an IGBT cell and a diode cell.

The control pad 41 may be a current sensing pad 41*a*, a kelvin emitter pad 41*b*, a gate pad 41*c*, and a temperature sensing diode pad 41*d* and a temperature sensing diode pad 41*e*, for example. The current sense pad 41*a* is a control pad for detecting a current flowing through the cell region of the semiconductor device 101. When a current flows through the cell region of the semiconductor device 101, the current sense pad 41*a* is electrically connected to some of IGBT cells or diode cells in the cell region so that a fraction to one several ten-thousandth of the current flowing through the entirety of the cell region flows through the IGBT cells or the diode cells.

The kelvin emitter pad 41*b* and the gate pad 41*c* are control pads to which a gate driving voltage for controlling on-off of the semiconductor device 101 is applied.

The kelvin emitter pad 41*b* is electrically connected to a p-type base layer and an $n^+$-type source layer of an IGBT cell. The gate pad 41*c* is electrically connected to a gate trench electrode of the IGBT cell. The kelvin emitter pad 41*b* and the p-type base layer may be electrically connected to each other through a $p^+$-type contact layer. The temperature sensing diode pads 41*d* and 41*e* are control pads electrically connected to an anode and a cathode of a temperature sensing diode respectively provided in the semiconductor device 101. The temperature sensing diode pads 41*d* and 41*e* measure the temperature of the semiconductor device 101 by measuring a voltage between the anode and the cathode of the temperature sensing diode not shown in the drawings provided in the cell region.

(3) General Configuration of IGBT Region 10

Figure 3:
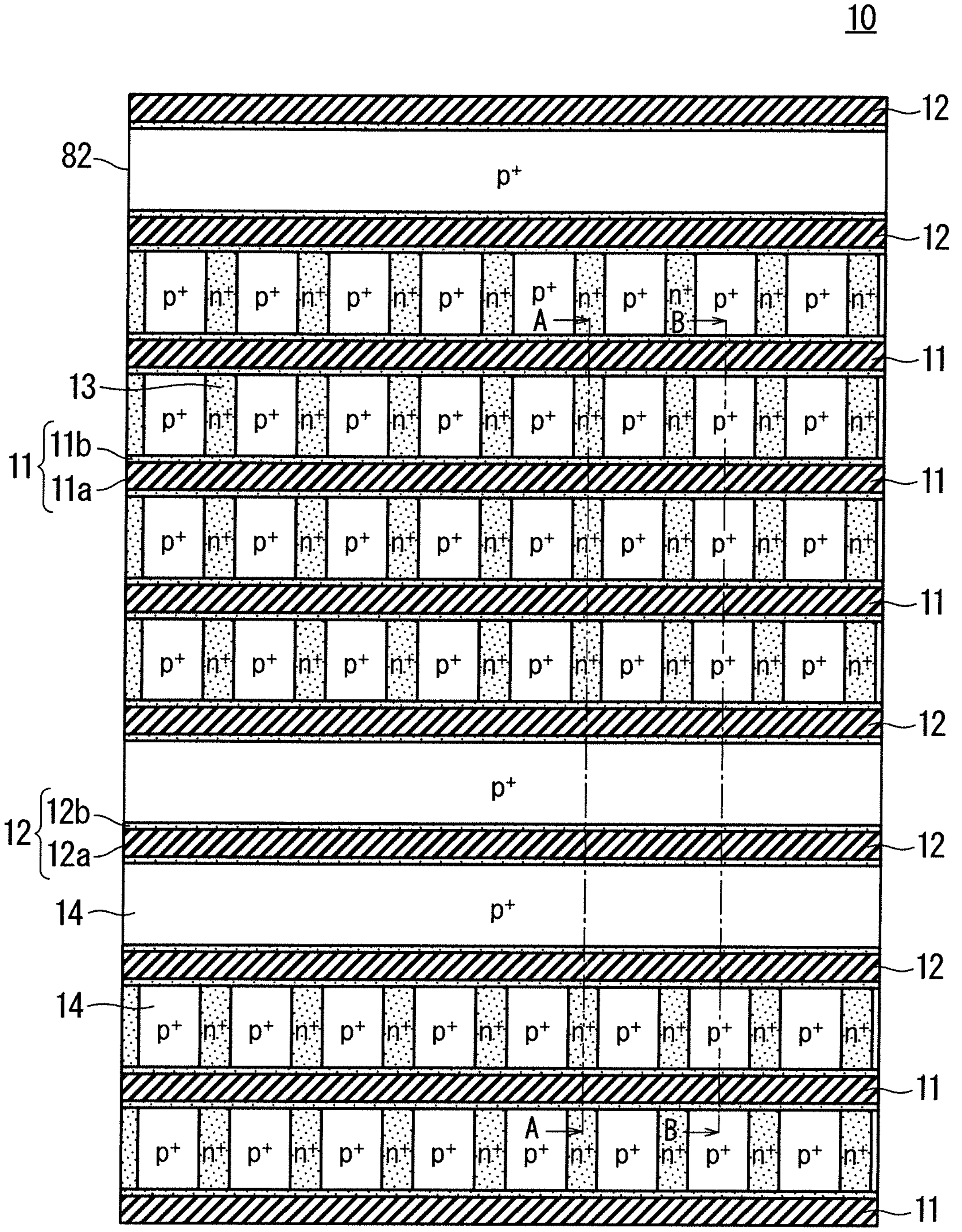
FIG. 3 is a partial plan view of an IGBT region in an RC-IGBT.
Figure 4:
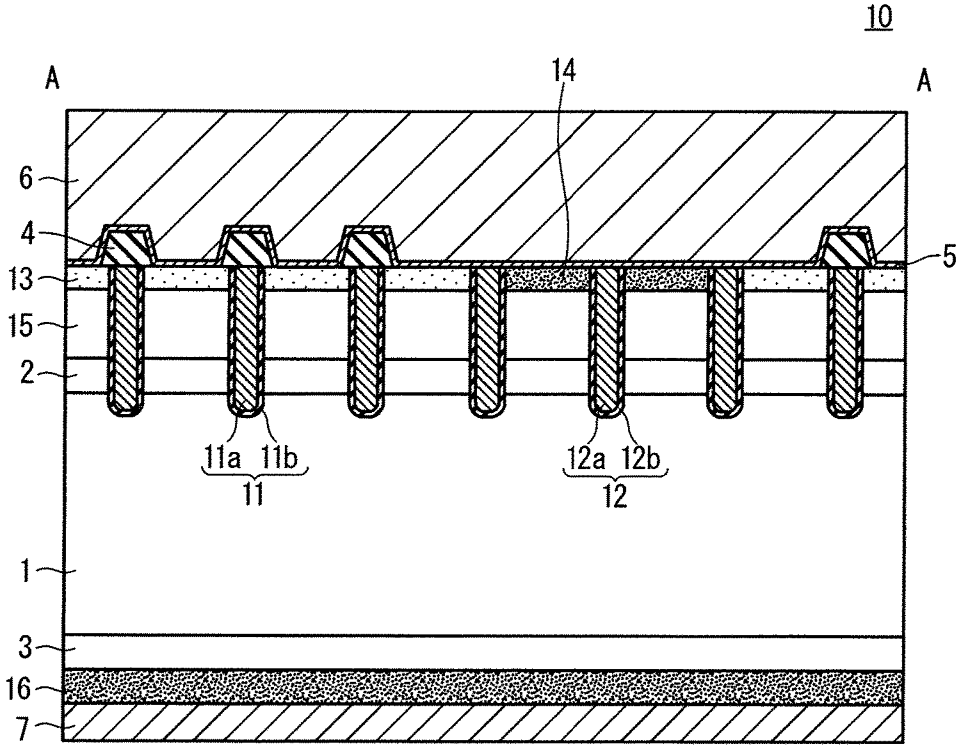
FIGS. 4 and 5 are partial sectional views of the IGBT region in the RC-IGBT.
Figure 5:
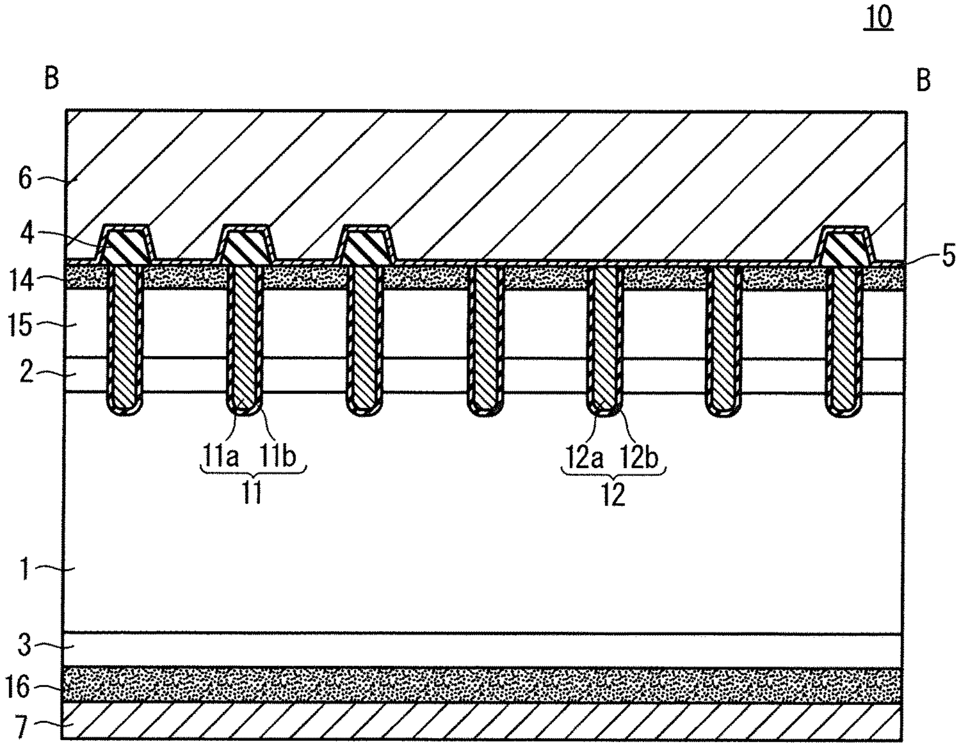

FIG. 3 is a partially enlarged plan view showing the configuration of the IGBT region in the semiconductor device as an RC-IGBT. FIGS. 4 and 5 are sectional views showing the configuration of the IGBT region in the semiconductor device as an RC-IGBT. FIG. 3 shows a region 82 in an enlarged manner surrounded by dashed lines in the semiconductor device 100 shown in FIG. 1 or in the semiconductor device 101 shown in FIG. 2. FIG. 4 is a sectional view taken in an arrow direction along a dashed line A-A in the semiconductor device 100 or the semiconductor device 101 shown in FIG. 3. FIG. 5 is a sectional view taken in an arrow direction along a dashed line B-B in the semiconductor device 100 or the semiconductor device 101 shown in FIG. 3.

As shown in FIG. 3, an active trench gate 11 and a dummy trench gate 12 are provided in stripe shapes in the IGBT region 10. In the semiconductor device 100, the active trench gate 11 and the dummy trench gate 12 extend in a lengthwise direction of the IGBT region 10 and the lengthwise direction of the IGBT region 10 corresponds to a lengthwise direction of each of the active trench gate 11 and the dummy trench gate 12. Meanwhile, in the semiconductor device 101, while there is no particular distinction between a lengthwise direction and a short-side direction of the IGBT region 10, a right-left direction in the plane of paper may be defined as the lengthwise direction of each of the active trench gate 11 and the dummy trench gate 12, or a top-bottom direction in the plane of paper may be defined as the lengthwise direction of each of the active trench gate 11 and the dummy trench gate 12.

The active trench gate 11 is formed by providing a gate trench electrode 11*a* through a gate trench insulating film 11*b* in a trench formed in a semiconductor substrate. The dummy trench gate 12 is formed by providing a dummy trench electrode 12*a* through a dummy trench insulating film 12*b* in a trench formed in the semiconductor substrate. The gate trench electrode 11*a* of the active trench gate 11 is electrically connected to the gate pad 41*c*. The dummy trench electrode 12*a* of the dummy trench gate 12 is electrically connected to an emitter electrode provided on the first main surface of the semiconductor device 100 or the semiconductor device 101.

$N^+$-type source layers 13 are provided on opposite sides of the active trench gate 11 in a width direction while contacting the gate trench insulating film 11*b*. The $n^+$-type source layer 13 is a semiconductor layer containing n-type impurity that is arsenic or phosphorus, for example, and has an n-type impurity concentration from $1.0\times10^{17}$ to $1.0\times10^{20}/cm^3$. The $n^+$-type source layer 13 is provided alternately with a $p^+$-type contact layer 14 in the extending direction of the active trench gate 11. The $p^+$-type contact layer 14 is further provided between two dummy trench gates 12 next to each other. The $p^+$-type contact layer 14 is a semiconductor layer containing p-type impurity that is boron or aluminum, for example, and has a p-type impurity concentration from $1.0\times10^{15}$ to $1.0\times10^{20}/cm^3$.

As shown in FIG. 3, in the configuration of the IGBT region 10 in the semiconductor device 100 or the semiconductor device 101, three dummy trench gates 12 are juxtaposed next to three juxtaposed active trench gates 11, and three active trench gates 11 are juxtaposed next to these three juxtaposed dummy trench gates 12. In this way, the configuration of the IGBT region 10 includes a set of the active trench gates 11 and a set of the dummy trench gates 12 juxtaposed alternately. In FIG. 3, while the number of the active trench gates 11 belonging to one set of the active trench gates 11 is three, this number is simply required to be equal to or greater than one. Furthermore, the number of the dummy trench gates 12 belonging to one set of the dummy trench gates 12 may be equal to or greater than one, or the number of the dummy trench gates 12 may be zero. Specifically, all trench gates provided in the IGBT region 10 may be the active trench gates 11.

FIG. 4 is a sectional view of the semiconductor device 100 or the semiconductor device 101 taken in the arrow direction along the dashed line A-A in FIG. 3, and is a sectional view of the IGBT region 10. The semiconductor device 100 or the semiconductor device 101 includes an $n^-$-type drift layer 1 that is a second semiconductor layer composed of a semiconductor substrate. The $n^+$-type drift layer 1 is a semiconductor layer containing n-type impurity that is arsenic or phosphorus, for example, and has an n-type impurity concentration from $1.0\times10^{12}$ to $1.0\times10^{15}/cm^3$. In FIG. 4, the semiconductor substrate is in a range from the $n^+$-type source layer 13 and the $p^+$-type contact layer 14 to a p-type collector layer 16. In FIG. 4, respective upper ends of the $n^+$-type source layer 13 and the $p^+$-type contact layer 14 in the plane of paper are called a first main surface of the semiconductor substrate, and a lower end of the p-type collector layer 16 in the plane of paper is called a second main surface of the semiconductor substrate. The first main surface of the semiconductor substrate corresponds to a main surface of the semiconductor device 100 on a front surface side. The second main surface of the semiconductor substrate corresponds to a main surface of the semiconductor device 100 on a back surface side. The semiconductor device 100 includes the $n^-$-type drift layer 1 provided between the first main surface and the second main surface facing the first main surface in the IGBT region 10 as the cell region.

As shown in FIG. 4, in the IGBT region 10, an n-type carrier accumulation layer 2 is provided closer to the first main surface than the $n^-$-type drift layer 1. The n-type carrier accumulation layer 2 has a higher n-type impurity concentration than the $n^-$-type drift layer 1. The n-type carrier accumulation layer 2 is a semiconductor layer containing n-type impurity that is arsenic or phosphorus, for example, and has an n-type impurity concentration from $1.0\times10^{13}$ to $1.0\times10^{17}/cm^3$. In the configuration of the semiconductor device 100 or the semiconductor device 101, the n-type carrier accumulation layer 2 may be omitted and the $n^-$-type drift layer 1 may be provided further in a region corresponding to the n-type carrier accumulation layer 2 shown in FIG. 4. Providing the n-type carrier accumulation layer 2 achieves reduction in conduction loss occurring during flow of a current in the IGBT region 10. The n-type carrier accumulation layer 2 and the $n^-$-type drift layer 1 may be called a drift layer collectively.

The n-type carrier accumulation layer 2 is formed by implanting ions of the n-type impurity into the semiconductor substrate forming the $n^-$-type drift layer 1, and then diffusing the implanted n-type impurity by annealing in the semiconductor substrate as the $n^-$-type drift layer 1.

A p-type base layer 15 is provided closer to the first main surface than the n-type carrier accumulation layer 2. The p-type base layer 15 is a semiconductor layer containing p-type impurity that is boron or aluminum, for example, and has a p-type impurity concentration from $1.0\times10^{12}$ to $1.0\times10^{19}/cm^3$. The p-type base layer 15 contacts the gate trench insulating film 11*b* of the active trench gate 11. On a side closer to the first main surface than the p-type base layer 15, the $n^+$-type source layer 13 contacting the gate trench insulating film 11*b* of the active trench gate 11 is provided and the $p^+$-type contact layer 14 is provided in the other region. The $n^+$-type source layer 13 and the $p^+$-type contact layer 14 form the first main surface of the semiconductor substrate. The $p^+$-type contact layer 14 is a region having a higher p-type impurity concentration than the p-type base layer 15. If distinction is required between the $p^+$-type contact layer 14 and the p-type base layer 15, these layers may be designated by the respective names. The $p^+$-type contact layer 14 and the p-type base layer 15 may be called a p-type base layer collectively.

The semiconductor device 100 or the semiconductor device 101 includes an n-type buffer layer 3 provided closer to the second main surface than the $n^-$-type drift layer 1 and having a higher n-type impurity concentration than the $n^-$-type drift layer 1. The n-type buffer layer 3 is provided to prevent punch-through of a depletion layer to extend from the p-type base layer 15 toward the second main surface while the semiconductor device 100 is in an off state. The n-type buffer layer 3 may be formed by implanting phosphorus (P) or protons ($H^+$), or by implanting both phosphorus (P) or protons ($H^+$), for example. An n-type impurity concentration in the n-type buffer layer 3 is from $1.0\times10^{12}$ to $1.0\times10^{18}/cm^3$.

In the configuration of the semiconductor device 100 or the semiconductor device 101, the n-type buffer layer 3 may be omitted and the $n^-$-type drift layer 1 may be provided further in a region of the n-type buffer layer 3 shown in FIG. 4. The n-type buffer layer 3 and the $n^-$-type drift layer 1 may be called a drift layer collectively.

The semiconductor device 100 or the semiconductor device 101 includes the p-type collector layer 16 provided closer to the second main surface than the n-type buffer layer 3. Namely, the p-type collector layer 16 is provided between the $n^-$-type drift layer 1 and the second main surface. The p-type collector layer 16 is a semiconductor layer containing p-type impurity that is boron or aluminum, for example, and has a p-type impurity concentration from $1.0\times10^{16}$ to $1.0\times10^{20}/cm^3$. The p-type collector layer 16 forms the second main surface of the semiconductor substrate. The p-type collector layer 16 is provided not only in the IGBT region 10 but also in the terminal region 30. A part of the p-type collector layer 16 provided in the terminal region 30 forms a p-type terminal collector layer 16*a*. The p-type collector layer 16 may partially protrude from the IGBT region 10 into the diode region 20.

As shown in FIG. 4, the semiconductor device 100 or the semiconductor device 101 has a trench extending from the first main surface of the semiconductor substrate, penetrating the p-type base layer 15, and reaching the $n^-$-type drift layer 1. The gate trench electrode 11*a* is provided in the trench through the gate trench insulating film 11*b*, thereby forming the active trench gate 11. The gate trench electrode 11*a* faces the $n^-$-type drift layer 1 through the gate trench insulating film 11*b*. The dummy trench electrode 12*a* is provided in the trench through the dummy trench insulating film 12*b*, thereby forming the dummy trench gate 12. The dummy trench electrode 12*a* faces the $n^-$-type drift layer 1 through the dummy trench insulating film 12*b*. The gate trench insulating film 11*b* of the active trench gate 11 contacts the p-type base layer 15 and the $n^+$-type source layer 13. If a gate driving voltage is applied to the gate trench electrode 11*a*, a channel is formed in the p-type base layer 15 contacting the gate trench insulating film 11*b* of the active trench gate 11.

As shown in FIG. 4, an interlayer insulating film 4 is provided on the gate trench electrode 11*a* of the active trench gate 11. A barrier metal 5 is formed on a region of the first main surface of the semiconductor substrate where the interlayer insulating film 4 is not provided and on the interlayer insulating film 4. The barrier metal 5 may be a conductor containing titanium (Ti), for example, and may be titanium nitride or TiSi that is an alloy of titanium and silicon (Si), for example. As shown in FIG. 4, the barrier metal 5 ohmically contacts the $n^+$-type source layer 13, the $p^+$-type contact layer 14, and the dummy trench electrode 12*a*, and is electrically connected to the $n^+$-type source layer 13, the $p^+$-type contact layer 14, and the dummy trench electrode 12*a*. An emitter electrode 6 (first electrode) is provided on the barrier metal 5. The emitter electrode 6 may be made of an aluminum alloy such as an aluminum-silicon alloy (Al—Si based alloy), or may be an electrode composed of metal films in a plurality of layers formed by providing a plated film by electroless plating or electrolytic plating on an electrode made of an aluminum alloy, for example. The plated film formed by electroless plating or electrolytic plating may be a film plated with nickel (Ni), for example. If there is a fine region such as a region between the interlayer insulating films 4 next to each other where favorable embedding performance cannot be obtained by the emitter electrode 6, tungsten having more favorable embedding performance than the emitter electrode 6 may be provided in the fine region and the emitter electrode 6 may be provided on the tungsten. Without providing the barrier metal 5, the emitter electrode 6 may be provided on the $n^+$-type source layer 13, the $p^+$-type contact layer 14, and the dummy trench electrode 12*a*. In another case, the barrier metal 5 may be provided only on an n-type semiconductor layer such as the $n^+$-type source layer 13. The barrier metal 5 and the emitter electrode 6 may be called an emitter electrode collectively. In FIG. 4, the interlayer insulating film 4 is not provided on the dummy trench electrode 12*a* of the dummy trench gate 12. Alternatively, the interlayer insulating film 4 may be provided on the dummy trench electrode 12*a* of the dummy trench gate 12. If the interlayer insulating film 4 is provided on the dummy trench electrode 12*a* of the dummy trench gate 12, the emitter electrode 6 and the dummy trench electrode 12*a* may be electrically connected to each other in another section.

A collector electrode 7 (second electrode) is provided closer to the second main surface than the p-type collector layer 16. Like the emitter electrode 6, the collector electrode 7 may be composed of an aluminum alloy or an aluminum alloy and a plated film. The collector electrode 7 may have a different configuration from the emitter electrode 6. The collector electrode 7 ohmically contacts the p-type collector layer 16 and is electrically connected to the p-type collector layer 16.

FIG. 5 is a sectional view of the semiconductor device 100 or the semiconductor device 101 taken in the arrow direction along the dashed line B-B in FIG. 3, and is a sectional view of the IGBT region 10. The sectional view shown in FIG. 5 taken in the arrow direction along the dashed line B-B differs from the sectional view shown in FIG. 4 taken in the arrow direction along the dashed line A-A in that it does not include the $n^+$-type source layer 13 contacting the active trench gate 11 and provided closer to the first main surface of the semiconductor substrate than the active trench gate 11. Specifically, as shown in FIG. 3, the $n^+$-type source layer 13 is selectively provided closer to the first main surface than a p-type base layer. The p-type base layer mentioned herein means a p-type base layer as a collective name for the p-type base layer 15 and the $p^+$-type contact layer 14.

(4) General Configuration of Diode Region 20

Figure 6:
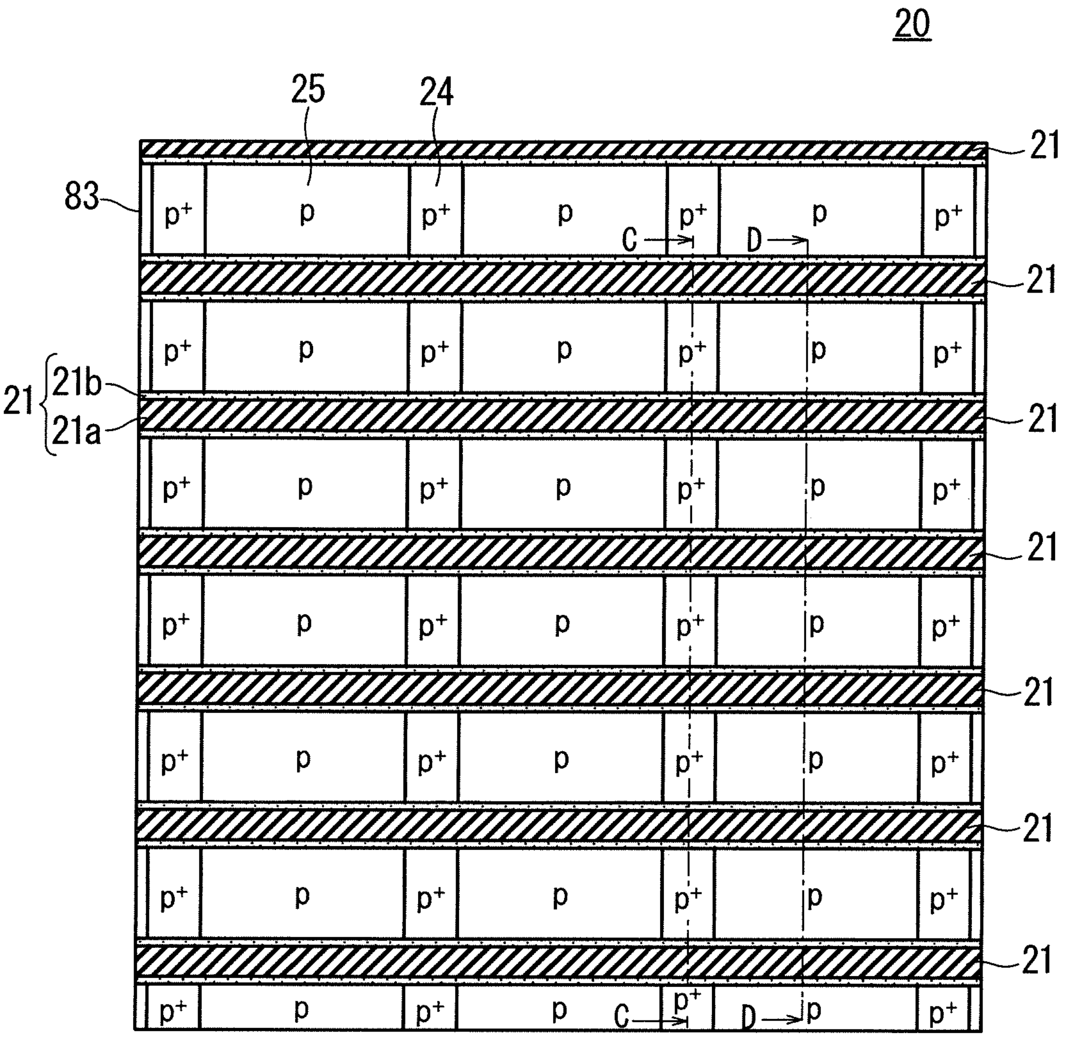
FIG. 6 is a partial plan view of a diode region in the RC-IGBT.
Figure 7:
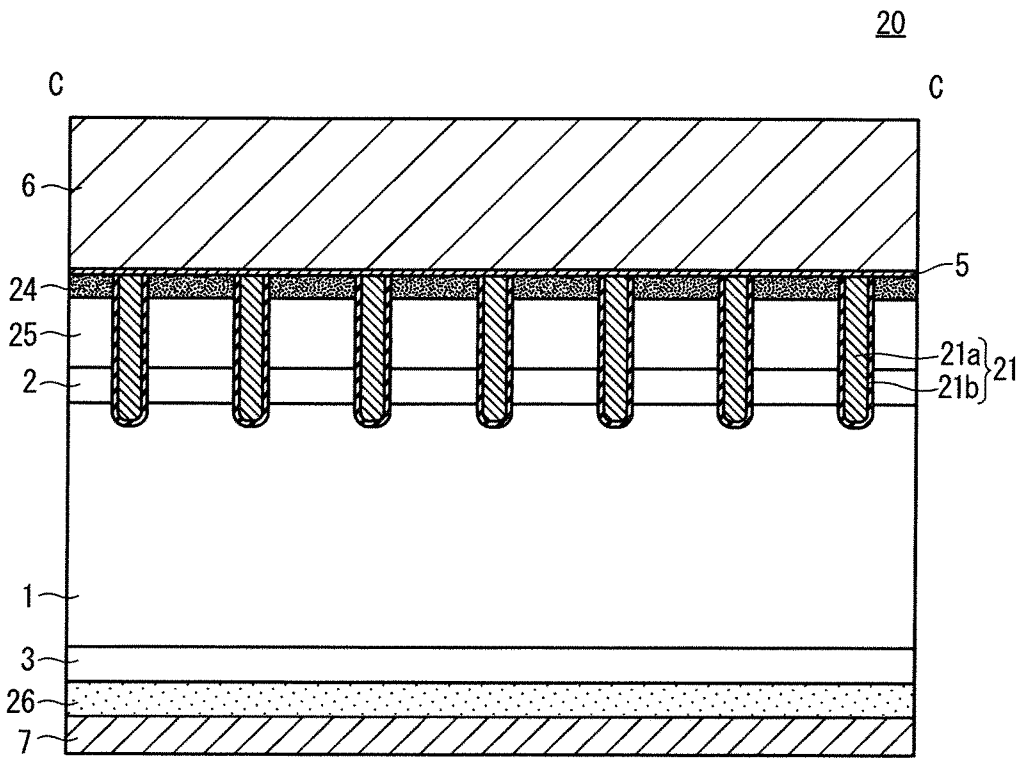
FIGS. 7 and 8 are partial sectional views of the diode region in the RC-IGBT.
Figure 8:
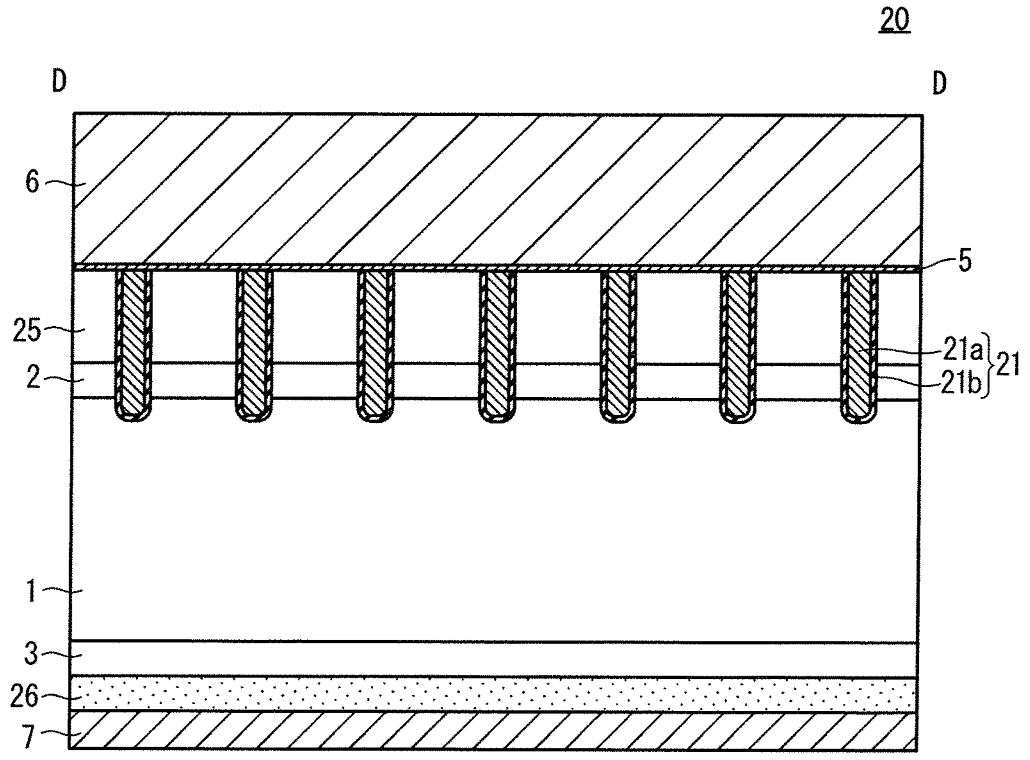

FIG. 6 is a partially enlarged plan view showing the configuration of the diode region in the semiconductor device as an RC-IGBT. FIGS. 7 and 8 are sectional views showing the configuration of the diode region in the semiconductor device as an RC-IGBT. FIG. 6 shows a region 83 in an enlarged manner surrounded by dashed lines in the semiconductor device 100 shown in FIG. 1 or in the semiconductor device 101. FIG. 7 is a sectional view taken in an arrow direction along a dashed line C-C in the semiconductor device 100 shown in FIG. 6. FIG. 8 is a sectional view taken in an arrow direction along a dashed line D-D in the semiconductor device 100 shown in FIG. 6.

A diode trench gate 21 extends from one end toward the other end of the diode region 20 as the cell region along the first main surface of the semiconductor device 100 or the semiconductor device 101. The diode trench gate 21 is formed by providing a diode trench electrode 21*a* through a diode trench insulating film 21*b* in a trench formed in the semiconductor substrate in the diode region 20. The diode trench electrode 21*a* faces an $n^-$-type drift layer 1 through the diode trench insulating film 21*b*. A $p^+$-type contact layer 24 as a fourth semiconductor layer and a p-type anode layer 25 as a third semiconductor layer are provided between two diode trench gates 21 next to each other. The $p^+$-type contact layer 24 is a semiconductor layer containing p-type impurity that is boron or aluminum, for example, and has a p-type impurity concentration from $1.0\times10^{15}$ to $1.0\times10^{20}/cm^3$. The p-type anode layer 25 is a semiconductor layer containing p-type impurity that is boron or aluminum, for example, and has a p-type impurity concentration from $1.0\times10^{12}$ to $1.0\times10^{19}/cm^3$. The $p^+$-type contact layer 24 and the p-type anode layer 25 are provided alternately in a lengthwise direction of the diode trench gate 21.

FIG. 7 is a sectional view of the semiconductor device 100 or the semiconductor device 101 taken in the arrow direction along the dashed line C-C in FIG. 6, and is a sectional view of the diode region 20. Like in the IGBT region 10, the semiconductor device 100 or the semiconductor device 101 includes the $n^-$-type drift layer 1 composed of the semiconductor substrate in the diode region 20. The n-type drift layer 1 in the diode region 20 and the $n^-$-type drift layer 1 in the IGBT region 10 are formed continuously and integrally with each other, and are composed of the same semiconductor substrate. In FIG. 7, the semiconductor substrate is in a range from the $p^+$-type contact layer 24 to an $n^+$-type cathode layer 26 as a first semiconductor layer. In FIG. 7, an upper end of the $p^+$-type contact layer 24 in the plane of paper is called a first main surface of the semiconductor substrate, and a lower end of the $n^+$-type cathode layer 26 in the plane of paper is called a second main surface of the semiconductor substrate. The first main surface in the diode region 20 and the first main surface in the IGBT region 10 are in the same plane. The second main surface of the diode region 20 and the second main surface in the IGBT region 10 are in the same plane.

As shown in FIG. 7, like in the IGBT region 10, an n-type carrier accumulation layer 2 is provided closer to the first main surface than the $n^-$-type drift layer 1, and an n-type buffer layer 3 is provided closer to the second main surface than the $n^-$-type drift layer 1 in the diode region 20. The n-type carrier accumulation layer 2 and the n-type buffer layer 3 provided in the diode region 20 have the same configurations as those of the n-type carrier accumulation layer 2 and the n-type buffer layer 3 provided in the IGBT region 10 respectively. The n-type carrier accumulation layer 2 is not necessarily required in the IGBT region 10 and the diode region 20. In one configuration, the n-type carrier accumulation layer 2 may be provided in the IGBT region 10 while the n-type carrier accumulation layer 2 may not be provided in the diode region 20. Like in the IGBT region 10, the $n^-$-type drift layer 1, the n-type carrier accumulation layer 2, and the n-type buffer layer 3 may be called a drift layer collectively.

The p-type anode layer 25 is provided closer to the first main surface than the n-type carrier accumulation layer 2.

The p-type anode layer 25 is provided between the $n^-$-type drift layer 1 and the first main surface. A p-type impurity concentration in the p-type anode layer 25 may be set equal to that in the p-type base layer 15 in the IGBT region 10, and the p-type anode layer 25 and the p-type base layer 15 may be formed simultaneously. The p-type impurity concentration in the p-type anode layer 25 may be set lower than the p-type impurity concentration in the p-type base layer 15 in the IGBT region 10, and the p-type anode layer 25 may be configured in such a manner as to reduce the quantity of holes to be injected into the diode region 20 during diode operation. Reducing the quantity of holes to be injected during diode operation achieves reduction in recovery loss occurring during diode operation.

The $p^+$-type contact layer 24 is provided closer to the first main surface than the p-type anode layer 25. A p-type impurity concentration in the $p^+$-type contact layer 24 may be set equal to or different from the p-type impurity concentration in the $p^+$-type contact layer 14 in the IGBT region 10. The $p^+$-type contact layer 24 forms the first main surface of the semiconductor substrate. The $p^+$-type contact layer 24 is a region of the higher p-type impurity concentration than the p-type anode layer 25. If distinction is required between the $p^+$-type contact layer 24 and the p-type anode layer 25, these layers may be designated by the respective names. The $p^+$-type contact layer 24 and the p-type anode layer 25 may also be called a p-type anode layer collectively.

In the diode region 20, the $n^+$-type cathode layer 26 is provided closer to the second main surface than the n-type buffer layer 3. The $n^+$-type cathode layer 26 is provided between the $n^-$-type drift layer 1 and the second main surface. The $n^+$-type cathode layer 26 is a semiconductor layer containing n-type impurity that is arsenic or phosphorus, for example, and has an n-type impurity concentration from $1.0\times10^{16}$ to $1.0\times10^{21}/cm^3$. As shown in FIG. 2, the $n^+$-type cathode layer 26 is provided in a part of the diode region 20 or in the diode region 20 entirely. The $n^+$-type cathode layer 26 forms the second main surface of the semiconductor substrate. While not shown in the drawings, by selectively implanting p-type impurity further into a region where the $n^+$-type cathode layer 26 is formed in the manner described above, a $p^+$-type cathode layer may be provided using a part of the region where the $n^+$-type cathode layer 26 is formed as p-type semiconductor. A diode where the $n^+$-type cathode layer and the $p^+$-type cathode layer are arranged alternately along the second main surface of the semiconductor substrate in this way is called a relaxed field of cathode (RFC) diode.

As shown in FIG. 7, the diode region 20 in the semiconductor device 100 or the semiconductor device 101 has a trench extending from the first main surface of the semiconductor substrate, penetrating the p-type anode layer 25, and reaching the $n^-$-type drift layer 1. The diode trench electrode 21*a* is provided in the trench in the diode region 20 through the diode trench insulating film 21*b*, thereby forming the diode trench gate 21. The diode trench electrode 21*a* faces the $n^-$-type drift layer 1 through the diode trench insulating film 21*b*.

As shown in FIG. 7, a barrier metal 5 is provided on the diode trench electrode 21*a* and the $p^+$-type contact layer 24. The barrier metal 5 ohmically contacts the diode trench electrode 21*a* and the $p^+$-type contact layer 24, and is electrically connected to the diode trench electrode 21*a* and the $p^+$-type contact layer 24. The barrier metal 5 may have the same configuration as the barrier metal 5 in the IGBT region 10. An emitter electrode 6 is provided on the barrier metal 5. The emitter electrode 6 in the diode region 20 is formed continuously with the emitter electrode 6 in the IGBT region 10. Like in the case of the IGBT region 10, without forming the barrier metal 5, the diode trench electrode 21*a* and the $p^+$-type contact layer 24 may ohmically contact the emitter electrode 6. In FIG. 7, an interlayer insulating film 4 is not provided on the diode trench electrode 21*a* of the diode trench gate 21. In another case, the interlayer insulating film 4 may be provided on the diode trench electrode 21*a* of the diode trench gate 21. If the interlayer insulating film 4 is provided on the diode trench electrode 21*a* of the diode trench gate 21, the emitter electrode 6 and the diode trench electrode 21*a* may be electrically connected to each other in another section.

A collector electrode 7 is provided closer to the second main surface than the $n^+$-type cathode layer 26. Like the emitter electrode 6, the collector electrode 7 in the diode region 20 is formed continuously with the collector electrode 7 in the IGBT region 10. The collector electrode 7 ohmically contacts the $n^+$-type cathode layer 26, is electrically connected to the $n^+$-type cathode layer 26, and also functions as a cathode electrode.

FIG. 8 is a sectional view of the semiconductor device 100 or the semiconductor device 101 taken in the arrow direction along the dashed line D-D in FIG. 6, and is a sectional view of the diode region 20 taken in the arrow direction. This sectional view differs from the sectional view shown in FIG. 7 taken in the arrow direction along the dashed line C-C in that it does not include the $p^+$-type contact layer 24 between the p-type anode layer 25 and the barrier metal 5 and the p-type anode layer 25 forms the first main surface of the semiconductor substrate. Specifically, the $p^+$-type contact layer 24 shown in FIG. 7 is selectively provided closer to the first main surface than the p-type anode layer 25.

(5) Boundary Area Between IGBT Region 10 and Diode Region 20

Figure 9:
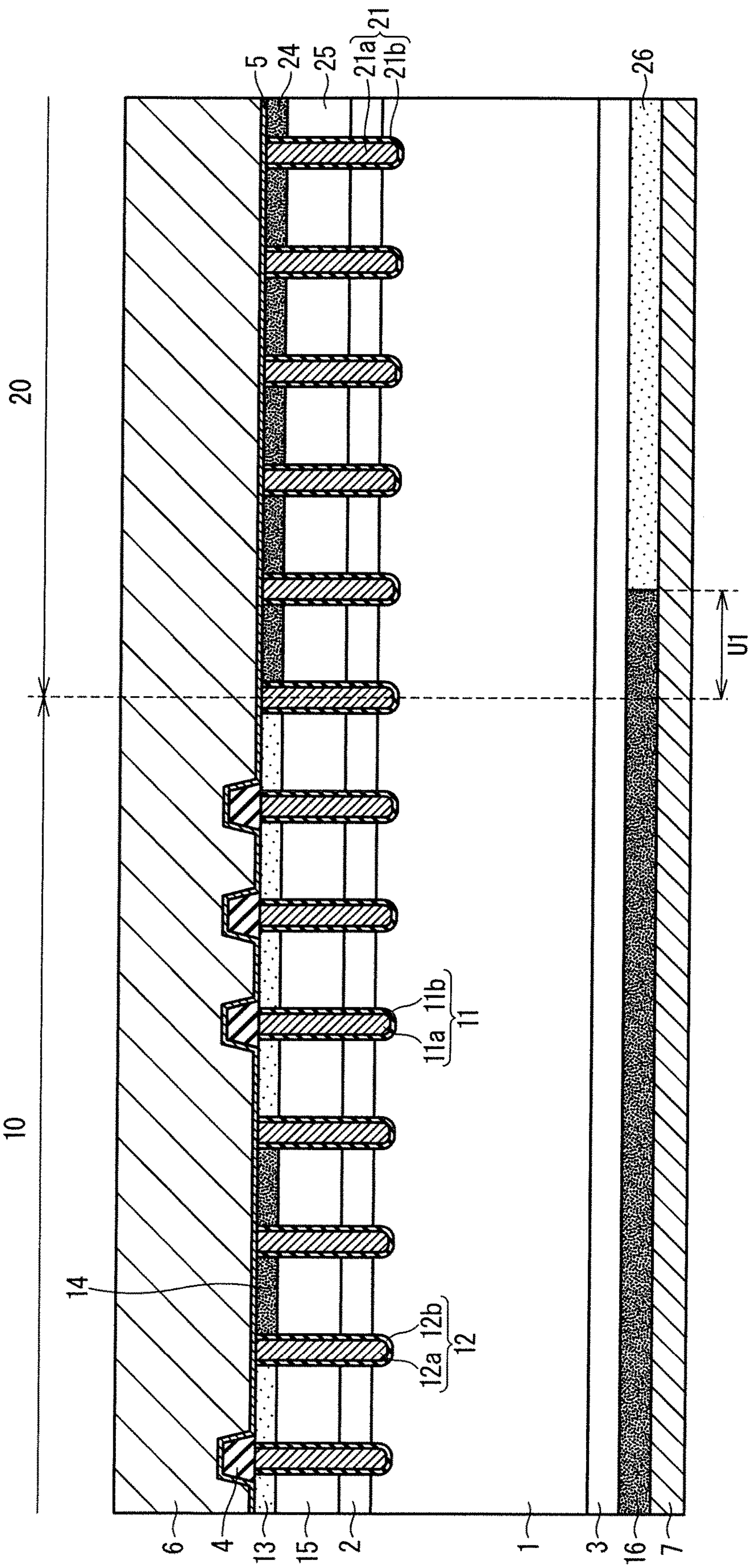
FIG. 9 is a sectional view of a boundary area between the IGBT region and the diode region in the RC-IGBT.

FIG. 9 is a sectional view showing a configuration at a boundary between the IGBT region and the diode region in the semiconductor device as an RC-IGBT. FIG. 9 is a sectional view taken in an arrow direction along a dashed line G-G in the semiconductor device 100 shown in FIG. 1 or in the semiconductor device 101.

As shown in FIG. 9, the p-type collector layer 16 provided at the second main surface in the IGBT region 10 protrudes from the boundary between the IGBT region 10 and the diode region 20 into the diode region 20 by a distance U1. By protruding the p-type collector layer 16 into the diode region 20 in this way, it becomes possible to increase a distance between the $n^+$-type cathode layer 26 in the diode region 20 and the active trench gate 11. Thus, even if a gate driving voltage is applied to the gate trench electrode 11*a* during operation of a free wheeling diode, it is still possible to suppress flow of a current from a channel formed next to the active trench gate 11 in the IGBT region 10 into the $n^+$-type cathode layer 26. The distance U1 may be 100 μm, for example. According to purpose of use of the semiconductor device 100 or the semiconductor device 101 as an RC-IGBT, the distance U1 may be zero or a distance less than 100 μm.

(6) General Configuration of Terminal Region 30

Figure 10:
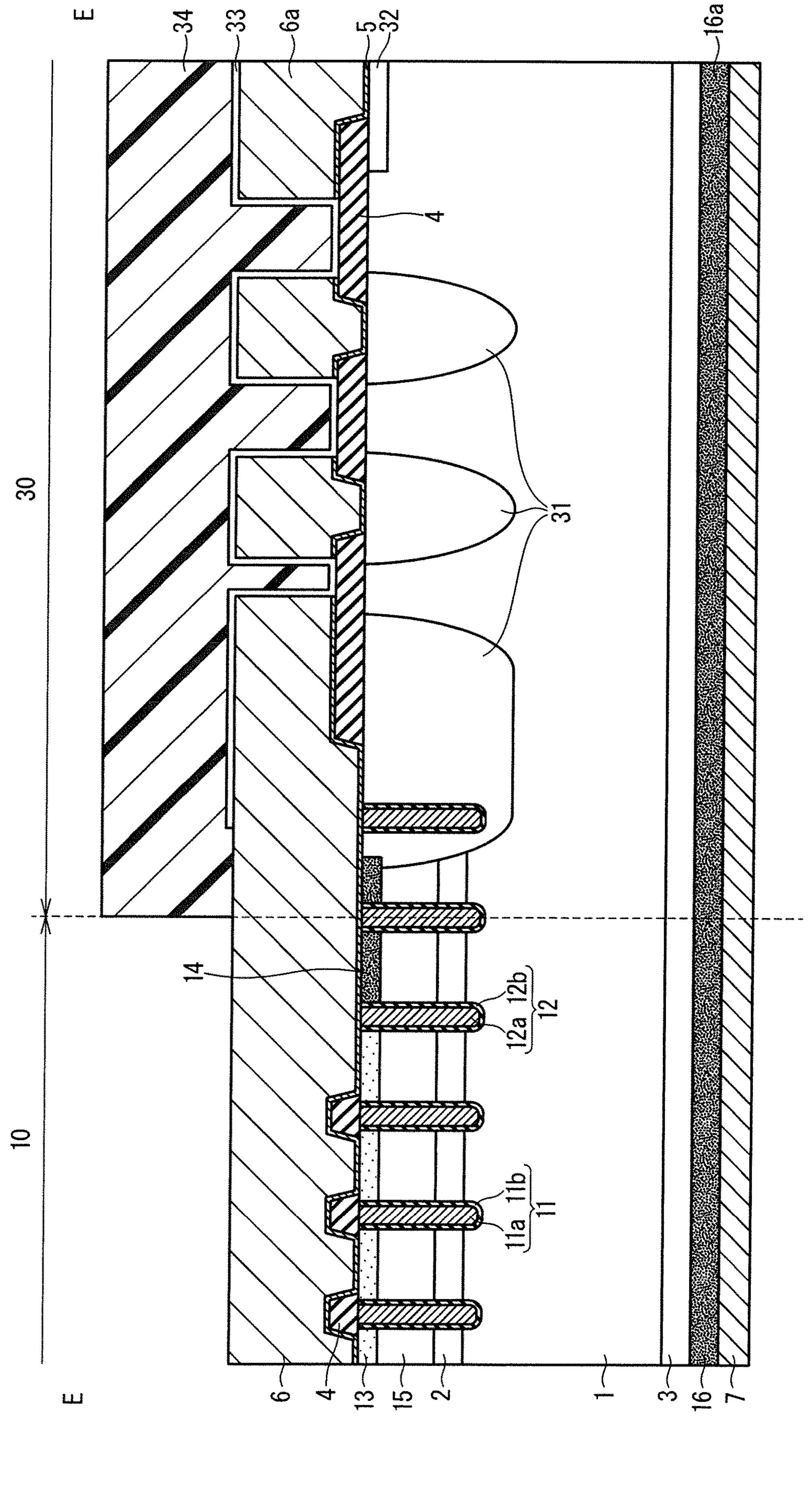
FIG. 10 is sectional view of a boundary area between the IGBT region and a terminal region in the RC-IGBT.
Figure 11:
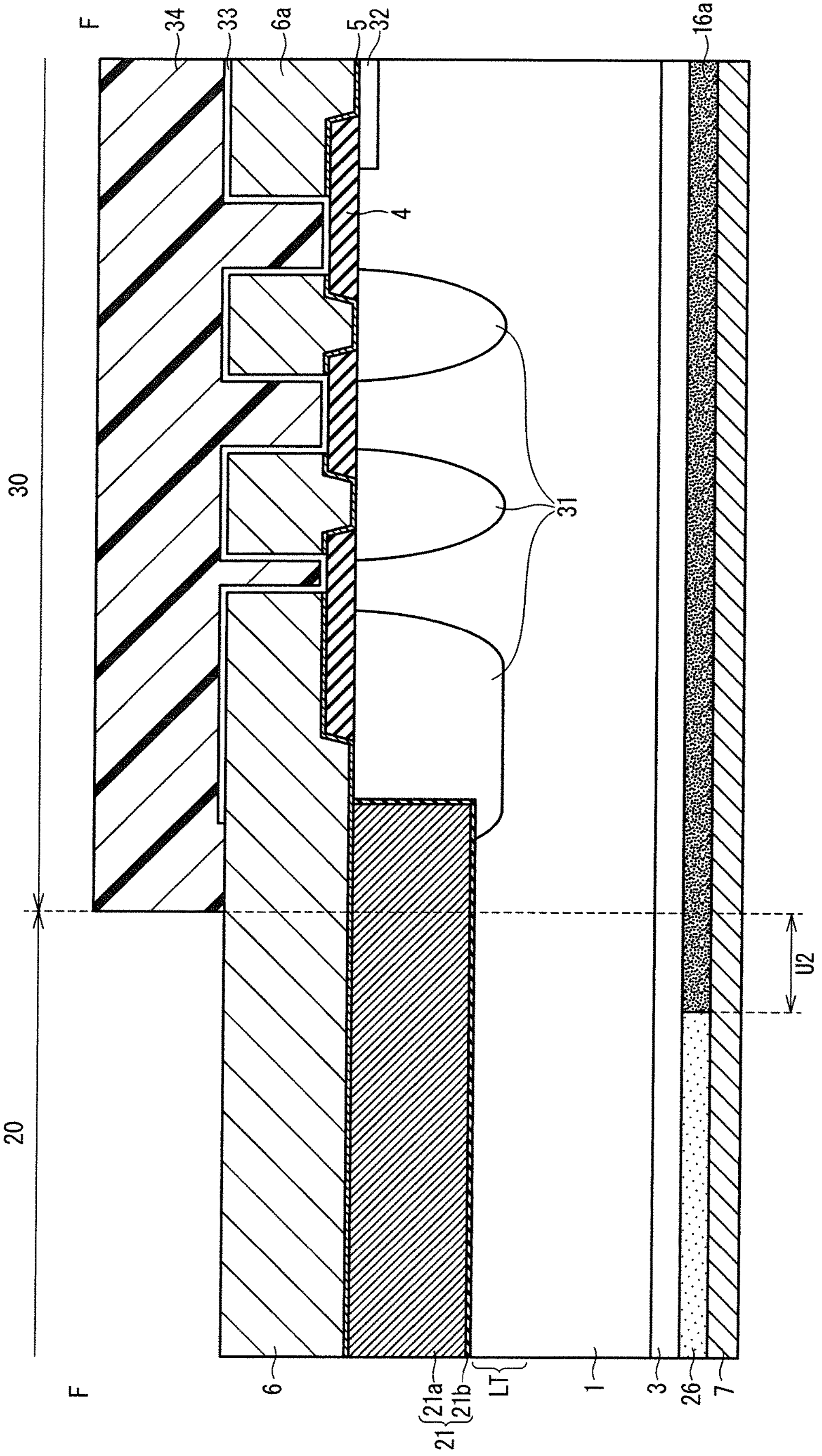
FIG. 11 is sectional view of a boundary area between the diode region and the terminal region in the RC-IGBT.

FIGS. 10 and 11 are sectional views showing the configuration of the terminal region in the semiconductor device as an RC-IGBT. FIG. 10 is a sectional view taken in an arrow direction along a dashed line E-E in FIG. 1 or 2, and is a sectional view in a range from the IGBT region 10 to the terminal region 30. FIG. 11 is a sectional view taken in an arrow direction along a dashed line F-F in FIG. 1, and is a sectional view in a range from the diode region 20 to the terminal region 30.

As shown in FIGS. 10 and 11, the terminal region 30 in the semiconductor device 100 includes an n-type drift layer 1 provided between a first main surface and a second main surface of a semiconductor substrate. The first main surface and the second main surface in the terminal region 30 are in the same plane as the first main surface and in the same plane as the second main surface respectively in each of the IGBT region 10 and the diode region 20. The $n^-$-type drift layer 1 in the terminal region 30 has the same configuration as that of the $n^-$-type drift layer 1 in each of the IGBT region 10 and the diode region 20, and is formed continuously and integrally with the $n^-$-type drift layer 1 in each of the IGBT region 10 and the diode region 20.

A p-type terminal well layer 31 is provided closer to the first main surface than the $n^-$-type drift layer 1, namely, between the first main surface of the semiconductor substrate and the $n^-$-type drift layer 1. The p-type terminal well layer 31 is a semiconductor layer containing p-type impurity that is boron or aluminum, for example, and has a p-type impurity concentration from $1.0\times10^{14}$ to $1.0\times10^{19}/cm^3$. The p-type terminal well layer 31 surrounds the cell region covering the IGBT region 10 and the diode region 20. The p-type terminal well layer 31 is formed into a plurality of ring shapes. The number of the p-type terminal well layers 31 is selected properly in designing the breakdown voltage of the semiconductor device 100 or the semiconductor device 101. An $n^+$-type channel stopper layer 32 is provided still external to the p-type terminal well layer 31. The $n^+$-type channel stopper layer 32 surrounds the p-type terminal well layer 31.

The p-type terminal collector layer 16*a* is provided between the $n^-$-type drift layer 1 and the second main surface of the semiconductor substrate. The p-type terminal collector layer 16*a* is formed continuously and integrally with the p-type collector layer 16 in the cell region. Thus, a layer including the p-type terminal collector layer 16*a* may be called a p-type collector layer 16 collectively. As shown in FIG. 11, in a configuration such as that of the semiconductor device 100 shown in FIG. 1 where the diode region 20 is provided next to the terminal region 30, an end portion of the p-type terminal collector layer 16*a* closer to the diode region 20 protrudes into the diode region 20 by a distance U2. By protruding the p-type terminal collector layer 16*a* into the diode region 20 in this way, it becomes possible to increase a distance between the $n^+$-type cathode layer 26 in the diode region 20 and the p-type terminal well layer 31. Thus, it is possible to prevent the p-type terminal well layer 31 from operating as an anode of a diode. The distance U2 may be 100 μm, for example.

A collector electrode 7 is provided on the second main surface of the semiconductor substrate. The collector electrode 7 is formed continuously and integrally from the cell region covering the IGBT region 10 and the diode region 20. Meanwhile, an emitter electrode 6 continuous from the cell region and a terminal electrode 6*a* separated from the emitter electrode 6 are provided on the first main surface of the semiconductor substrate in the terminal region 30.

The emitter electrode 6 and the terminal electrode 6*a* are electrically connected to each other through a semi-insulating film 33. The semi-insulating film 33 may be a semi-insulating silicon nitride (SinSiN) film, for example. The terminal electrode 6*a* is electrically connected to the p-type terminal well layer 31 and the $n^+$-type channel stopper layer 32 through contact holes formed in an interlayer insulating film 4 provided on the first main surface in the terminal region 30. A terminal protective film 34 covering the emitter electrode 6, the terminal electrode 6*a*, and the semi-insulating film 33 is provided in the terminal region 30. The terminal protective film 34 may be made of polyimide, for example.

(7) General Method of Manufacturing RC-IGBT

Figure 18:
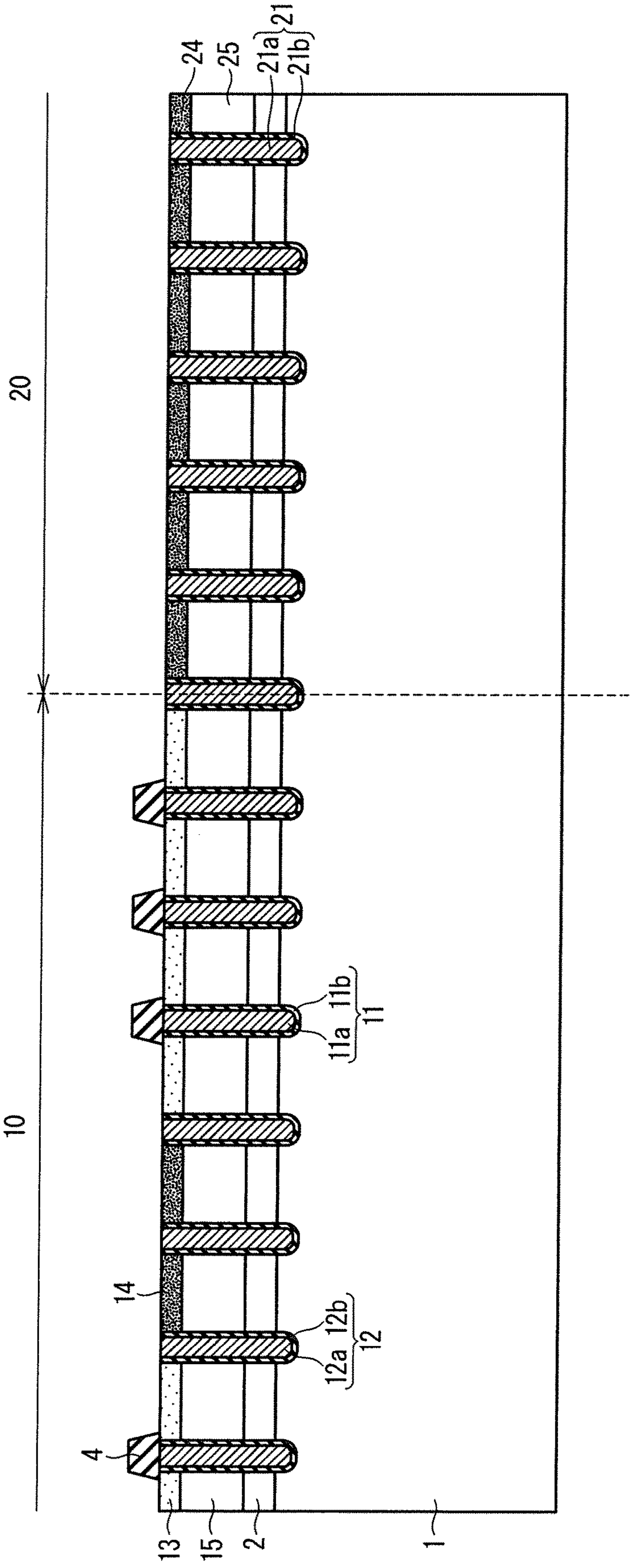
Figure 19:
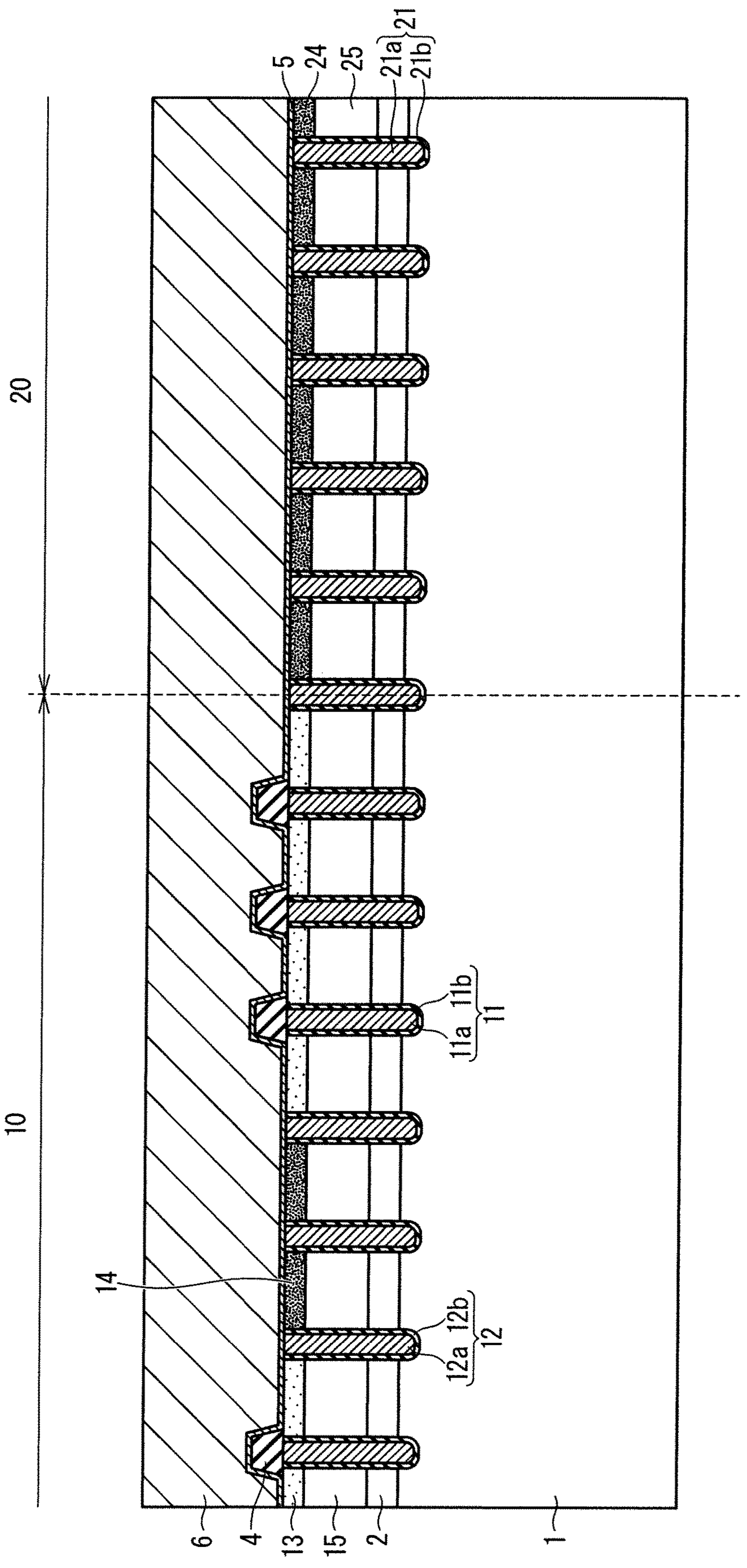
Figure 20:
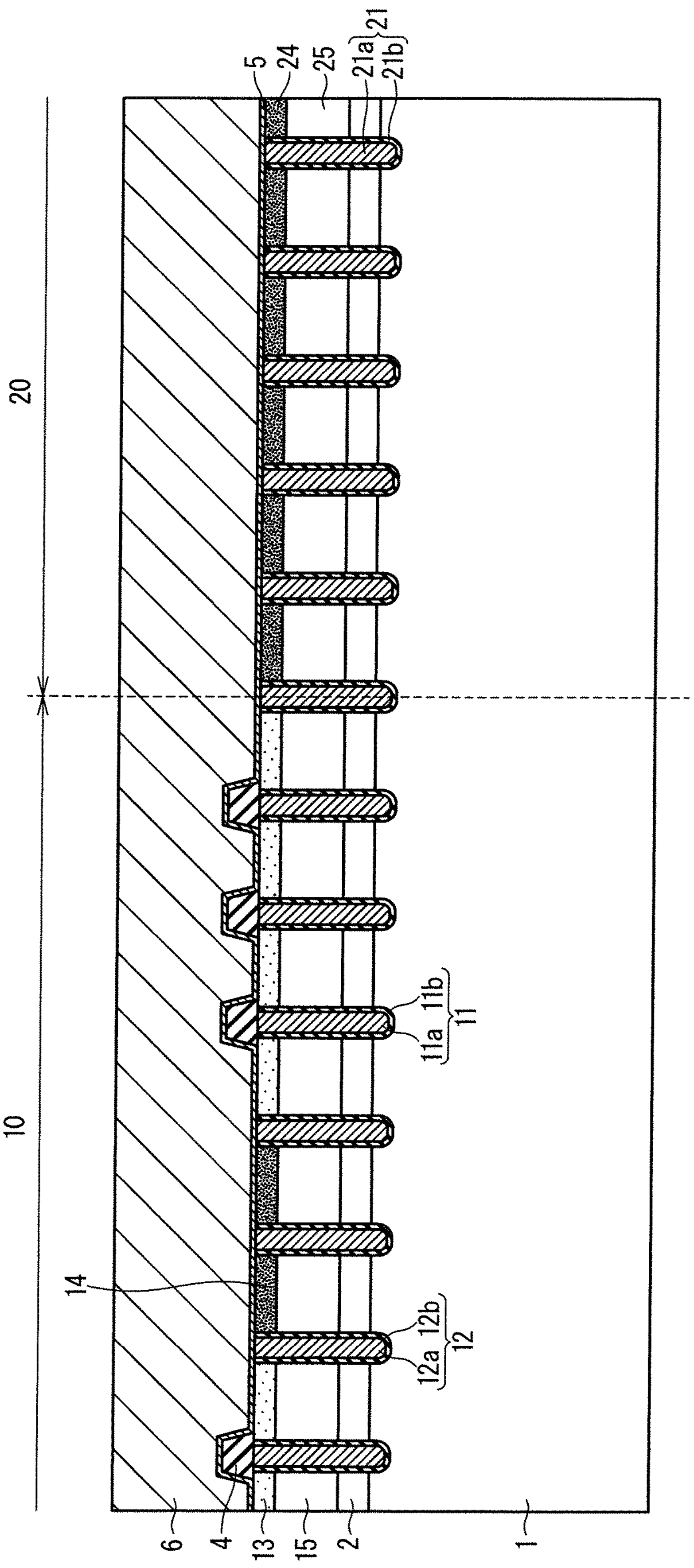
Figure 21:
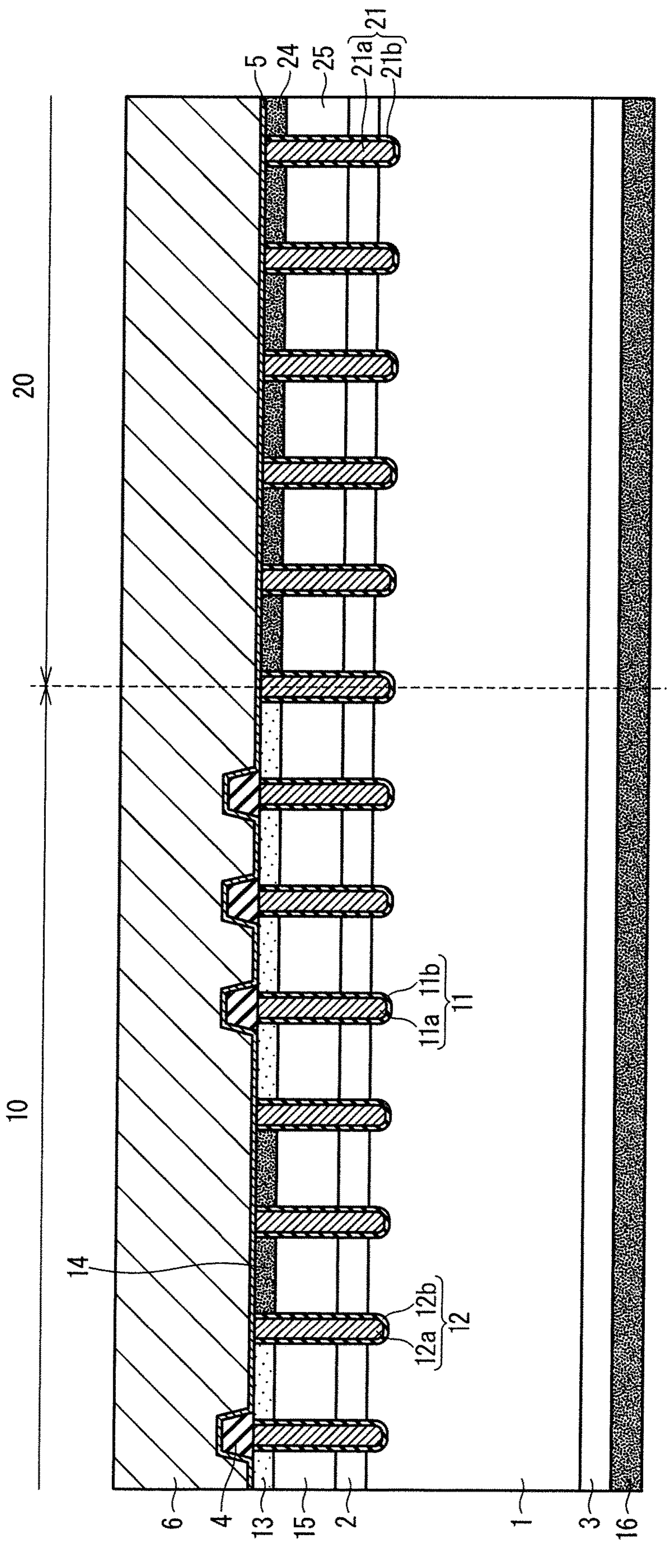
Figure 22:
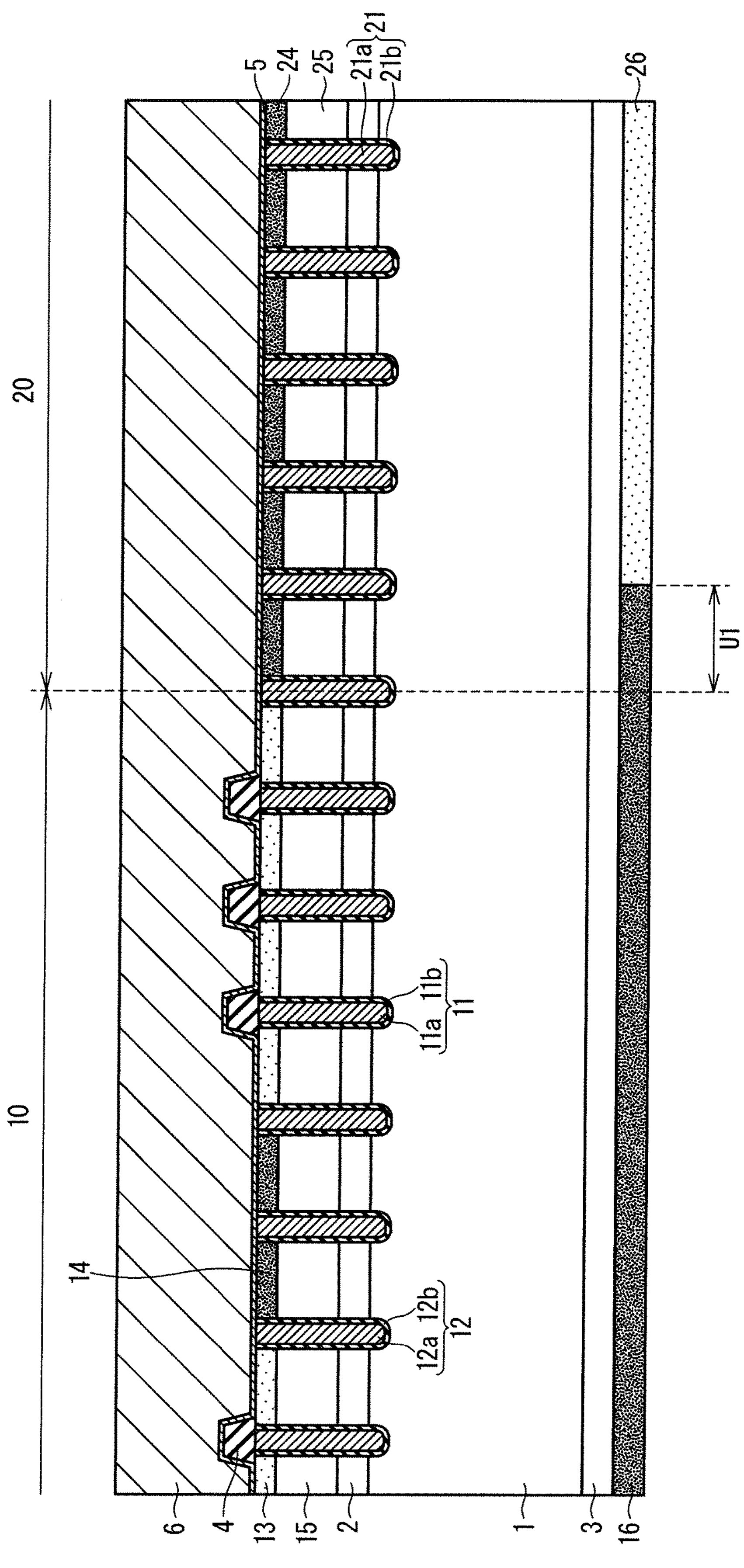

FIGS. 12 to 22 show a method of manufacturing the semiconductor device as an RC-IGBT. FIGS. 12 to 19 show steps of forming the front surface side of the semiconductor device 100 or the semiconductor device 101. FIGS. 20 to 22 show steps of forming the back surface side of the semiconductor device 100 or the semiconductor device 101.

Figure 12:
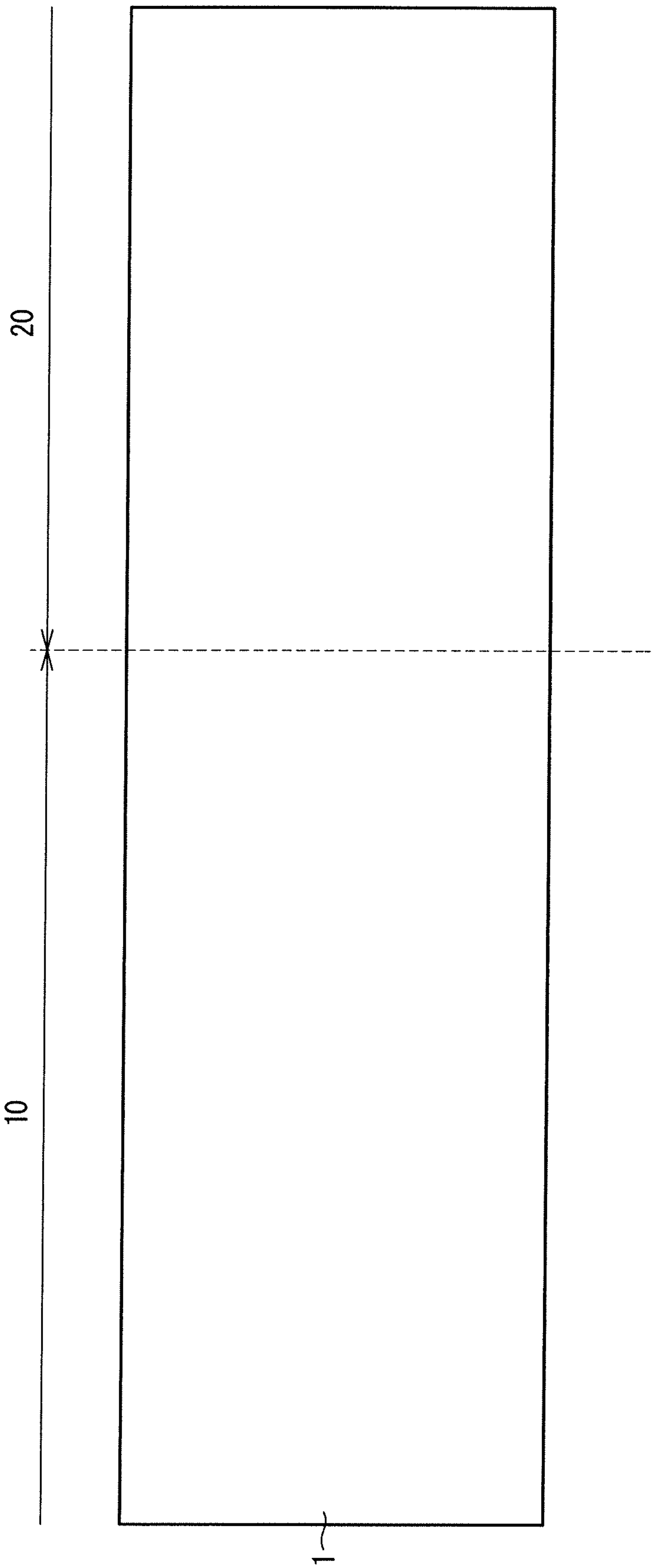
FIGS. 12 to 22 are sectional views showing a method of manufacturing the RC-IGBT.

First, as shown in FIG. 12, a semiconductor substrate to form the $n^-$-type drift layer 1 is prepared. For example, the semiconductor substrate may be prepared using a so-called floating zone (FZ) wafer prepared by the FZ process or using a so-called magnetic field applied Czochralski (MCZ) wafer prepared by the MCZ process, and may be an n-type wafer containing n-type impurity. The concentration of the n-type impurity in the semiconductor substrate is selected properly according to the breakdown voltage of the semiconductor device to be manufactured. In the case of a semiconductor device having a breakdown voltage of 200 V, for example, the concentration of the n-type impurity is controlled so as to provide a specific resistance from 40 to 120 Ω·cm in the $n^-$-type drift layer 1 to form the semiconductor substrate. As shown in FIG. 12, in the step of preparing the semiconductor substrate, the semiconductor substrate is entirely formed as the n-type drift layer 1. By implanting ions of p-type or n-type impurity from the first main surface side or the second main surface side of this semiconductor substrate and then diffusing the ions in the semiconductor substrate by performing thermal process thereafter, for example, a p-type or n-type semiconductor layer is formed to manufacture the semiconductor device 100 or the semiconductor device 101.

As shown in FIG. 12, the semiconductor substrate forming the $n^-$-type drift layer 1 includes regions to function as the IGBT region 10 and the diode region 20. While not shown in FIG. 12, the semiconductor substrate includes a region to function as the terminal region 30 around the regions not shown in FIG. 12 to become the IGBT region 10 and the diode region 20. The following description is mainly intended for a method of manufacturing the configurations of the IGBT region 10 and the diode region 20 in the semiconductor device 100 or the semiconductor device 101. The terminal region 30 in the semiconductor device 100 or the semiconductor device 101 can be formed by a well-known manufacturing method. If an FLR having the p-type terminal well layer 31 is to be formed as a breakdown voltage retaining structure in the terminal region 30, for example, the FLR may be formed by implanting p-type impurity ions before formation of the IGBT region 10 and the diode region 20 in the semiconductor device 100 or the semiconductor device 101, or may be formed by implanting p-type impurity ions simultaneously with implantation of ions of p-type impurity into the IGBT region 10 or the diode region 20 in the semiconductor device 100.

Figure 13:
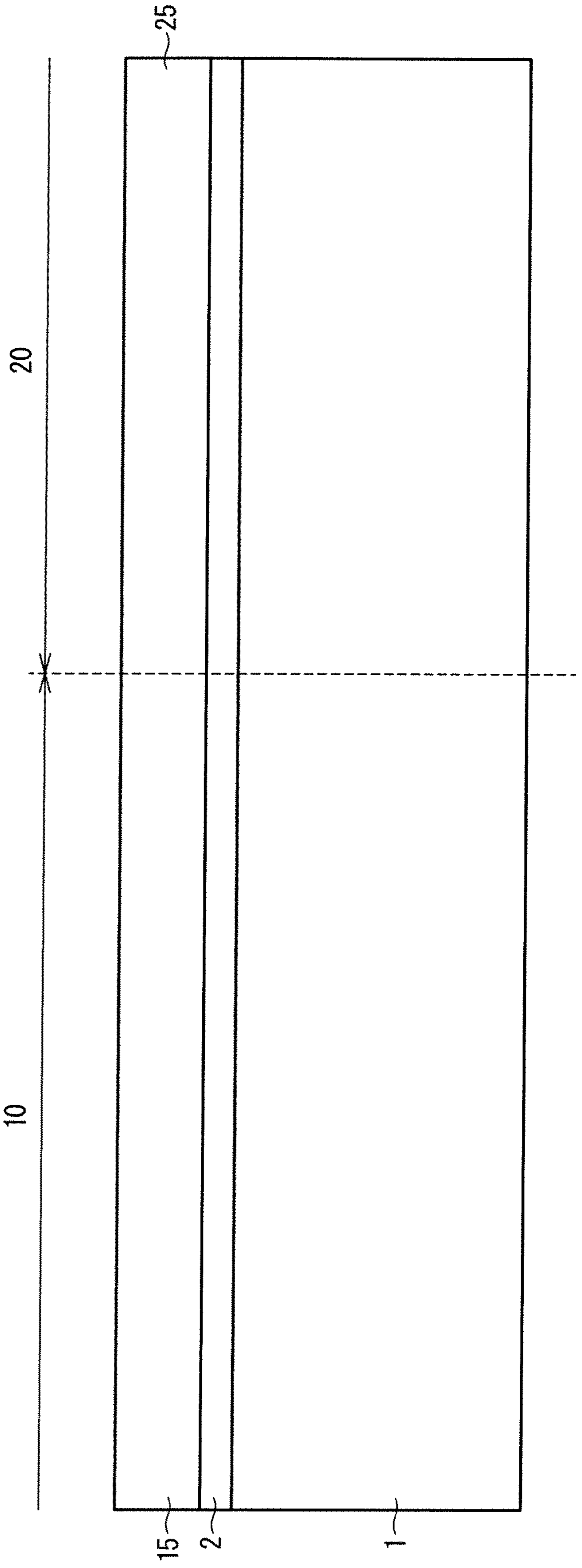

Next, as shown in FIG. 13, n-type impurity such as phosphorus (P) is implanted from the first main surface side of the semiconductor substrate to form the n-type carrier accumulation layer 2. Furthermore, p-type impurity such as boron (B) is implanted from the first main surface side of the semiconductor substrate to form the p-type base layer 15 and the p-type anode layer 25. The n-type carrier accumulation layer 2, the p-type base layer 15, and the p-type anode layer 25 are formed by implanting respective impurity ions into the semiconductor substrate and then diffusing the impurity ions by thermal process. As the n-type impurity and the p-type impurity are implanted as ions after implementation of a mask process on the first main surface of the semiconductor substrate, the n-type impurity and the p-type impurity are provided selectively on the first main surface side of the semiconductor substrate. The n-type carrier accumulation layer 2, the p-type base layer 15, and the p-type anode layer 25 are formed in the IGBT region 10 and the diode region 20, and are connected to the p-type terminal well layer 31 in the terminal region 30. The mask process is a process of forming a mask on the semiconductor substrate for application of a resist onto the semiconductor substrate, formation of an opening in a predetermined region of the resist using photolithography technique, and implantation of ions into a predetermined region of the semiconductor substrate through the opening or etching.

The p-type base layer 15 and the p-type anode layer 25 may be formed by implanting ions of the p-type impurity simultaneously. In this case, the p-type base layer 15 and the p-type anode layer 25 have the same configuration with the same depth and the same p-type impurity concentration. In another case, a mask process may be performed to implant ions of the p-type impurity separately into the p-type base layer 15 and the p-type anode layer 25, thereby providing the p-type base layer 15 and the p-type anode layer 25 with depths and p-type impurity concentrations differing from each other.

The p-type terminal well layer 31 to be formed in another section may be provided by implanting ions of p-type impurity simultaneously with the implantation into the p-type anode layer 25. In this case, it is possible to form the p-type terminal well layer 31 and the p-type anode layer 25 into the same configuration with the same depth and the same p-type impurity concentration. It is also possible to provide the p-type terminal well layer 31 and the p-type anode layer 25 with concentrations of the p-type impurity differing from each other by implanting ions of the p-type impurity simultaneously into the p-type terminal well layer 31 and the p-type anode layer 25. This may be achieved by preparing a mesh mask for either one or both of the p-type terminal well layer 31 and the p-type anode layer 25 to change an opening ratio.

By performing a mask process and implanting ions of the p-type impurity separately into the p-type terminal well layer 31 and the p-type anode layer 25, the p-type terminal well layer 31 and the p-type anode layer 25 may have depths and p-type impurity concentrations differing from each other. The p-type terminal well layer 31, the p-type base layer 15, and the p-type anode layer 25 may be formed by implanting ions of the p-type impurity simultaneously.

Figure 14:
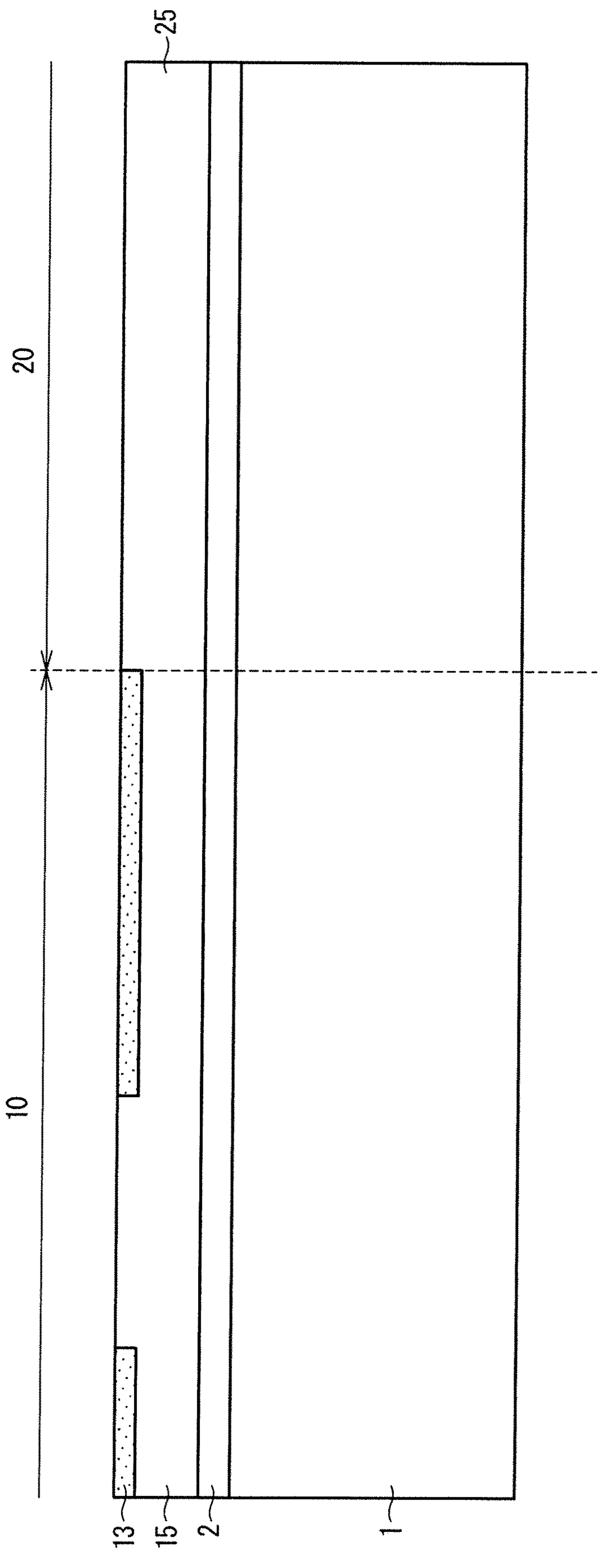

Next, as shown in FIG. 14, a mask process is performed and n-type impurity is implanted selectively into the p-type base layer 15 in the IGBT region 10 on the first main surface side, thereby forming the $n^+$-type source layer 13. The implanted n-type impurity may be arsenic (As) or phosphorus (P), for example. Furthermore, a mask process is performed, and p-type impurity is implanted selectively into the p-type base layer 15 in the IGBT region 10 on the first main surface side to form the $p^+$-type contact layer 14 while p-type impurity is implanted selectively into the p-type anode layer 25 in the diode region 20 on the first main surface to form the $p^+$-type contact layer 24. The implanted p-type impurity may be boron (B) or aluminum (Al), for example.

Figure 15:
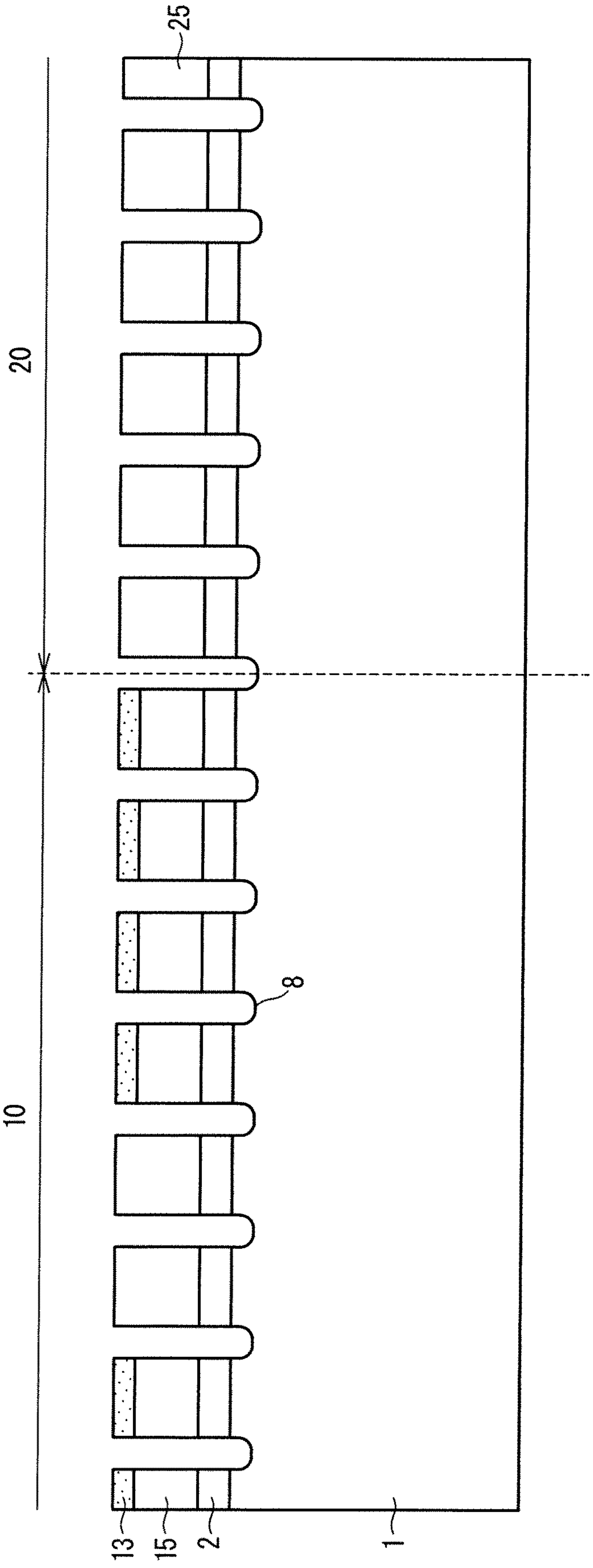

Next, as shown in FIG. 15, a trench 8 is formed that extends from the first main surface of the semiconductor substrate, penetrates the p-type base layer 15 and the p-type anode layer 25, and reaches the $n^-$-type drift layer 1. In the IGBT region 10, a side wall of the trench 8 penetrating the $n^+$-type source layer 13 forms a part of the $n^+$-type source layer 13. The trench 8 may be formed by depositing an oxide film such as an $SiO_2$ film on the semiconductor substrate, then performing a mask process to form an opening in the oxide film in a part where the trench 8 is to be formed, and etching the semiconductor substrate using the oxide film with the resultant opening as a mask. In FIG. 15, the trenches 8 in the IGBT region 10 and the trenches 8 in the diode region 20 are formed at the same pitch. Meanwhile, the trenches 8 may be formed at a pitch differing between the IGBT region 10 and the diode region 20. A pattern of the pitch of the trenches 8 in a plan view is properly changeable in response to a mask pattern for the mask process.

Figure 16:
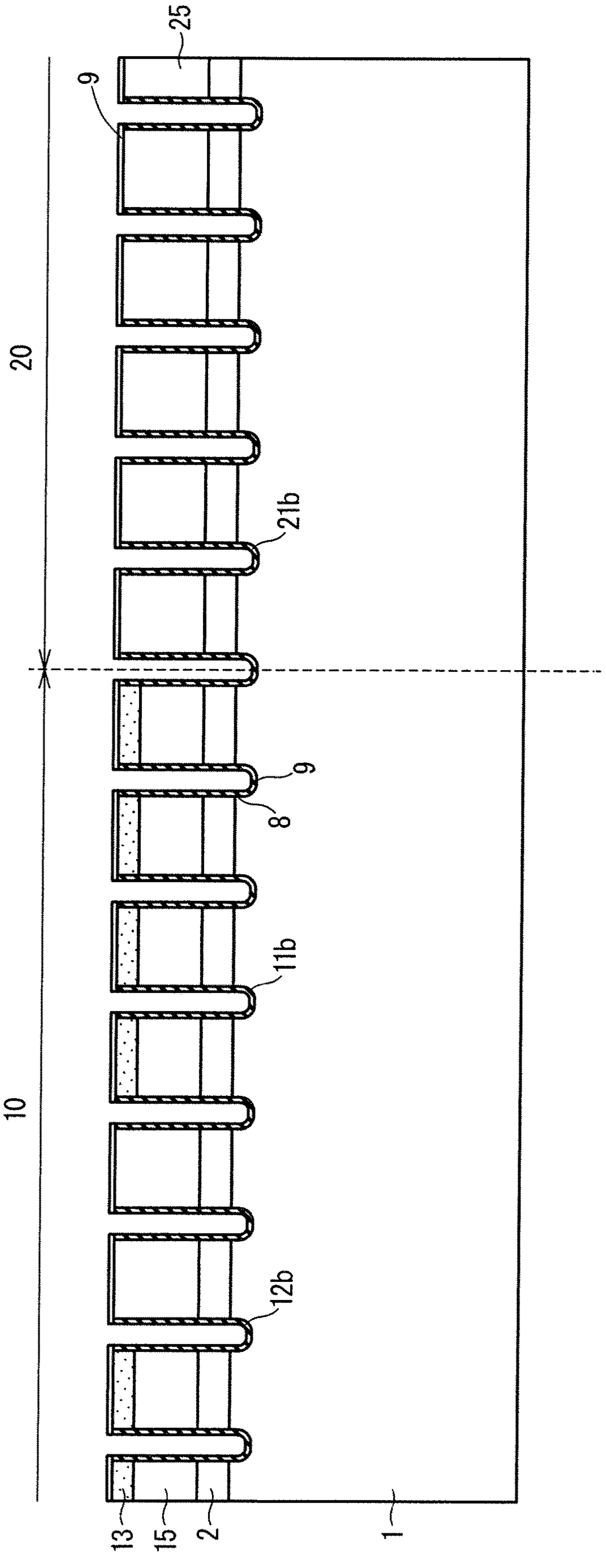

Next, as shown in FIG. 16, the semiconductor substrate is heated in an atmosphere containing oxygen to form an oxide film 9 on inner walls of the trenches 8 and on the first main surface of the semiconductor substrate. Of the oxide film 9 formed on the inner walls of the trenches 8, the oxide film 9 on the trenches 8 in the IGBT region forms the gate trench insulating film 11*b* of the active trench gate 11 and the dummy trench insulating film 12*b* of the dummy trench gate 12. The oxide film 9 on the trenches 8 in the diode region 20 forms the diode trench insulating film 21*b*. The oxide film 9 on the first main surface of the semiconductor substrate is removed by a subsequent step.

Figure 17:
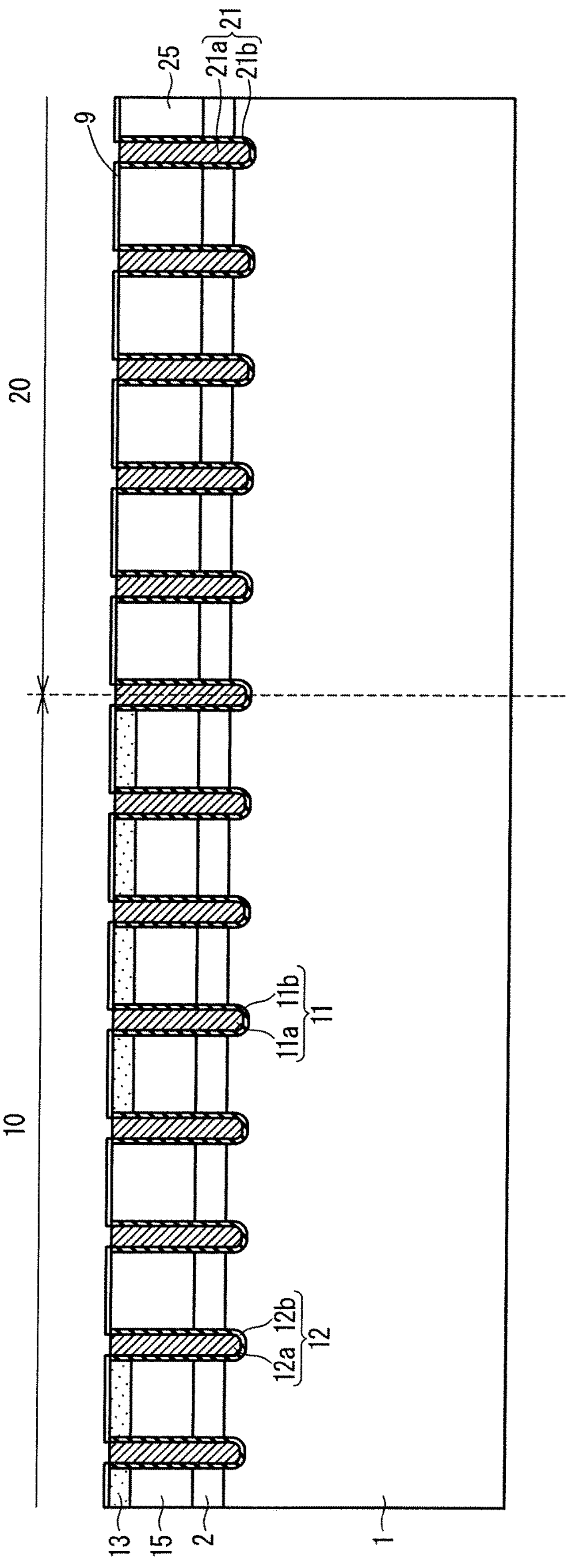

Next, as shown in FIG. 17, polysilicon doped with n-type or p-type impurity is deposited by chemical vapor deposition (CVD), for example, into the trenches 8 with the oxide film 9 formed their inner walls, thereby forming the gate trench electrode 11*a*, the dummy trench electrode 12*a*, and the diode trench electrode 21*a*.

Next, as shown in FIG. 18, the interlayer insulating film 4 is formed on the gate trench electrode 11*a* of the active trench gate 11 in the IGBT region 10. Then, the oxide film 9 formed on the first main surface of the semiconductor substrate is removed. The interlayer insulating film 4 may be made of $SiO_2$, for example. Next, contact holes are formed in the deposited interlayer insulating film 4 by a mask process. The contact holes are formed on the $n^+$-type source layer 13, on the $p^+$-type contact layer 14, on the $p^+$-type contact layer 24, on the dummy trench electrode 12*a*, and on the diode trench electrode 21*a*.

Next, as shown in FIG. 19, the barrier metal 5 is formed on the first main surface of the semiconductor substrate and on the interlayer insulating film 4. The emitter electrode 6 is further formed on the barrier metal 5. The barrier metal is formed by depositing titanium nitride by physical vapor deposition (PVD) or CVD.

The emitter electrode 6 may be formed by depositing an aluminum-silicon alloy (Al—Si-based alloy) on the barrier metal 5 by PVD such as sputtering or evaporation, for example. A nickel alloy (Ni alloy) may be provided further by electroless plating or electrolytic plating on the deposited aluminum-silicon alloy to form the emitter electrode 6. Using plating for the emitter electrode 6 makes it possible to form a thick metal film easily as the emitter electrode 6. This increases the heat capacity of the emitter electrode 6 to allow improvement of heat tolerance. If the nickel alloy is formed further by the plating process after formation of the emitter electrode 6 made of the aluminum-silicon alloy by the PVD, the plating process for forming the nickel alloy may be performed after implementation of process on the second main surface side of the semiconductor substrate.

Next, as shown in FIG. 20, the semiconductor substrate is polished on the second main surface side to thin the semiconductor substrate to a predetermined designed thickness. The thickness of the semiconductor substrate after the polishing may be from 80 to 200 μm, for example.

Next, as shown in FIG. 21, n-type impurity is implanted from the second main surface side of the semiconductor substrate to form the n-type buffer layer 3. Furthermore, p-type impurity is implanted from the second main surface side of the semiconductor substrate to form the p-type collector layer 16. The n-type buffer layer 3 may be formed in the IGBT region 10, the diode region 20, and the terminal region 30. In another case, the n-type buffer layer 3 may be formed only in the IGBT region 10 or the diode region 20.

The n-type buffer layer 3 may be formed by implanting ions of phosphorus (P), for example. Alternatively, the n-type buffer layer 3 may be formed by implanting ions of protons ($H^+$), for example. Still alternatively, the n-type buffer layer 3 may be formed by implanting both protons and phosphorus. Protons can be implanted from the second main surface of the semiconductor substrate into a deep position at relatively low acceleration energy. Changing the acceleration energy makes it possible to change a depth of implantation of protons relatively easily. Thus, in forming the n-type buffer layer 3 using protons, implanting protons several times while changing the acceleration energy makes it possible to form the n-type buffer layer 3 wider in a thickness direction of the semiconductor substrate than the n-type buffer layer 3 formed by using phosphorus.

Phosphorus as n-type impurity achieves a higher activation rate than protons. Thus, by using phosphorus for forming the n-type buffer layer 3, it is possible to prevent punch-through of a depletion layer more reliably even in the semiconductor substrate reduced in thickness. For reducing the thickness of the semiconductor substrate further, it is preferable that both protons and phosphorus be implanted for forming the n-type buffer layer 3. In this case, protons are implanted into a deeper position from the second main surface than phosphorus.

The p-type collector layer 16 may be formed by implanting boron (B), for example. The p-type collector layer 16 is further formed in the terminal region 30 and the p-type collector layer 16 in the terminal region 30 functions as the p-type terminal collector layer 16*a*. After the ion implantation from the second main surface side of the semiconductor substrate, laser annealing is performed by applying a laser beam to the second main surface. By doing so, the implanted boron is activated to form the p-type collector layer 16. During this time, the phosphorus for the n-type buffer layer 3 implanted from the second main surface of the semiconductor substrate into a relatively shallow position is also activated simultaneously. Meanwhile, protons are activated at a relatively low annealing temperature such as from 350 to 500° C. Hence, after implantation of the protons, care should be taken to ensure that a temperature at the semiconductor substrate as a whole does not exceed a temperature from 350 to 500° C. in a step other than a step for activation of the protons. Laser annealing allows temperature increase only in the vicinity of the second main surface. Thus, even after implantation of the protons, laser annealing is still applicable for activation of n-type impurity and p-type impurity.

Next, as shown in FIG. 22, the $n^+$-type cathode layer 26 is formed in the diode region 20. The $n^+$-type cathode layer 26 may be formed by implanting phosphorus (P), for example. As shown in FIG. 22, phosphorus is implanted selectively from the second main surface side through a mask process in such a manner that a boundary between the p-type collector layer 16 and the $n^+$-type cathode layer 26 is located at a position separated by the distance U1 toward the diode region 20 from a boundary between the IGBT region 10 and the diode region 20. The amount of implantation of the n-type impurity for forming the $n^+$-type cathode layer 26 is larger than the amount of implantation of the p-type impurity for forming the p-type collector layer 16. While a depth of the p-type collector layer 16 and a depth of the $n^+$-type cathode layer 26 from the second main surface are illustrated to be equal to each other in FIG. 22, the depth of the $n^+$-type cathode layer 26 is equal to or larger than the depth of the p-type collector layer 16. A region where the $n^+$-type cathode layer 26 is to be formed should be turned into n-type semiconductor by implanting the n-type impurity into the region containing the implanted p-type impurity. Thus, in the region entirely where the $n^+$-type cathode layer 26 is to be formed, the concentration of the implanted n-type impurity is set higher than the concentration of the p-type impurity.

Next, the collector electrode 7 is formed on the second main surface of the semiconductor substrate, thereby obtaining the sectional configuration shown in FIG. 9. The collector electrode 7 is formed over the second main surface covering the IGBT region 10, the diode region 20, and the terminal region 30 entirely. The collector electrode 7 may be formed over the whole area of the second main surface of the n-type wafer as the semiconductor substrate. The collector electrode 7 may be formed by depositing an aluminum-silicon alloy (Ai—Si-based alloy) or titanium (Ti) by PVD such as sputtering or evaporation, or may be formed by laminating a plurality of metals such as an aluminum-silicon alloy, titanium, nickel, or gold. In another case, a metal film may be provided further by electroless plating or electrolytic plating on a metal film formed by PVD to provide the collector electrode 7.

By following the steps described so far, the semiconductor device 100 or the semiconductor device 101 is manufactured. One n-type wafer is provided with a plurality of the semiconductor devices 100 or the semiconductor devices 101 arranged in a matrix. Thus, these semiconductor devices 100 or the semiconductor devices 101 are separated by laser dicing or blade dicing, thereby completing formation of the semiconductor device 100 or the semiconductor device 101.

First Preferred Embodiment

<Application to Stripe-Type Semiconductor Device>

Figure 23:
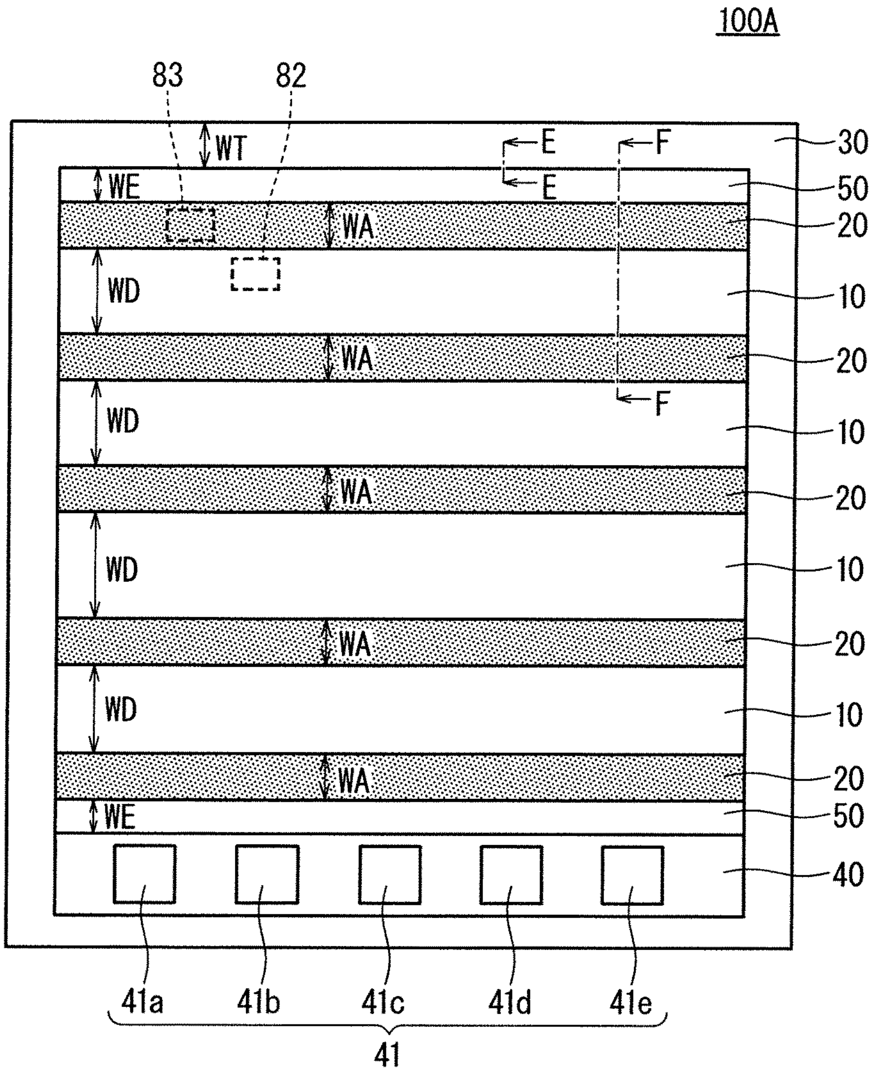
FIG. 23 is a plan view showing an overall configuration of an RC-IGBT according to a first preferred embodiment.

The following describes a first preferred embodiment of the present disclosure. Application of the present disclosure to a stripe-type semiconductor device will be described first. FIG. 23 is a plan view showing an overall configuration of an RC-IGBT 100A of the first preferred embodiment determined by applying the present disclosure to a stripe-type semiconductor device. As shown in FIG. 23, like the semiconductor device 100 shown in FIG. 1, the RC-IGBT 100A includes an IGBT region 10 (first transistor region) and a diode region 20 having stripe shapes in a plan view and arranged alternately. A structure same as that of the semiconductor device 100 shown in FIG. 1 is given the same sign and description overlapping between these structures will be omitted.

The RC-IGBT 100A includes an IGBT region 50 (second transistor region) provided external to the arrangement of the IGBT region 10 and the diode region 20. The IGBT region 10, the diode region 20, and the IGBT region 50 are called a cell region collectively. A terminal region 30 for retaining the breakdown voltage of the RC-IGBT 100A is provided around a region covering the cell region and the pad region 40. A well-known breakdown voltage retaining structure suitably selected is applicable in the terminal region 30.

In the configuration shown in FIG. 23, four IGBT regions 10, five diode regions 20, and two IGBT regions 50 are provided and each IGBT region 10 is sandwiched between the diode regions 20. As long as the IGBT region 50 is provided external to the arrangement of the IGBT region 10 and the diode region 20, however, the number of the IGBT regions 10 and that of the diode regions 20 are not limited to these.

An enlarged view of a region 82 surrounded by dashed lines in the IGBT region 10 in FIG. 23 is the same as FIG. 3. A sectional view taken in the arrow direction along the dashed line A-A indicated in FIG. 3 is the same as FIG. 4. A sectional view taken in the arrow direction along the dashed line B-B indicated in FIG. 3 is the same as FIG. 5.

An enlarged view of a region 83 surrounded by dashed lines in the diode region 20 in FIG. 23 is the same as FIG. 6. A sectional view taken in the arrow direction along the dashed line C-C indicated in FIG. 6 is the same as FIG. 7. A sectional view taken in the arrow direction along the dashed line D-D indicated in FIG. 6 is the same as FIG. 8. Furthermore, a sectional view taken in an arrow direction along a dashed line E-E in the terminal region 30 shown in FIG. 23 is the same as FIG. 10.

Figure 24:
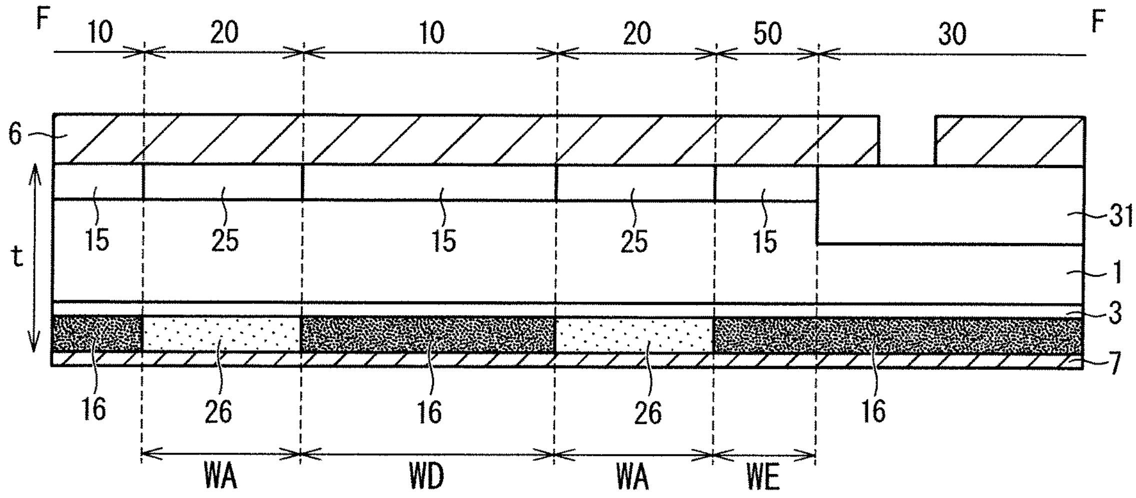
FIG. 24 is a partial sectional view showing the configuration of the RC-IGBT according to the first preferred embodiment.

FIG. 24 is a sectional view taken in an arrow direction along a dashed line F-F in FIG. 23. FIG. 24 schematically shows the sectional configurations of the IGBT region 10, the diode region 20, the IGBT region 50, and the terminal region 30 while illustrations of a trench gate, an interlayer insulating film, etc. are omitted. A structure same as that shown in the sectional views in FIGS. 4 to 9 is given the same sign and description overlapping between these structures will be omitted.

In FIG. 23, the widths of the IGBT region 10, the diode region 20, the IGBT region 50, and the terminal region 30 in the arrangement direction are indicated by a width WD, a width WA, a width WE, and a width WT respectively.

The width WD of the IGBT region 10 can be an entirely uniform width. By doing so, with respect to a current flowing in the IGBT region 10, it is possible to make a ratio of a unipolar current generated at a boundary area between the IGBT region 10 and the diode region 20 uniform in each IGBT region 10. This facilitates prevention of increase in a collector-to-emitter saturation voltage (VCEsat) and prevention of a snapback phenomenon.

The width WA of the diode region 20 can be an entirely uniform width. By doing so, with respect to a current flowing in the diode region 20, it is possible to make a ratio of a unipolar current generated at the boundary area between the IGBT region 10 and the diode region 20 and generated at a boundary area between the IGBT region 50 and the diode region 20 uniform in each diode region 20. This facilitates prevention of increase in forward voltage drop (VF) and prevention of a snapback phenomenon.

By setting the uniform width WD for the IGBT region 10 and setting the uniform width WA for the diode region 20, it becomes possible to maximize the number of divisions in the arrangement for the purpose of achieving much effect of heat dispersion while maintaining the width of the IGBT region 10 in the arrangement direction for the purpose of preventing a snapback phenomenon and increase in an ON resistance.

The width WE of the IGBT region 50 can be an entirely uniform width. The width WE of the IGBT region 50 can be smaller than the width WD of the IGBT region 10.

Desirably, a ratio WE/WD between the width WE of the IGBT region 50 and the width WD of the IGBT region 10 is equal to or less than 0.5.

Figure 25:
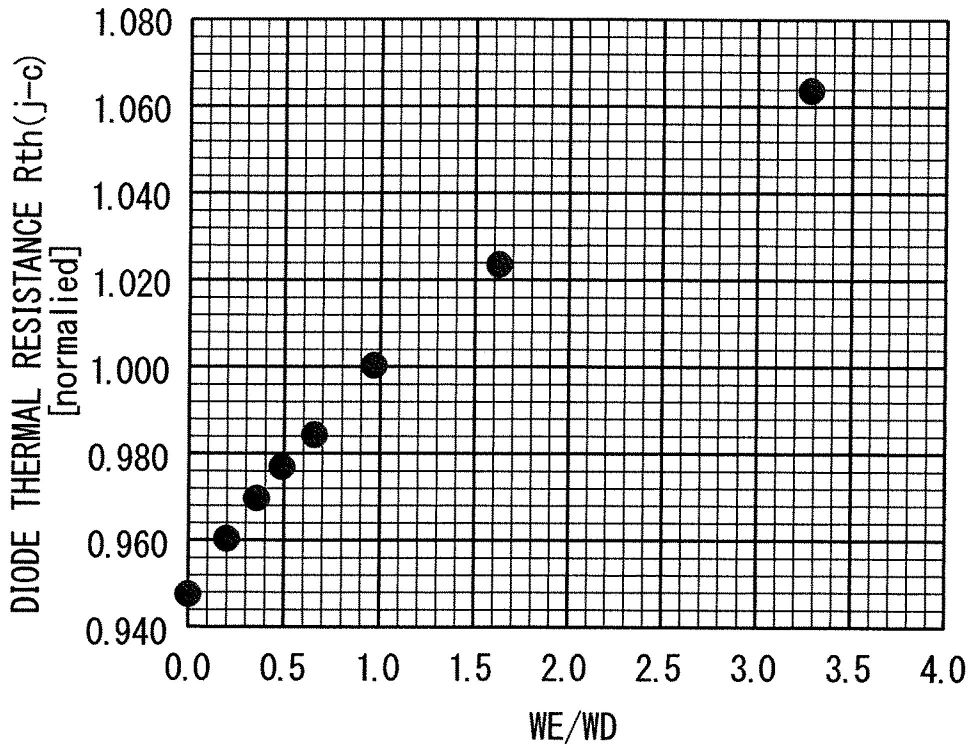
FIGS. 25 and 26 show respective results of simulation conducted by changing a ratio between the widths of IGBT regions in the RC-IGBT according to the first preferred embodiment.
Figure 26:
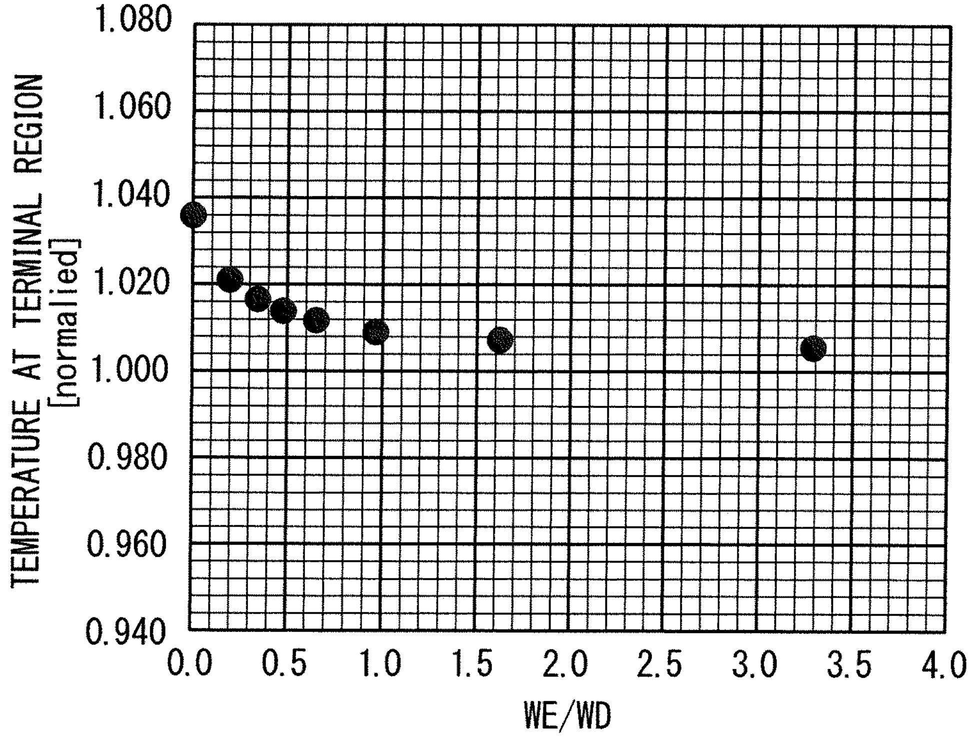

FIGS. 25 and 26 show respective results of simulation conducted by changing the ratio WE/WD between the width WE of the IGBT region 50 and the width WD of the IGBT region 10 in the RC-IGBT 100A.

FIG. 25 shows a relationship of the ratio WE/WD between the width WE of the IGBT region 50 and the width WD of the IGBT region 10 with a diode thermal resistance Rth (j-c). In FIG. 25, a horizontal axis shows WE/WD and a vertical axis shows the diode thermal resistance Rth (j-c) as normalized. The diode thermal resistance Rth (j-c) is also called a junction-to-case thermal resistance between a junction of a diode and a case housing the diode.

FIG. 26 shows a relationship of the ratio WE/WD with a temperature in the terminal region. In FIG. 26, a horizontal axis shows WE/WD and a vertical axis shows a temperature as normalized in the terminal region.

As understood from FIG. 25, the effect of reducing the diode thermal resistance Rth (j-c) is achieved with reduction in the ratio WE/WD. The reason for this is that increasing the width WD of the IGBT region 10 allows heat generated in the neighboring diode region 20 to be dispersed to a greater amount into the IGBT region 10.

As understood from FIG. 26, heat of a larger amount is generated in the terminal region 30 during diode operation with reduction in the ratio WE/WD. The reason for this is that, with reduction in the width WE of the IGBT region 50, heat generated in the diode region 20 can be dispersed into the terminal region 30 through the IGBT region 50 having the width WE.

The terminal region 30 itself is a region not contributing to electrical operation of the RC-IGBT 100A and not generating heat. However, with reduction in the width WE of the IGBT region 50, the terminal region 30 contributes to dispersion of heat generated in the diode region 20. As understood from FIGS. 25 and 26, this effect becomes larger at the ratio WE/WD of equal to or less than 0.5.

Unlike the IGBT region 10 sandwiched between the diode regions 20, the IGBT region 50 adjoins the diode region 20 through a boundary defined only in one direction. Thus, even with reduction in the width WE of the IGBT region 50, a unipolar current to flow into the IGBT region 50 is small, thereby achieving the effect of using the terminal region 30 for temperature dispersion while preventing increase in the saturation voltage (VCEsat) and preventing a snapback phenomenon.

Furthermore, a sum (S1) of the areas of the diode regions 20 is desirably less than a sum (S2) of the areas of the IGBT regions 10 and the areas of the IGBT regions 50. Setting the small sum (S1) of the areas of the diode regions 20 increases a thermal resistance in the diode. This enhances the effect of making the terminal region 30 available for temperature dispersion. As an example, a ratio between the sum (S1) of the areas of the diode regions 20 and the sum (S2) of the areas of the IGBT regions 50 (S1/S2) is ⅔. This ratio is designed optimally according to loss performance responsive to a purpose of use of an RC-IGBT chip. If the RC-IGBT chip is to be used as a switching device, the sum (S1) of the areas of the diode regions is designed to be low.

As understood from FIGS. 25 and 26, it can be said that setting the ratio WE/WD equal to or less than 0.5 is desirable. Meanwhile, a lower limit of the width WE of the IGBT region 50 is set to a thickness t of the $n^-$-type drift layer 1 composed of the semiconductor substrate (FIG. 24). Reducing the width WE of the IGBT region 50, namely, reducing an interval between the diode region 20 and the terminal region 30 causes the p-type terminal well layer 31 in the terminal region 30 and the $n^+$-type cathode layer 26 in the diode region 20 to operate as a diode to increase a recovery current and recovery loss. In order to prevent these increases, the IGBT region 50 having a width substantially equal to the thickness of the $n^-$-type drift layer 1 is provided.

It is assumed, for example, that an angle of carrier dispersion to a right-left direction in the plane of paper is 45° during conduction through the $n^-$-type drift layer 1 in the thickness direction thereof. In this case, with respect to the thickness t of the $n^-$-type drift layer 1 (FIG. 24), setting an interval between the diode region 20 and the terminal region 30 equal to or greater than the thickness t makes it possible to prevent increase in a recovery current and increase in recovery loss. Furthermore, setting the ratio WE/WD equal to or greater than 0.5 achieves further effect of making the terminal region 30 available for temperature dispersion.

The foregoing description is summarized as follows. By setting the width WE of the IGBT region 50 in such a manner as to satisfy $0.5\times WD \geq WE \geq t$, it becomes possible to prevent increase in a recovery current and increase in recovery loss in the diode and to make the terminal region 30 available for temperature dispersion.

<Application to Island-Type Semiconductor Device>

Figure 27:
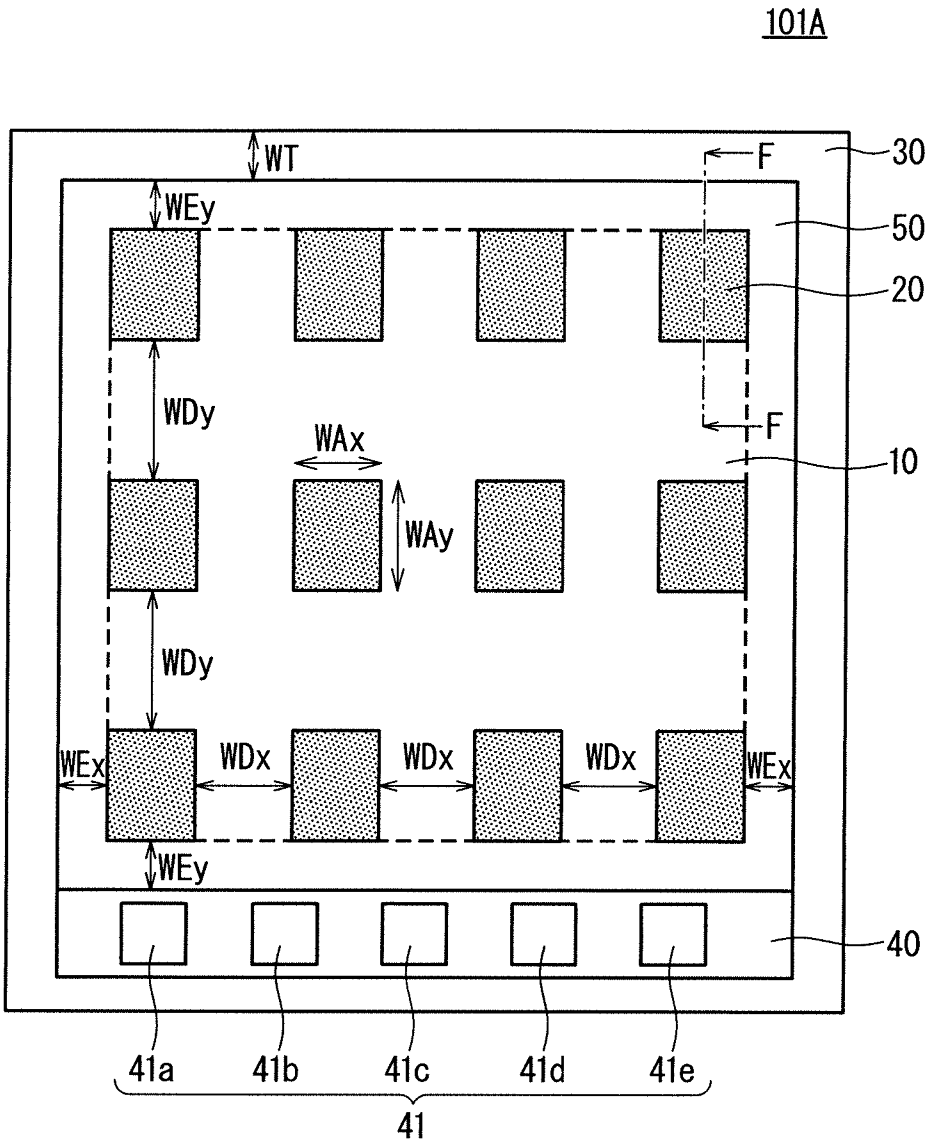
FIG. 27 is a plan view showing an overall configuration of an RC-IGBT according to the first preferred embodiment.

The following describes application of the present disclosure to an island-type semiconductor device. FIG. 27 is a plan view showing an overall configuration of an RC-IGBT 101A of the first preferred embodiment determined by applying the present disclosure to an island-type semiconductor device. As shown in FIG. 27, like the semiconductor device 101 shown in FIG. 2, the RC-IGBT 101A includes a plurality of diode regions 20 having island shapes in a plan view and arranged in each of a vertical direction and a horizontal direction, an IGBT region 10 is arranged between the diode regions 20, and the diode regions 20 are surrounded by the IGBT region 10. A structure same as that of the semiconductor device 101 shown in FIG. 2 is given the same sign and description overlapping between these structures will be omitted.

In the RC-IGBT 101A, an IGBT region 50 is provided in such a manner as to surround a region where the IGBT region 10 and the diode region 20 are arranged. The IGBT region 10, the diode region 20, and the IGBT region 50 are called a cell region collectively. A terminal region 30 for retaining the breakdown voltage of the RC-IGBT 101A is provided around a region covering the cell region and the pad region 40. A well-known breakdown voltage retaining structure suitably selected is applicable in the terminal region 30.

In the configuration shown in FIG. 27, the diode regions 20 are arranged in a matrix with four columns arranged in a right-left direction of the plane of paper and three rows arranged in a top-bottom direction of the plane of paper. As long as the IGBT region 50 is provided in such a manner as to surround the region where the IGBT region 10 and the diode region 20 are arranged, the number of the diode regions 20 and the arrangement thereof are not limited to these.

A width WDx of the IGBT region 10 between the diode regions 20 arranged in the right-left direction of the plane of paper can be an entirely uniform width. A width WDy of the IGBT region 10 between the diode regions 20 arranged in the top-bottom direction of the plane of paper can be an entirely uniform width. Meanwhile, the width WDx and the width WDy are not required to be equal to each other.

The diode region 20 has a width WAx in the right-left direction of the plane of paper and the width WAx can be an entirely uniform width. The diode region 20 has a width WAy in the top-bottom direction of the plane of paper and the width WAy can be an entirely uniform width. Meanwhile, the width WAx and the width WAy are not required to be equal to each other.

The IGBT region 50 has a width WEx in the right-left direction of the plane of paper and the width WEx can be an entirely uniform width. The IGBT region 50 has a width WEy in the top-bottom direction of the plane of paper and the width WEy can be an entirely uniform width. Meanwhile, the width WEx and the width WEy are not required to be equal to each other.

The width WEx and the width WEy of the IGBT region 50 can be smaller than the width WDx and the width WDy of the IGBT region 10 at least in one of the right-left direction of the plane of paper and the top-bottom direction of the plane of paper.

A ratio WEx/WDx between the width WEx of the IGBT region 50 and the width WDx of the IGBT region 10, and a ratio WEy/WDy between the width WEy of the IGBT region 50 and the width WDy of the IGBT region 10, are both desirably equal to or less than 0.5.

Furthermore, a sum (S1) of the areas of the diode regions 20 is desirably less than a sum (S2) of the area of the IGBT region 10 and the area of the IGBT region 50.

The width WEx and the width WEy of the IGBT region 50 are desirably equal to or greater than a thickness t of the $n^-$-type drift layer 1 composed of the semiconductor substrate (FIG. 24). Furthermore, the ratio WEx/WDx and the ratio WEy/WDy can also be set equal to or greater than 0.5.

The foregoing description is summarized as follows. By setting the width WEx and the width WEy of the IGBT region 50 in such a manner as to satisfy $0.5\times WDx \geq WEx \geq t$ and $0.5\times WDy \geq WEy \geq t$, it becomes possible to prevent increase in a recovery current and increase in recovery loss in the diode and to make the terminal region 30 available for temperature dispersion.

While the diode region 20 is illustrated as a square shape in a plan view in FIG. 27, the diode region 20 can also be a circle or a polygon such as a hexagon. The arrangement of the diode regions 20 is not limited to a matrix but the diode regions 20 can be arranged in a staggered type, for example. Applying the present disclosure to an island-type semiconductor device makes it possible to increase variations of the shape of the diode region 20.

Second Preferred Embodiment

Figure 28:
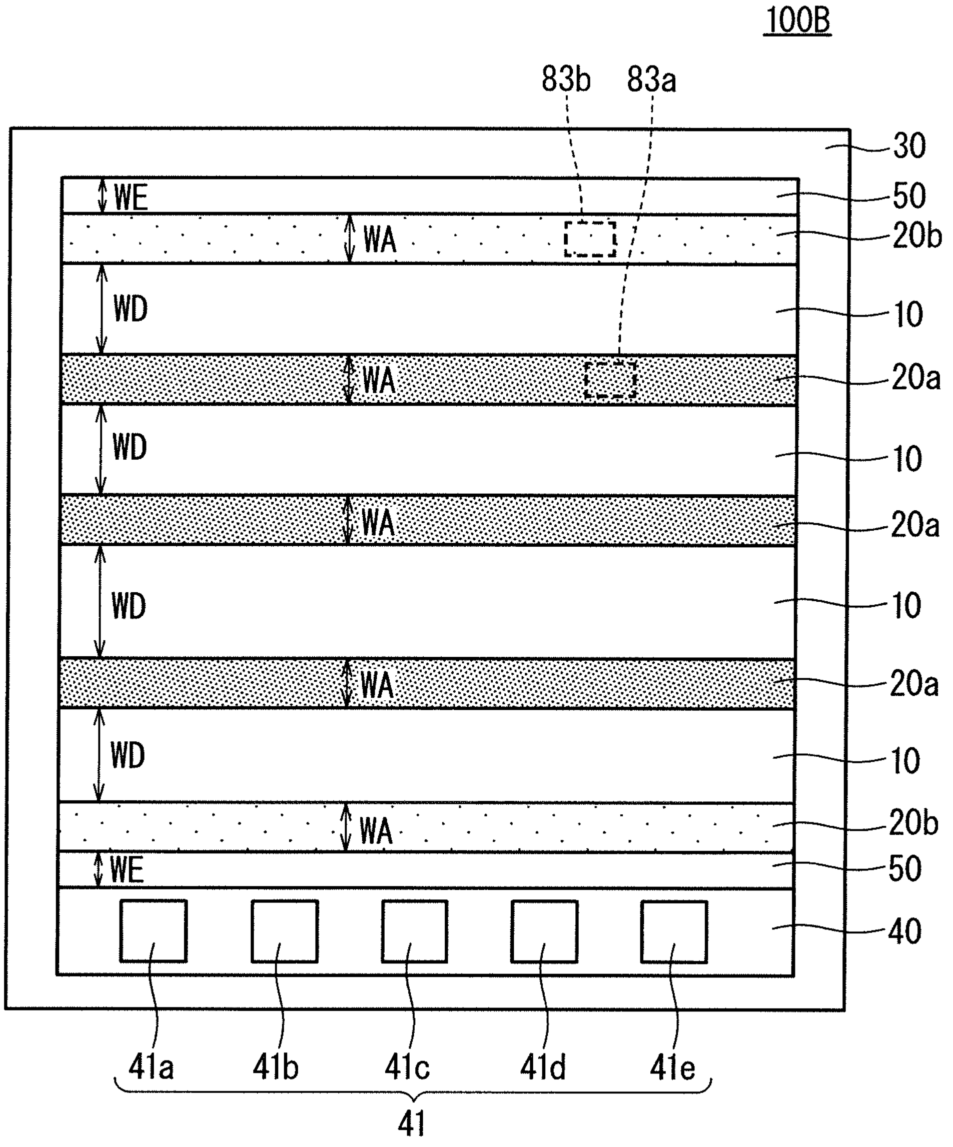
FIGS. 28 to 32 are plan views showing overall configurations of respective RC-IGBTs according to a second preferred embodiment.

The following describes a second preferred embodiment of the present disclosure. FIG. 28 is a plan view showing the configuration of an RC-IGBT 100B of the second preferred embodiment determined by applying the present disclosure to a stripe-type semiconductor device. The RC-IGBT 100B shown in FIG. 28 differs from the RC-IGBT 100A shown in FIG. 23 in that the RC-IGBT 100B includes a diode region 20*a* (first diode region) and a diode region 20*b* (second diode region) both having stripe shapes. Three diode regions 20*a* are arranged alternately with the IGBT regions 10 in a central area of a chip, and the diode region 20*b* is arranged on each of both external sides of the arrangement of the diode regions 20*a* with the IGBT region 10 provided between the diode region 20*b* and the diode region 20*a*.

In addition to the IGBT region 50 provided external to the arrangement of the IGBT region 10 and the diode regions 20*a* and 20*b*, a structure same as that of the RC-IGBT 100A shown in FIG. 23 is given the same sign and description overlapping between these structures will be omitted.

The diode region 20*b* is characterized in that forward voltage drop (VF) therein is lower than that in the diode region 20*a*. This achieves the following effect. As the diode region 20*a* and the diode region 20*b* perform electrical operations in parallel, a large amount of current flows in the diode region 20*b* according to Kirchhoff's law where forward voltage drop (VF) is low, namely, where a resistance is low. This makes it possible to disperse a larger amount of heat generated during the diode operation into the terminal region 30 through the IGBT region 50 next to the diode region 20*b*, thereby improving temperature uniformity over the chip as a whole.

Figure 29:
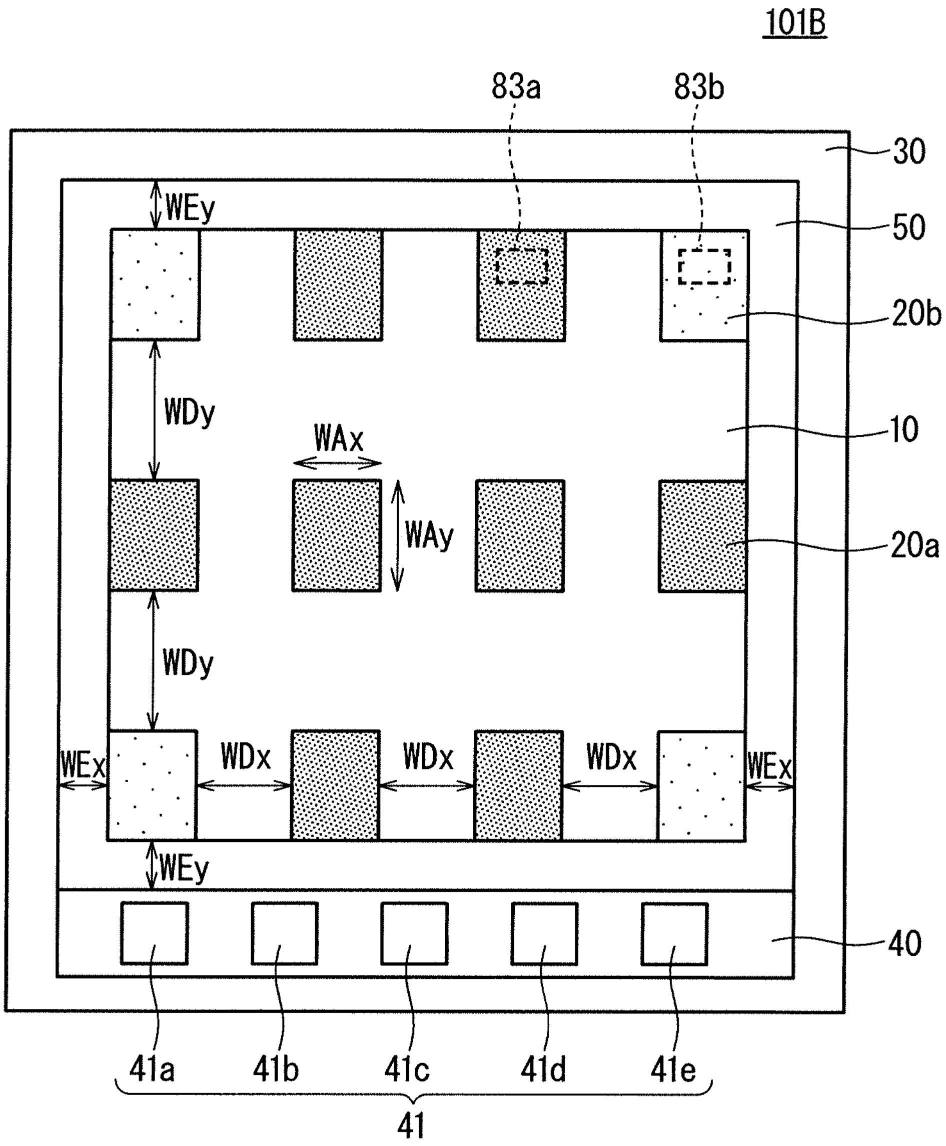

FIG. 29 is a plan view showing the configuration of an RC-IGBT 101B of the second preferred embodiment determined by applying the present disclosure to an island-type semiconductor device. The RC-IGBT 101B shown in FIG. 29 differs from the RC-IGBT 101A shown in FIG. 27 in that the RC-IGBT 101B includes a diode region 20*a* and a diode region 20*b* both having island shapes. A plurality of the diode regions 20*a* and a plurality of the diode regions 20*b* are juxtaposed in each of a vertical direction and a horizontal direction in a chip, and are arranged together in a matrix with four columns arranged in a right-left direction of the plane of paper and three rows arranged in a top-bottom direction of the plane of paper. Of these diode regions, four diode regions 20*b* are arranged at corresponding four corners most distanced from a central area of the chip, and eight diode regions 20*a* are arranged in regions other than the four corners.

In addition to the IGBT region 50 provided external to the arrangement of the IGBT region 10 and the diode regions 20*a* and 20*b*, a structure same as that of the RC-IGBT 101A shown in FIG. 27 is given the same sign and description overlapping between these structures will be omitted.

The diode region 20*b* is characterized in that forward voltage drop (VF) therein is lower than that in the diode region 20*a*. This achieves the following effect. As the diode region 20*a* and the diode region 20*b* perform electrical operations in parallel, a large amount of current flows in the diode region 20*b* according to Kirchhoff's law where forward voltage drop (VF) is low, namely, where a resistance is low. This makes it possible to disperse a larger amount of heat generated during the diode operation into the terminal region 30 through the IGBT region 50 next to the diode region 20*b*, thereby improving temperature uniformity over the chip as a whole.

Figure 30:
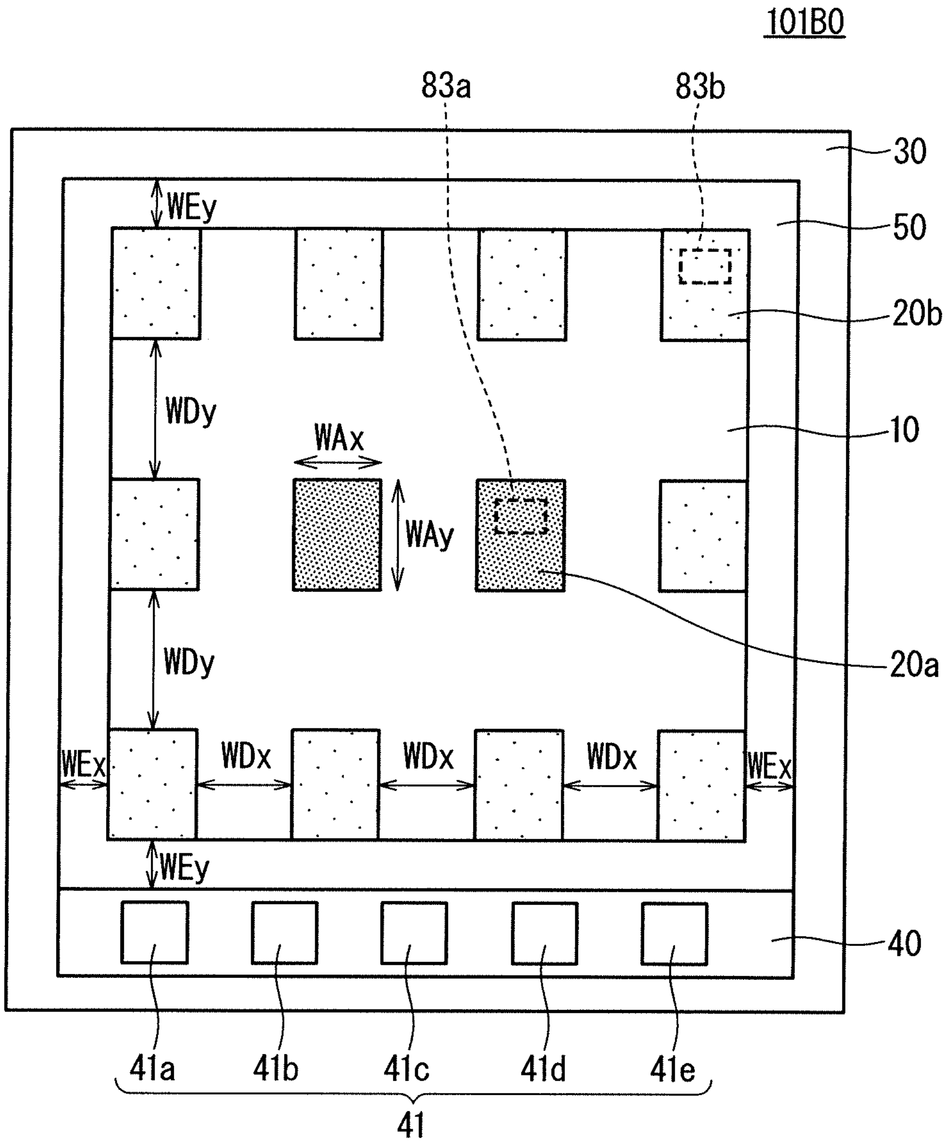

FIG. 30 shows another example of arrangement of the diode regions 20*a* and 20*b*. FIG. 30 is a plan view showing an RC-IGBT 101B0 including a larger number of the arranged diode regions 20*b* than the RC-IGBT 101B shown in FIG. 29. In the RC-IGBT 101B0 shown in FIG. 30, the diode regions 20*b* are arranged at positions next to the IGBT region 50 and are arranged along the IGBT region 50, and only two diode regions 20*a* are arranged in a central area of the matrix.

Arranging a plurality of the diode regions 20*b* at positions next to the IGBT region 50 and along the IGBT region 50 makes it possible to disperse a still larger amount of heat generated during diode operation into the terminal region 30 through the IGBT region 50 next to the diode regions 20*b*, thereby enhancing the effect of improving temperature uniformity over the chip as a whole.

Modifications

Figure 31:
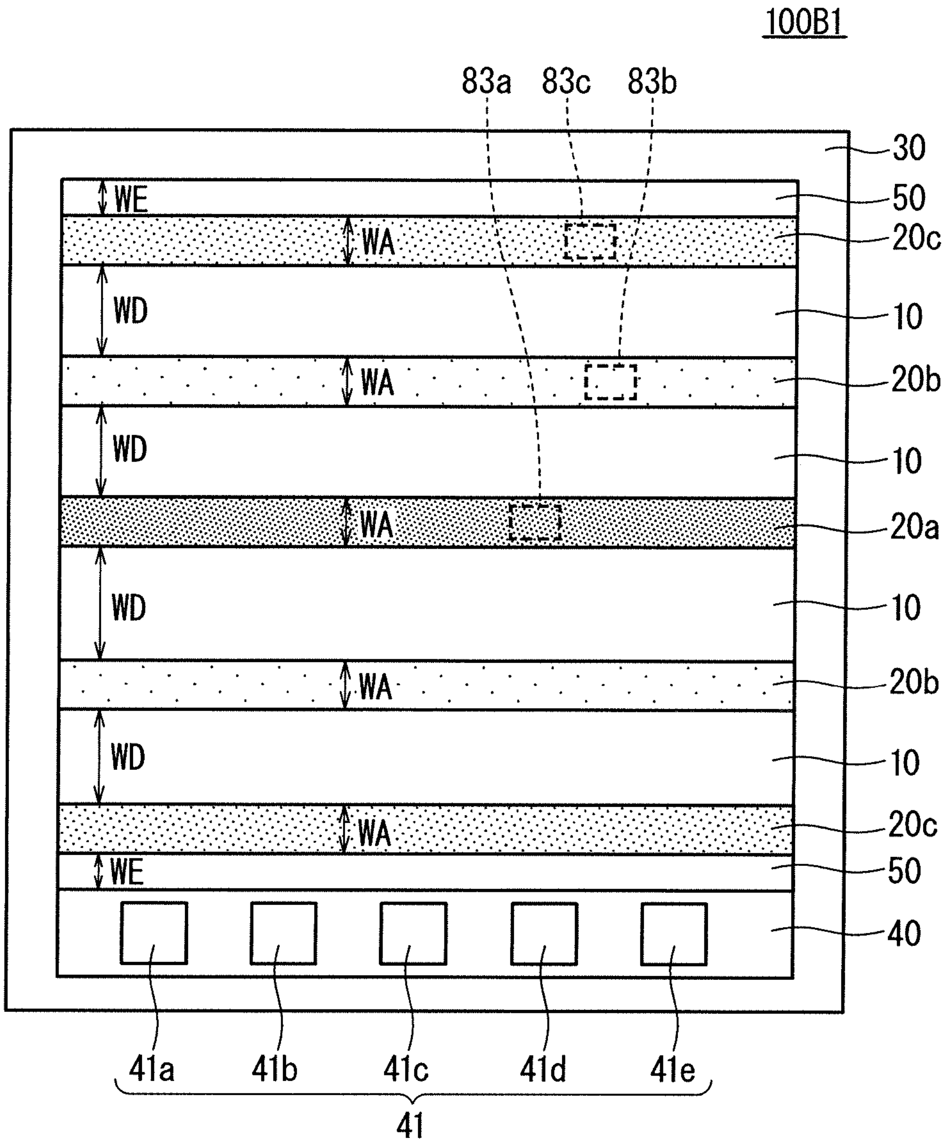

FIG. 31 is a plan view showing the configuration of an RC-IGBT 100B1 according to a modification of the second preferred embodiment determined by applying the present disclosure to a stripe-type semiconductor device. The RC-IGBT 100B1 shown in FIG. 31 differs from the RC-IGBT 100B shown in FIG. 28 in that the RC-IGBT 100B1 further includes a diode region 20*c* having a stripe shape. One diode region 20*a* is arranged in a central area of a chip, the diode region 20*b* is arranged on each of both sides of the diode region 20*a* with the IGBT region 10 provided between the diode region 20*b* and the diode region 20*a*, and the diode region 20*c* is arranged external to the diode region 20*b* with the IGBT region 10 provided between the diode region 20*c* and the diode region 20*b*.

In addition to the IGBT region 50 provided external to the arrangement of the IGBT region 10 and the diode regions 20*a*, 20*b*, and 20*c*, a structure same as that of the RC-IGBT 100A shown in FIG. 23 is given the same sign and description overlapping between these structures will be omitted.

The diode region 20*b* is characterized in that forward voltage drop (VF) therein is lower than that in the diode region 20*a*. The diode region 20*c* is characterized in that forward voltage drop (VF) therein is lower than that in the diode region 20*b*. The largest amount of current is to flow in the diode region 20*c* where forward voltage drop (VF) is the lowest, namely, where a resistance is the lowest. This makes it possible to disperse a larger amount of heat generated during diode operation into the terminal region 30 through the IGBT region 50 next to the diode region 20*c*, thereby improving temperature uniformity over the chip as a whole.

Figure 32:
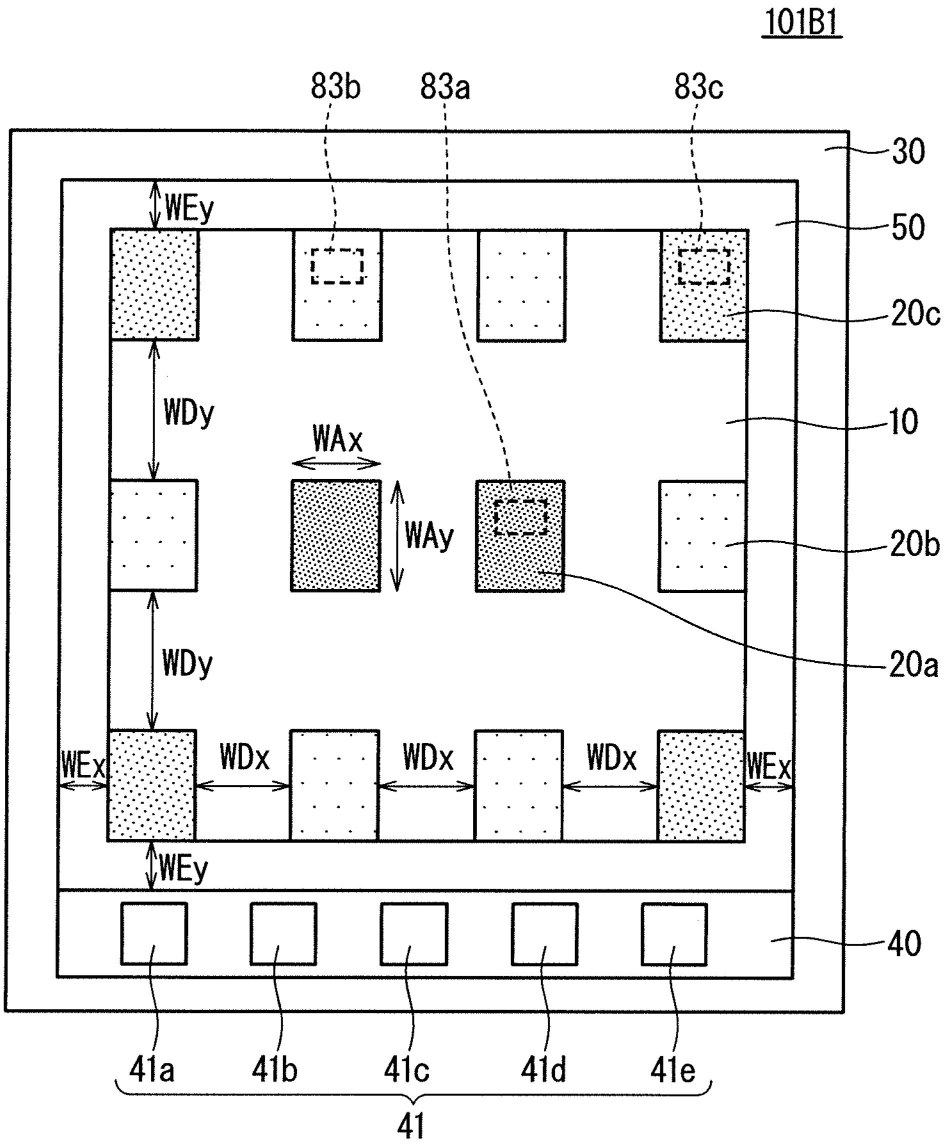

FIG. 32 is a plan view showing the configuration of an RC-IGBT 101B1 according to a modification of the second preferred embodiment determined by applying the present disclosure to an island-type semiconductor device. The RC-IGBT 101B1 shown in FIG. 32 differs from the RC-IGBT 101B shown in FIG. 29 in that the RC-IGBT 101B1 further includes a diode region 20*c* having an island shape. Only two diode regions 20*a* are arranged in a central area of a matrix, the four diode regions 20*c* are arranged at corresponding four corners most distanced from the central area of a chip, and six diode regions 20*b* are arranged at positions next to the IGBT region 50 other than the four corners.

In addition to the IGBT region 50 provided external to the arrangement of the IGBT region 10 and the diode regions 20*a*, 20*b*, and 20*c*, a structure same as that of the RC-IGBT 101A shown in FIG. 27 is given the same sign and description overlapping between these structures will be omitted.

The diode region 20*b* is characterized in that forward voltage drop (VF) therein is lower than that in the diode region 20*a*. The diode region 20*c* is characterized in that forward voltage drop (VF) therein is lower than that in the diode region 20*b*. The largest amount of current is to flow in the diode region 20*c* where forward voltage drop (VF) is the lowest, namely, where a resistance is the lowest, and a large amount of current is to flow in the diode region 20*b* of the second lowest resistance.

Arranging these diode regions 20*b* and 20*c* at positions next to the IGBT region 50 and along the IGBT region 50 makes it possible to disperse a larger amount of heat generated during diode operation into the terminal region 30 through the IGBT region 50 next to the diode region 20*c*, thereby improving temperature uniformity to a greater degree over the chip as a whole.

In the configuration of each of the RC-IGBT 100B1 in FIG. 31 and the RC-IGBT 101B1 in FIG. 32, the three types of diode regions are provided. However, types of diode regions are not limited to these. More types such as four types or five types may be prepared and forward voltage drop (VF) can be set lower with decreasing distance toward an external side of a chip.

<Configuration 1 for Reducing Forward Voltage Drop>

The following shows a configuration 1 for reducing forward voltage drop (VF) in the diode regions 20*b* and 20*c* of the above-described second preferred embodiment using FIGS. 33 to 36.

FIGS. 28 to 20 each show a region 83*a* and a region 83*b* surrounded by dashed lines in the diode regions 20*a* and 20*b* respectively. FIGS. 31 and 32 each show a region 83*a*, a region 83*b*, and a region 83*c* surrounded by dashed lines in the diode regions 20*a*, 20*b*, and 20*c* respectively. The following description proceeds by referring to enlarged views of these regions.

Forward voltage drop (VF) in the diode regions 20*b* and 20*c* can be reduced by changing the configurations of the regions 83*b* and 83*c* from the configuration of the region 83*a*.

Figure 33:
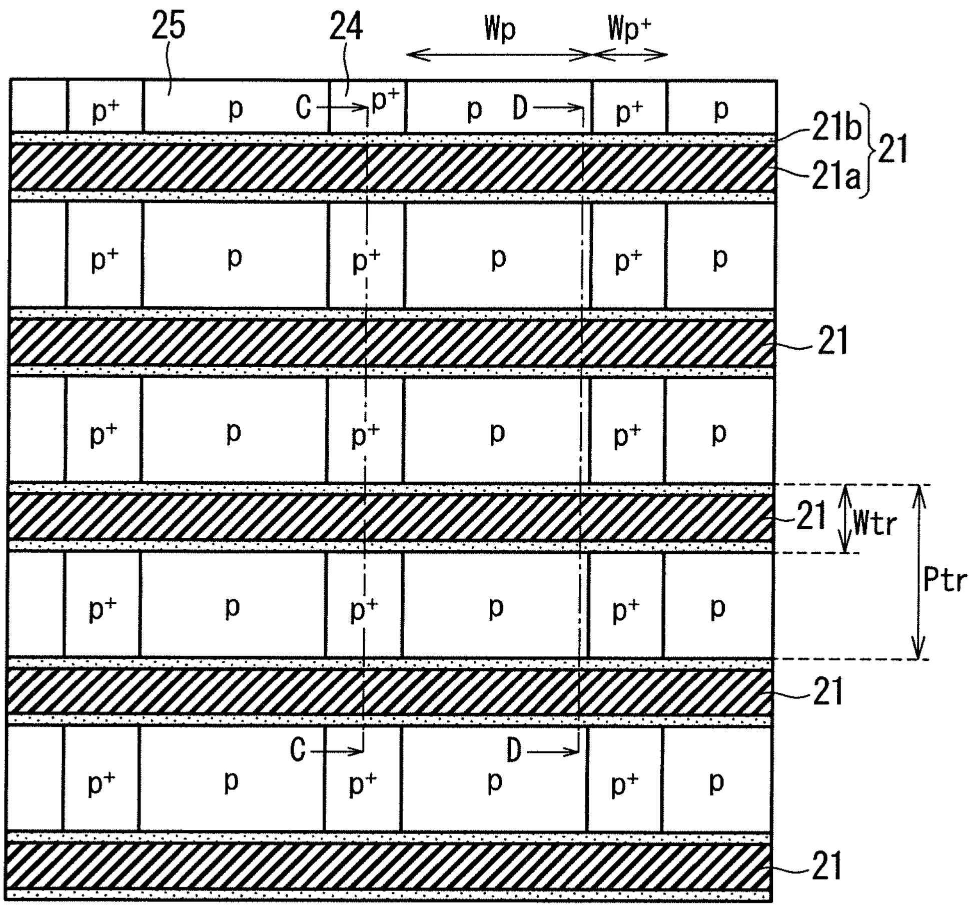
FIGS. 33 to 36 each show a configuration 1 for reducing forward voltage drop in a diode region in the RC-IGBT according to the second preferred embodiment.

FIG. 33 is an enlarged view of the region 83*a* surrounded by dashed lines in the diode region 20*a*. A diode trench gate 21 is formed by providing a diode trench electrode 21*a* through a diode trench insulating film 21*b* in a trench formed in a semiconductor substrate in the diode region 20. A $p^+$-type contact layer 24 and a p-type anode layer 25 are provided between two diode trench gates 21 next to each other. The $p^+$-type contact layer 24 is a semiconductor layer containing p-type impurity that is boron or aluminum, for example, and has a p-type impurity concentration from $1.0\times10^{15}$ to $1.0\times10^{20}/cm^3$. The p-type anode layer 25 is a semiconductor layer containing p-type impurity that is boron or aluminum, for example, and has a p-type impurity concentration from $1.0\times10^{12}$ to $1.0\times10^{19}/cm^3$. The $p^+$-type contact layer 24 and the p-type anode layer 25 are provided alternately in a lengthwise direction of the diode trench gate 21.

Figure 34:
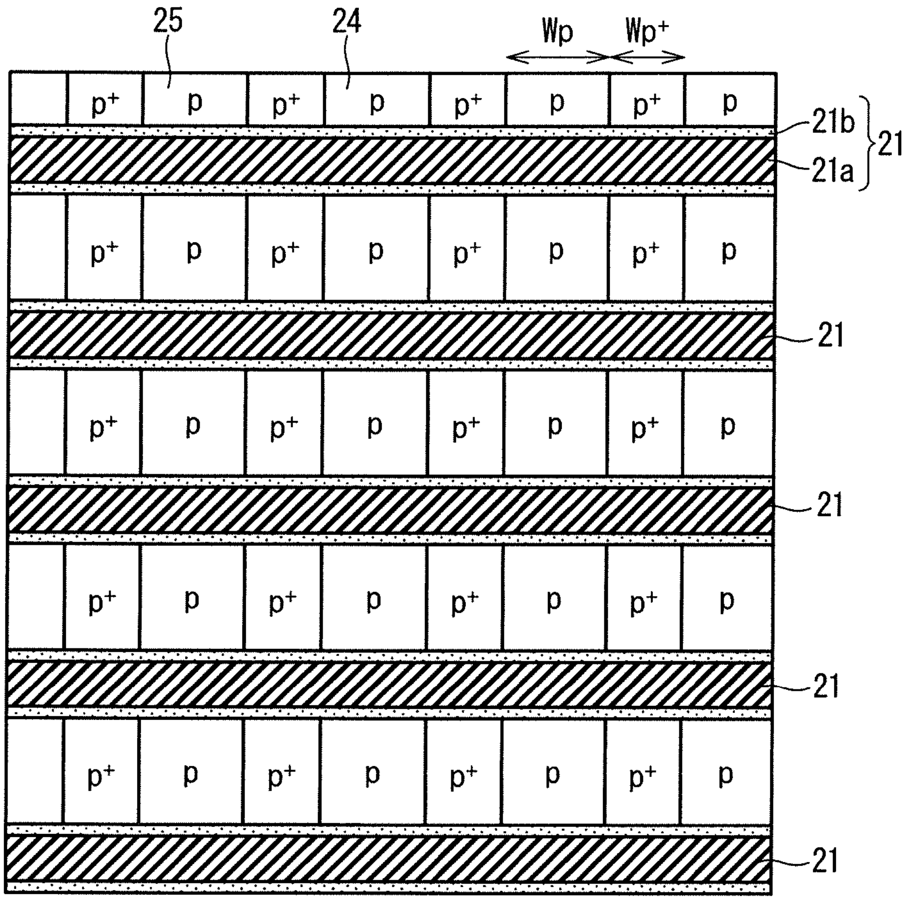
Figure 35:
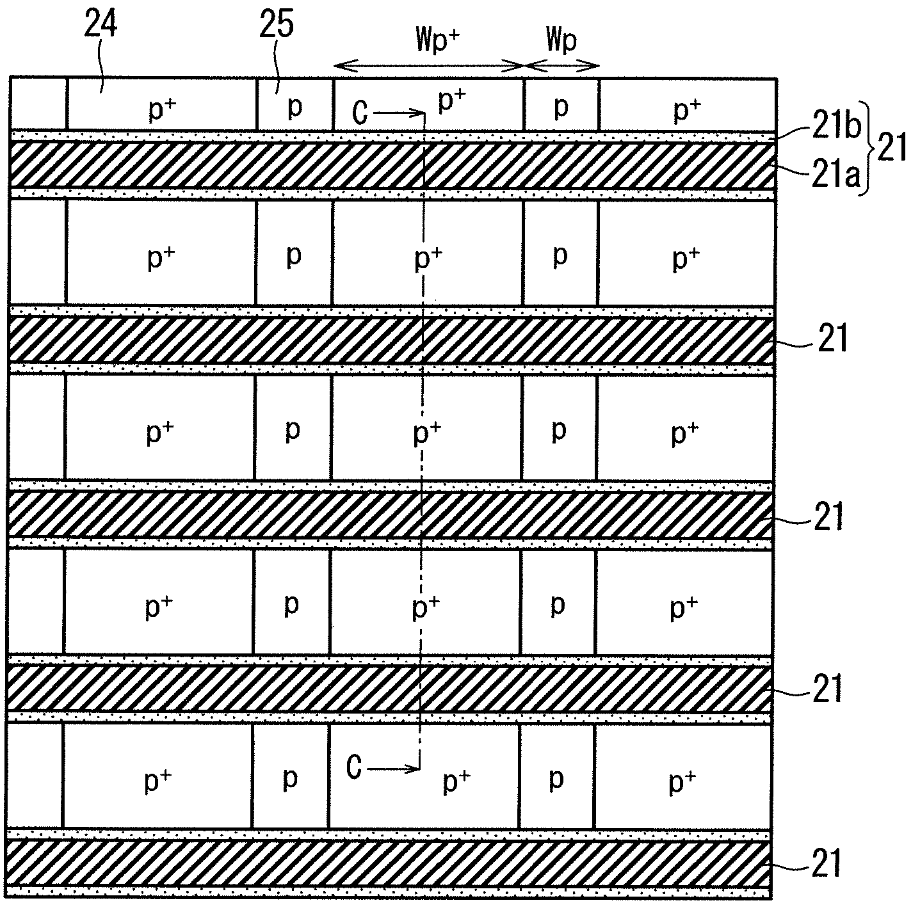
Figure 36:
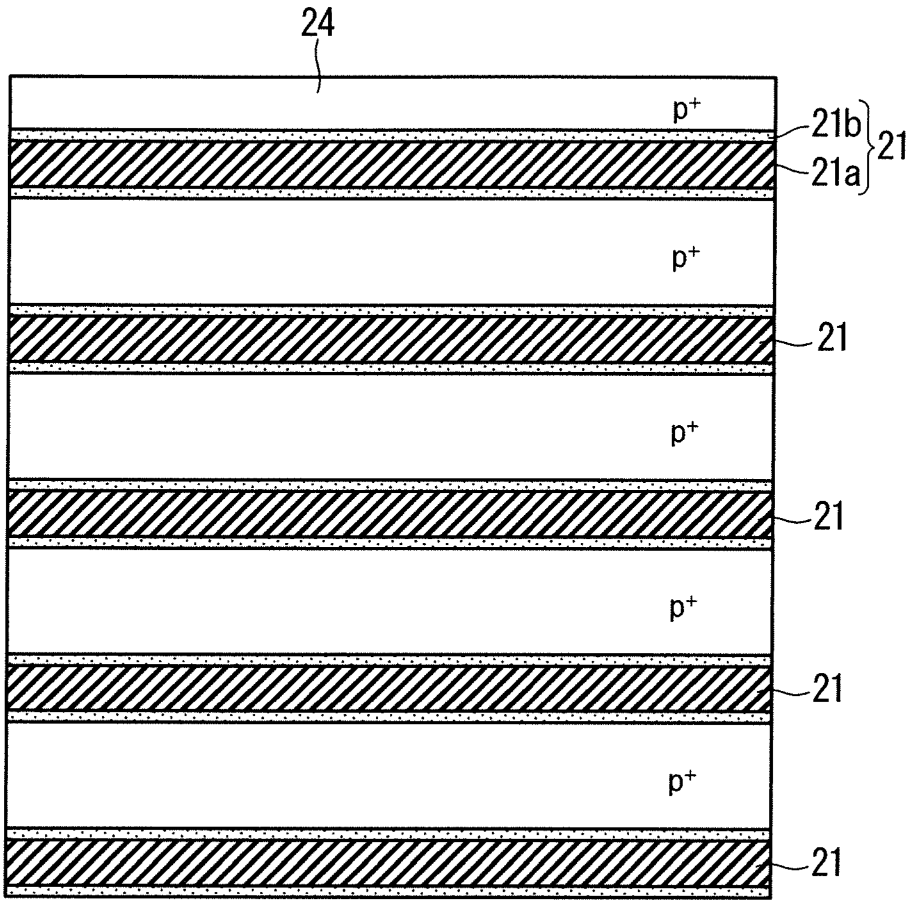

It is possible to reduce forward voltage drop (VF) by changing at least one of a width Wp of the p-type anode layer 25 and a width $Wp^+$ of the $p^+$-type contact layer 24 in FIG. 33. FIGS. 34 to 36 are plan views illustrating configurations determined by changing at least one of the width Wp of the p-type anode layer 25 and the width $Wp^+$ of the $p^+$-type contact layer 24. The configurations of the regions 83*b* and 83*c* are selectable from these illustrated configurations.

For example, in the configuration shown in FIG. 34, the number of the arranged $p^+$-type contact layers 24 is increased by reducing the width Wp of the p-type anode layer 25 compared to that of the p-type anode layer 25 in FIG. 33 while leaving the width $Wp^+$ of the $p^+$-type contact layer 24 unchanged.

In the configuration shown in FIG. 35, the width $Wp^+$ of the $p^+$-type contact layer 24 is increased compared to that of the $p^+$-type contact layer 24 in FIG. 33 and the width Wp of the p-type anode layer 25 is reduced.

In the configuration shown in FIG. 36, the $p^+$-type contact layer 24 is provided in the whole area between two diode trench gates 21 next to each other.

FIGS. 34 to 36 are characterized in that, in each of these drawings, the area of arrangement of the $p^+$-type contact layers 24 is larger than that of the arrangement of the $p^+$-type contact layers 24 in FIG. 33, and forward voltage drop (VF) is reduced by increasing the efficiency of injection of holes from the p-type anode layer 25.

With a sum of the width Wp of the p-type anode layer 25 and the width $Wp^+$ of the $p^+$-type contact layer 24 defined as a width Wpp, a range of the size of the width $Wp^+$ of the $p^+$-type contact layer 24 is from a lower limit at which $Wp^+/Wpp=0.05$, namely, at which a ratio of the width $Wp^+$ is 5% to an upper limit at which $Wp^+/Wpp=1.0$, namely, at which a ratio of the width $Wp^+$ is 100%.

<Configuration 2 for Reducing Forward Voltage Drop>

Figure 37:
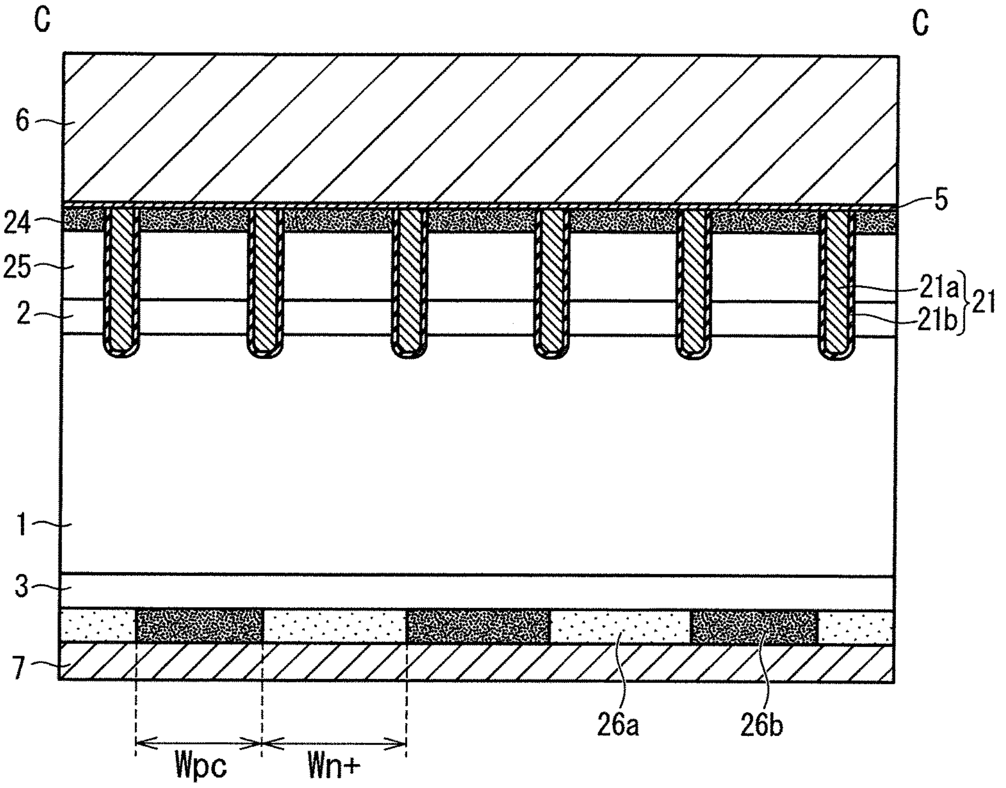
FIGS. 37 to 39 each show a configuration 2 for reducing forward voltage drop in the diode region in the RC-IGBT according to the second preferred embodiment.
Figure 38:
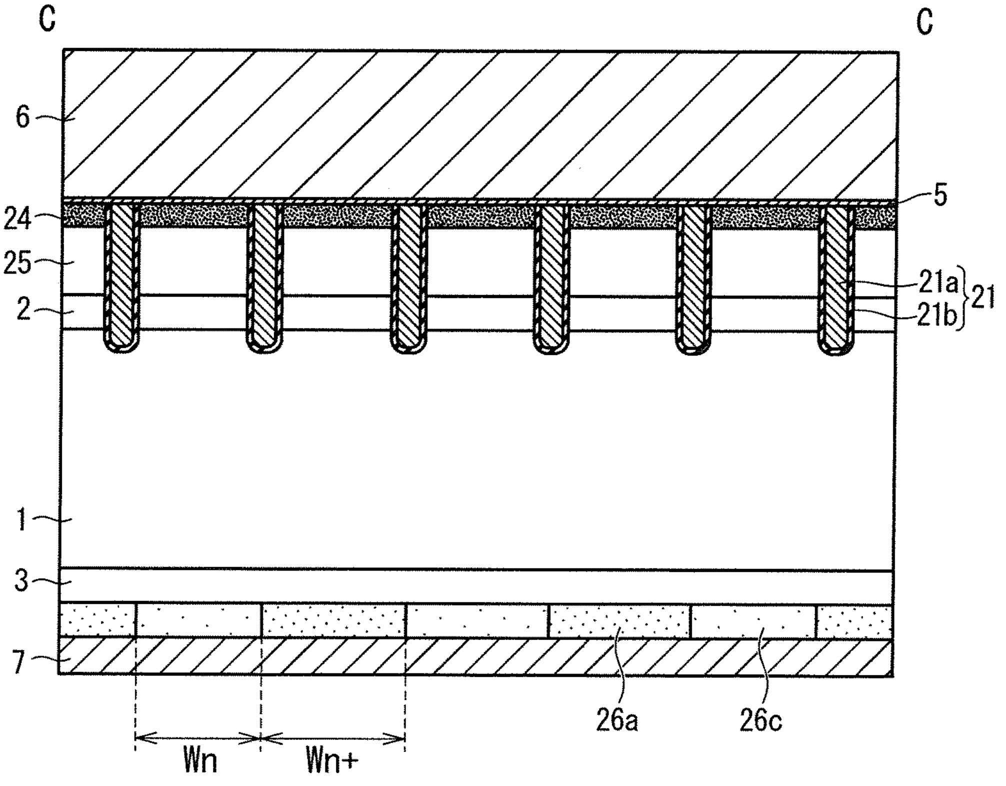
Figure 39:
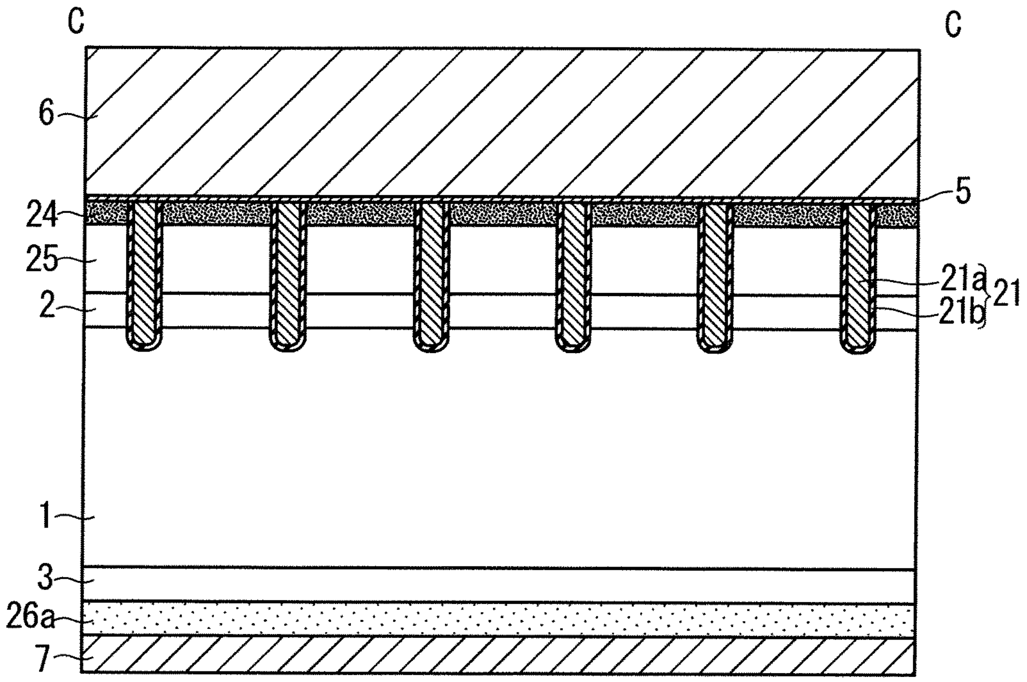

The following shows a configuration 2 for reducing forward voltage drop (VF) in the diode regions 20*b* and 20*c* of the second preferred embodiment using FIGS. 37 to 39. FIGS. 37 to 39 are sectional views each taken in an arrow direction along a dashed line C-C shown in FIG. 33. In FIGS. 37 to 39, a structure same as that of the semiconductor device 100 or the semiconductor device 101 shown in FIG. 7 is given the same sign and description overlapping between these structures will be omitted.

Forward voltage drop (VF) in the diode regions 20*b* and 20*c* can be reduced by changing the size of a cathode layer.

In a configuration employed in FIG. 37, an $n^+$-type cathode layer 26*a* and a p-type cathode layer 26*b* are provided as a cathode layer and arranged alternately along the second main surface of the semiconductor substrate to form the cathode layer of an RFC diode.

FIG. 37 shows a width $Wn^+$ of the $n^+$-type cathode layer 26*a* and a width Wpc of the p-type cathode layer 26*b*. Characteristically, the width $Wn^+$ of the $n^+$-type cathode layer 26*a* is larger than the width Wpc of the p-type cathode layer 26*b*. This increases the efficiency of injection of electrons from the $n^+$-type cathode layer 26*a* to allow reduction in forward voltage drop (VF). This further applies to a case where the width Wpc of the p-type cathode layer 26*b* is larger than the width $Wn^+$ of the $n^+$-type cathode layer 26*a*.

The width $Wn^+$ and the width Wpc are compared one-dimensionally in FIG. 37. Meanwhile, in terms of comparison between areas in a two dimension including a direction toward the back with respect to the plane of paper, setting the area of the $n^+$-type cathode layer 26*a* larger than the area of the p-type cathode layer 26*b* also achieves comparable effect.

In a configuration employed in FIG. 38, an $n^+$-type cathode layer 26*a* and an n-type cathode layer 26*c* are provided as a cathode layer and arranged alternately along the second main surface of the semiconductor substrate.

FIG. 38 shows a width $Wn^+$ of the $n^+$-type cathode layer 26*a* and a width Wn of the n-type cathode layer 26*c*. Characteristically, a carrier concentration is lower in the n-type cathode layer 26*c* than in the $n^+$-type cathode layer 26*a* and the width $Wn^+$ of the $n^+$-type cathode layer 26*a* is larger than the width Wn of the n-type cathode layer 26*c*. This increases the efficiency of injection of electrons from the $n^+$-type cathode layer 26*a* to allow reduction in forward voltage drop (VF). This further applies to a case where the width Wn of the n-type cathode layer 26*c* is larger than the width $Wn^+$ of the $n^+$-type cathode layer 26*a*.

The width $Wn^+$ and the width Wn are compared one-dimensionally in FIG. 38. Meanwhile, in terms of comparison between areas in a two dimension including a direction toward the back with respect to the plane of paper, setting the area of the $n^+$-type cathode layer 26*a* larger than the area of the n-type cathode layer 26*c* also achieves comparable effect.

FIG. 39 shows a case where a cathode layer is composed only of an $n^+$-type cathode layer 26*a*. Forward voltage drop (VF) is reduced further with increase in the area of arrangement of the $n^+$-type cathode layer 26*a*. Thus, a diode region having the cathode layer configuration in FIG. 39 is arranged as the diode region 20*b* or 20*c*, and a diode region having the cathode layer configuration in FIG. 37 or 38 is arranged as the diode region 20*a*.

<Configuration 3 for Reducing Forward Voltage Drop>

The following shows a configuration 3 for reducing forward voltage drop (VF) in the diode regions 20*b* and 20*c* of the second preferred embodiment using FIGS. 40 to 44.

Figure 40:
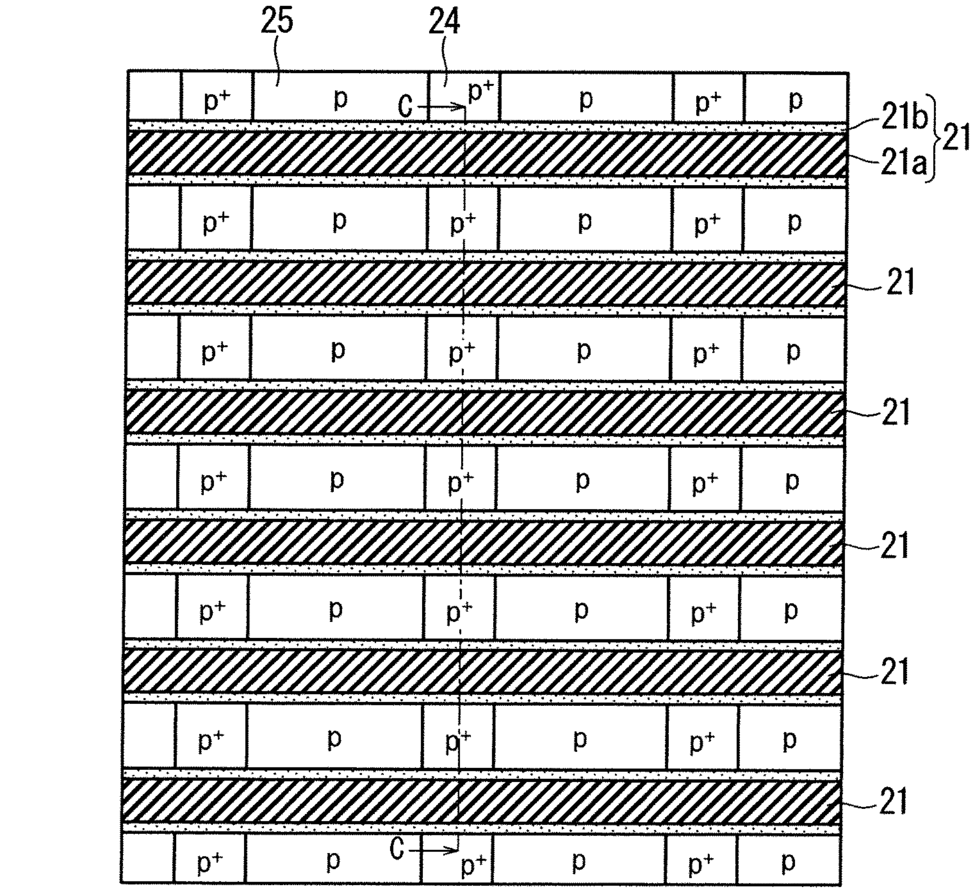
FIGS. 40 to 44 each show a configuration 3 for reducing forward voltage drop in the diode region in the RC-IGBT according to the second preferred embodiment.
Figure 41:
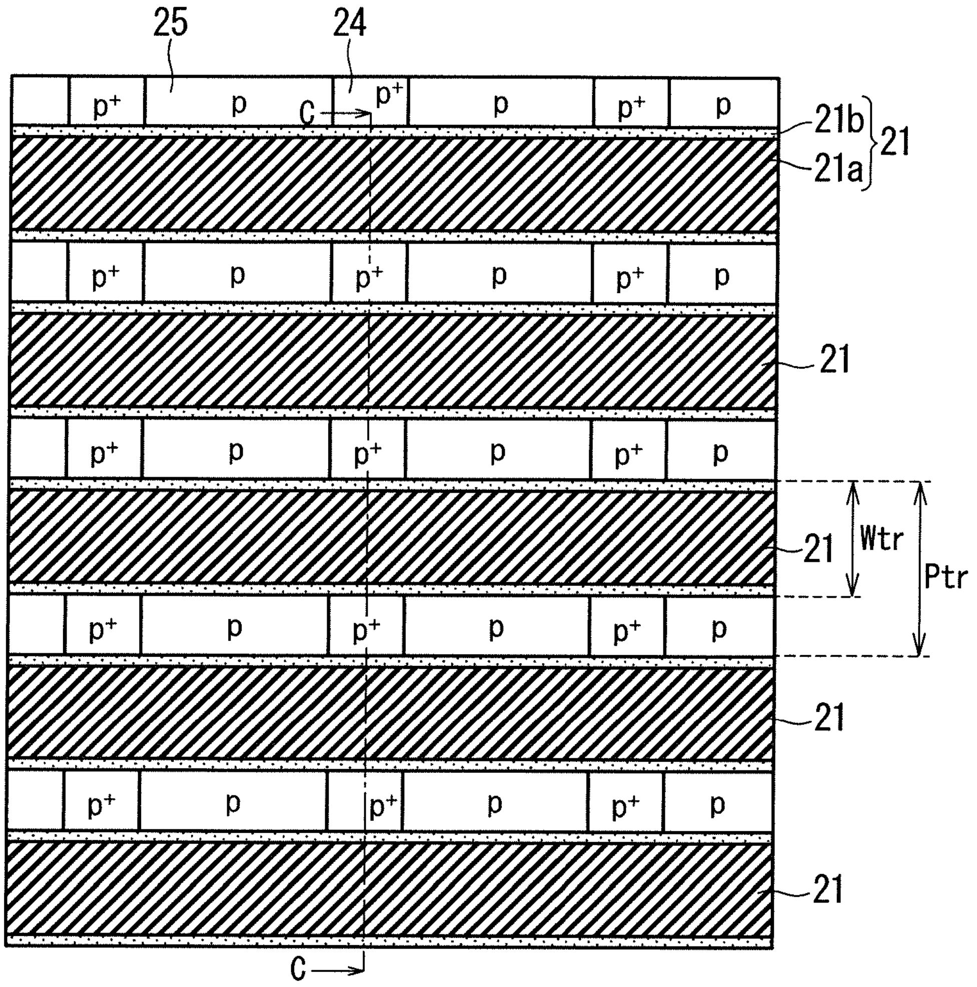
Figure 42:
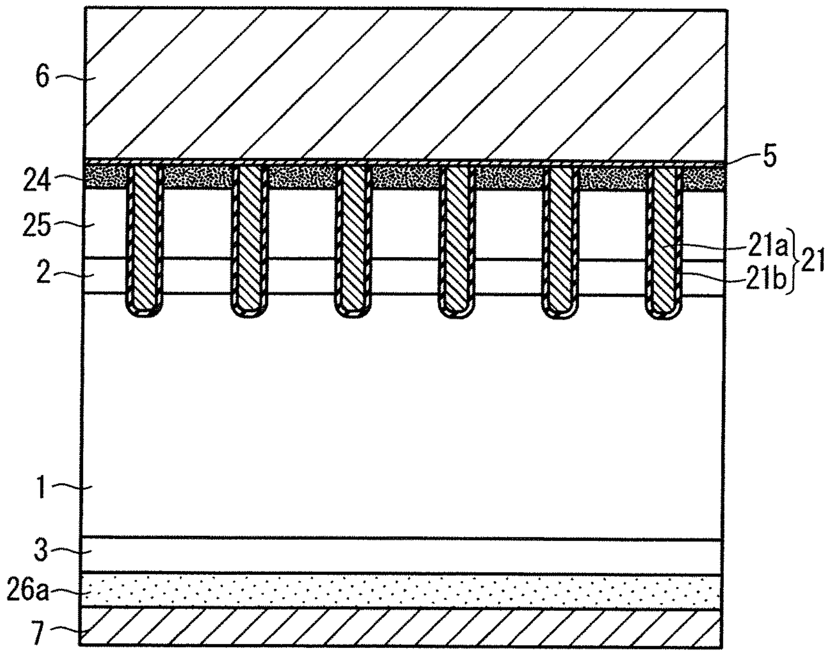
Figure 43:
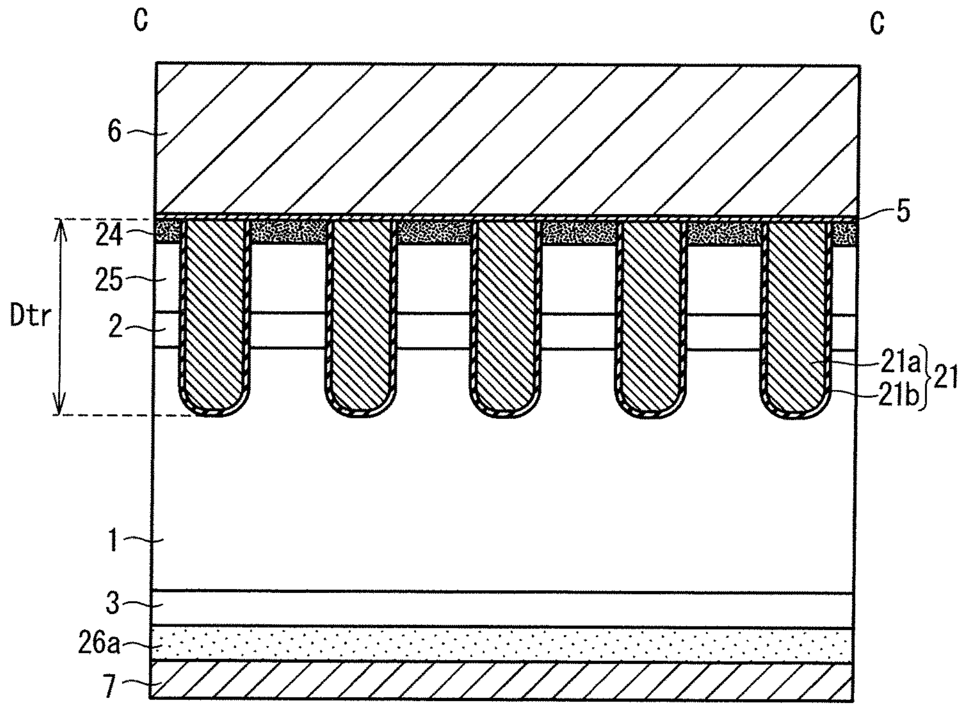

FIGS. 40 and 41 are enlarged views of the regions 83*b* and 83*c* surrounded by dashes in the diode regions 20*b* and 20*c* respectively. FIGS. 42 and 43 are sectional views taken in an arrow direction along a dashed line C-C shown in FIG. 40 and taken in an arrow direction along a dashed line C-C shown in FIG. 41 respectively. In FIGS. 42 and 43, a structure same as that of the semiconductor device 100 or the semiconductor device 101 shown in FIG. 7 is given the same sign and description overlapping between these structures will be omitted.

Forward voltage drop (VF) in the diode regions 20*b* and 20*c* can be reduced by enhancing carrier accumulation effect between diode trench gates next to each other.

In FIGS. 40 and 41, an interval between the diode trench gates 21 is indicated by an interval Ptr and the width of the diode trench gate 21 is indicated by a width Wtr. FIGS. 40 and 41 show exemplary configurations where the interval Ptr between the diode trench gates 21 and the width Wtr of the diode trench gate 21 are changed.

The configurations shown in FIGS. 40 and 42 are characterized in that the interval Ptr between the diode trench gates 21 is smaller than the interval Ptr between the diode trench gates 21 in the region 83*a* surrounded by dashed lines in the diode region 20*a* shown in FIG. 33. Reducing the interval Ptr reduces the size of the p-type anode layer 25. This restricts carriers to flow into the emitter electrode (anode electrode) 6 through the p-type anode layer 25 to enhance the effect of carrier accumulation under the p-type anode layer 25, thereby allowing reduction in forward voltage drop (VF).

The configurations shown in FIGS. 41 and 43 are characterized in that the width Wtr of the diode trench gate 21 is larger than the width Wtr of the diode trench gate 21 in the region 83*a* surrounded by dashed lines in the diode region 20*a* shown in FIG. 33. Increasing the width Wtr reduces the size of the p-type anode layer 25. This restricts carriers to flow into the emitter electrode (anode electrode) 6 through the p-type anode layer 25 to enhance the effect of carrier accumulation under the p-type anode layer 25, thereby allowing reduction in forward voltage drop (VF).

In the configuration shown in FIG. 43, as a result of micro-loading effect, the diode trench gate 21 has a depth Dtr larger than the depth of the diode trench gate 21 in the region 83*a* surrounded by dashed lines in the diode region 20*a* shown in FIG. 33. This enhances the effect of carrier accumulation under the p-type anode layer 25 further, thereby achieving further reduction in forward voltage drop (VF).

Figure 44:
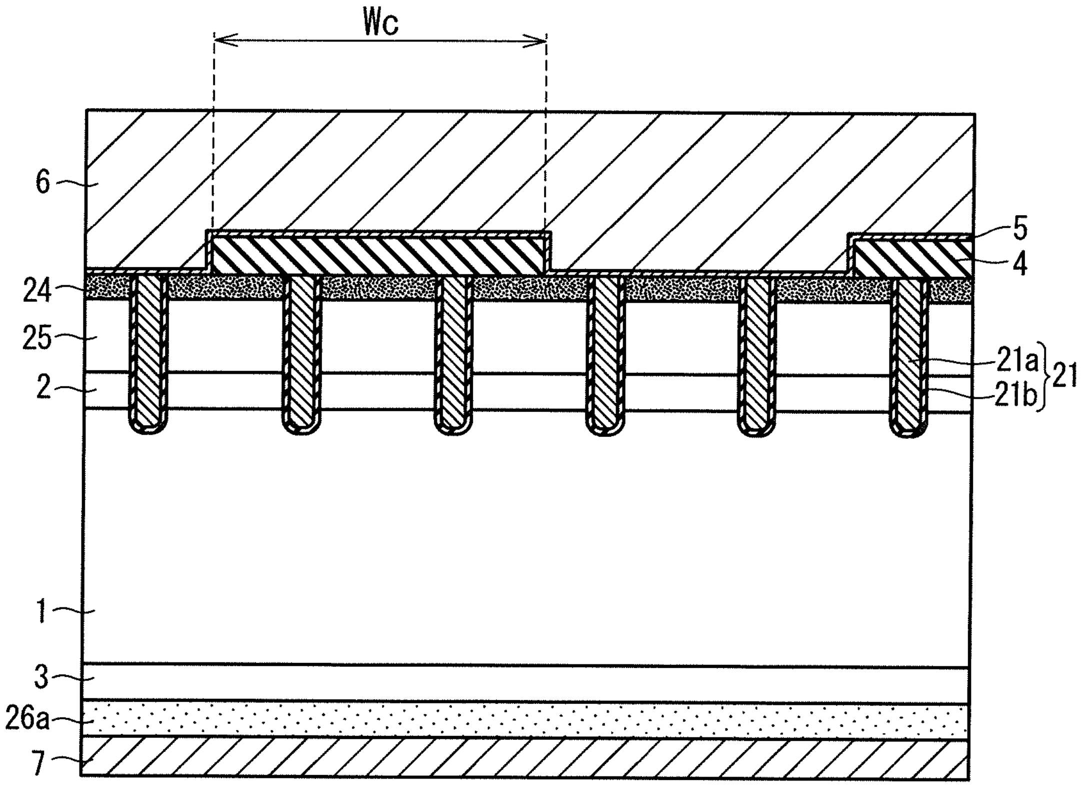

FIG. 44 is a sectional view taken in the arrow direction along the dashed line C—C shown in FIG. 33. In FIG. 44, a structure same as that of the semiconductor device 100 or the semiconductor device 101 shown in FIG. 7 is given the same sign and description overlapping between these structures will be omitted.

In the configuration shown in FIG. 44, the interlayer insulating film 4 is formed partially over the $p^+$-type contact layer 24 in such a manner as to extend on a region across a plurality of the diode trench gates 21, and the width of the interlayer insulating film 4 is indicated by a width Wc. In FIG. 44, the interlayer insulating film 4 is provided directly on the $p^+$-type contact layer 24. Meanwhile, in a sectional view taken in an arrow direction along a dashed line D-D indicated in FIG. 33, the interlayer insulating film 4 is provided directly on the p-type anode layer 25.

By providing the interlayer insulating film 4 directly on the $p^+$-type contact layer 24 and the p-type anode layer 25 in this way, carriers to flow into the emitter electrode (anode electrode) 6 through the $p^+$-type contact layer 24 and the p-type anode layer 25 are restricted to enhance the effect of carrier accumulation under the p-type anode layer 25, thereby allowing reduction in forward voltage drop (VF).

Increasing the width Wc of the interlayer insulating film 4 to a greater extent achieves further reduction in forward voltage drop (VF). Meanwhile, increasing the width Wc excessively might reduce recovery tolerance. Thus, the width Wc is desirably set equal to or less than 20 μm.

The width Wc is shown only one-dimensionally in FIG. 44. Meanwhile, increasing an area in a two dimension including a direction toward the back with respect to the plane of paper also achieves further reduction in forward voltage drop (VF).

<Configuration 4 for Reducing Forward Voltage Drop>

The following shows a configuration 4 for reducing forward voltage drop (VF) in the diode regions 20*b* and 20*c* of the second preferred embodiment.

Forward voltage drop (VF) in the diode regions 20*b* and 20*c* can be reduced by extending carrier lifetime in the diode regions 20*b* and 20*c*. The lifetime of carriers can be changed by a method such as application of an electron beam or application of helium ions to the diode region, for example.

More specifically, in the semiconductor substrate in a state shown in FIG. 22 where the $n^+$-type cathode layer 26 is formed, a region where carrier lifetime is intended to be extended such as a region over the diode region 20*b* is covered with a stainless steel mask or an aluminum mask. Then, an electron beam, helium ions, or protons accelerated at an energy range from 100 keV to 30 MeV are applied from above the semiconductor substrate. By doing so, a crystal defect layer is formed in a part of the $n^-$-type drift layer 1 below the bottom of the diode trench gate 21 in the diode region 20*a* not covered with the mask, thereby shortening carrier lifetime.

As a result, carrier lifetime becomes longer in the diode region 20*b* than in the diode region 20*a* to achieve reduction in forward voltage drop (VF). If carrier lifetime is intended to be changed between the diode region 20*b* and the diode region 20*c* and if lifetime is to be controlled by electron beam application, for example, two shielding mask are used to form the diode regions 20*a*, 20*b*, and 20*c* distinctively from each other. For example, a mask A for shielding the diode regions 20*b* and 20*c* and a mask B for shielding the diode region 20*c* are prepared. During first-time electron beam application, the mask A is used to shorten lifetime in the diode region 20*a*. During second-time electron beam application, the mask B is used to shorten lifetime in the diode regions 20*a* and 20*b*. As a result, the longest carrier lifetime is given in the diode region 20*c*, the shortest carrier lifetime is given in the diode region 20*a*, and carrier lifetime intermediate between these lifetimes is given in the diode region 20*b*.

The preferred embodiments of the present disclosure can be combined freely, and each preferred embodiment can be modified or omitted, as appropriate, within the range of the disclosure.

The present disclosure described above will be summarized in Appendixes.

(Appendix 1)

A semiconductor device comprising a transistor and a diode formed at a common semiconductor substrate, wherein the semiconductor substrate includes:

a transistor region in which the transistor is formed;

a plurality of diode regions in which the diode is formed; and a terminal region around a cell region covering the transistor region and the plurality of diode regions, the transistor region includes:

a second transistor region contacting the terminal region at least partially; and a first transistor region arranged in a region other than the second transistor region and between the plurality of diode regions, in a plan view, the first transistor region has a first width that is uniform in a first direction corresponding to a direction of arrangement of the plurality of diode regions and each of the plurality of diode regions has a second width that is uniform in the first direction, and the second transistor region has a third width in the first direction that is smaller than the first width of the first transistor region.

(Appendix 2)

The semiconductor device according to Appendix 1, wherein a ratio of the third width of the second transistor region to the first width of the first transistor region is equal to or less than 0.5.

(Appendix 3)

The semiconductor device according to Appendix 1 or Appendix 2, wherein in a plan view, a sum of the areas of the plurality of diode regions is less than a sum of the area of the transistor region.

(Appendix 4)

The semiconductor device according to any one of Appendix 1 to Appendix 3, wherein the third width of the second transistor region is equal to or greater than a thickness of the semiconductor substrate.

(Appendix 5)

The semiconductor device according to any one of Appendix 1 to Appendix 4, wherein the transistor region and the plurality of diode regions each have a stripe shape in a plan view, the first transistor region includes a plurality of the first transistor regions, the plurality of first transistor regions and the plurality of diode regions are arranged alternately with and parallel to each other, the diode region is arranged in a final row of arrangement of the plurality of first transistor regions and the plurality of diode regions, and the second transistor region is arranged next to the diode region in the final row of the arrangement.

(Appendix 6)

The semiconductor device according to any one of Appendix 1 to Appendix 4, wherein each of the plurality of diode regions has an island shape in a plan view, arrangement of the plurality of diode regions is in a matrix, the first transistor region is arranged between the plurality of island-shape diode regions, the second transistor region is arranged in an outer periphery of a region where the first transistor region and the plurality of diode regions are arranged, and some of the plurality of diode regions are arranged next to the second transistor region.

(Appendix 7)

The semiconductor device according to Appendix 1, wherein the plurality of diode regions includes a first diode region and a second diode region where forward voltage drop is lower than that in the first diode region, and the second diode region is arranged next to the second transistor region.

(Appendix 8)

The semiconductor device according to Appendix 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer; and a second electrode electrically connected to the first semiconductor layer, and the second diode region is larger in area of the fourth semiconductor layer than the first diode region in a plan view.

(Appendix 9)

The semiconductor device according to Appendix 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer; and a second electrode electrically connected to the first semiconductor layer, and the second diode region is larger in area of the first semiconductor layer than the first diode region in a plan view.

(Appendix 10)

The semiconductor device according to Appendix 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and the second diode region is smaller in interval between the plurality of trench gates than the first diode region.

(Appendix 11)

The semiconductor device according to Appendix 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and each of the plurality of trench gates has a width larger in the second diode region than in the first diode region.

(Appendix 12)

The semiconductor device according to Appendix 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and each of the plurality of trench gates has a depth larger in the second diode region than in the first diode region.

(Appendix 13)

The semiconductor device according to Appendix 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and the second diode region includes an interlayer insulating film provided in such a manner as to cover at least some of the plurality of trench gates.

(Appendix 14)

The semiconductor device according to Appendix 7, wherein carrier lifetime is longer in the second diode region than in the first diode region.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a transistor and a diode formed at a common semiconductor substrate, wherein the semiconductor substrate includes:

a transistor region in which the transistor is formed;

a plurality of diode regions in which the diode is formed;

a terminal region around a cell region covering the transistor region and the plurality of diode regions; and a pad region, the transistor region includes:

a second transistor region contacting the terminal region at least partially; and a first transistor region arranged in a region other than the second transistor region and between the plurality of diode regions, in a plan view, the first transistor region has a first width that is uniform in a first direction corresponding to a direction of arrangement of the plurality of diode regions and each of the plurality of diode regions has a second width that is uniform in the first direction, and the second transistor region has a third width in the first direction that is smaller than the first width of the first transistor region, and the pad region is between the terminal region and the transistor region in the first direction.

2. The semiconductor device according to claim 1, wherein a ratio of the third width of the second transistor region to the first width of the first transistor region is equal to or less than 0.5.

3. The semiconductor device according to claim 1, wherein in a plan view, a sum of the areas of the plurality of diode regions is less than a sum of the area of the transistor region.

4. The semiconductor device according to claim 1, wherein the third width of the second transistor region is equal to or greater than a thickness of the semiconductor substrate.

5. The semiconductor device according to claim 1, wherein the transistor region and the plurality of diode regions each have a stripe shape in a plan view, the first transistor region includes a plurality of the first transistor regions, the plurality of first transistor regions and the plurality of diode regions are arranged alternately with and parallel to each other, the diode region is arranged in a final row of arrangement of the plurality of first transistor regions and the plurality of diode regions, and the second transistor region is arranged next to the diode region in the final row of the arrangement.

6. The semiconductor device according to claim 1, wherein each of the plurality of diode regions has an island shape in a plan view, arrangement of the plurality of diode regions is in a matrix, the first transistor region is arranged between the plurality of island-shape diode regions, the second transistor region is arranged in an outer periphery of a region where the first transistor region and the plurality of diode regions are arranged, and some of the plurality of diode regions are arranged next to the second transistor region.

7. The semiconductor device according to claim 1, wherein the plurality of diode regions includes a first diode region and a second diode region where forward voltage drop is lower than that in the first diode region, and the second diode region is arranged next to the second transistor region.

8. The semiconductor device according to claim 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer; and a second electrode electrically connected to the first semiconductor layer, and the second diode region is larger in area of the fourth semiconductor layer than the first diode region in a plan view.

9. The semiconductor device according to claim 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer; and a second electrode electrically connected to the first semiconductor layer, and the second diode region is larger in area of the first semiconductor layer than the first diode region in a plan view.

10. The semiconductor device according to claim 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and the second diode region is smaller in interval between the plurality of trench gates than the first diode region.

11. The semiconductor device according to claim 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and each of the plurality of trench gates has a width larger in the second diode region than in the first diode region.

12. The semiconductor device according to claim 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and each of the plurality of trench gates has a depth larger in the second diode region than in the first diode region.

13. The semiconductor device according to claim 7, wherein the plurality of diode regions includes:

a first semiconductor layer of a second conductivity type provided at a second main surface of the semiconductor substrate;

a second semiconductor layer of the second conductivity type provided on the first semiconductor layer;

a third semiconductor layer of a first conductivity type provided closer to a first main surface of the semiconductor substrate than the second semiconductor layer;

a fourth semiconductor layer of the first conductivity type provided on the third semiconductor layer;

a first electrode electrically connected to the fourth semiconductor layer;

a second electrode electrically connected to the first semiconductor layer; and a plurality of trench gates extending from the first main surface and reaching the second semiconductor layer, and the second diode region includes an interlayer insulating film provided in such a manner as to cover at least some of the plurality of trench gates.

14. The semiconductor device according to claim 7, wherein carrier lifetime is longer in the second diode region than in the first diode region.

* * * * *